US012772643B2

(12) United States Patent
Akimoto

(10) Patent No.: US 12,772,643 B2
(45) Date of Patent: Oct. 20, 2026

(54) PRODUCTION METHOD FOR IMAGE DISPLAY DEVICE AND IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 670 days.

(21) Appl. No.: 18/067,436

(22) Filed: Dec. 16, 2022

(65) Prior Publication Data

US 2023/0122669 A1 Apr. 20, 2023

Related U.S. Application Data

(63) Continuation of application No. PCT/JP2021/021770, filed on Jun. 8, 2021.

(30) Foreign Application Priority Data

Jun. 29, 2020 (JP) ................................ 2020-111748

(51) Int. Cl.
*H10H 29/14* (2025.01)
*H10H 20/01* (2025.01)
(Continued)

(52) U.S. Cl.
CPC .... *H10H 29/142* (2025.01); *H10H 20/01335* (2025.01); *H10H 20/018* (2025.01);
(Continued)

(58) Field of Classification Search
CPC .... H10H 29/142; H10H 20/018; H10H 20/82; H10H 20/851; H10H 20/856; H10W 90/00
See application file for complete search history.

(56) References Cited

U.S. PATENT DOCUMENTS 6,246,708 B1 6/2001 Thornton et al.
10,325,894 B1 * 6/2019 Pan ..................... H10D 86/441
(Continued)

FOREIGN PATENT DOCUMENTS

CN 104934456 A 9/2015
CN 108493209 A 9/2018
(Continued)

OTHER PUBLICATIONS

International Search Report with English language translation and Written Opinion dated Aug. 3, 2021 in corresponding International Application No. PCT/JP2021/021770.

*Primary Examiner* — Monica D Harrison
*Assistant Examiner* — Jacob T Nelson
(74) *Attorney, Agent, or Firm* — Foley & Lardner LLP

(57) ABSTRACT

A production method for an image display device, the method including: preparing at least one structure including a semiconductor layer formed on a first substrate; forming a first metal layer on a second substrate; bonding the semiconductor layer to the first metal layer; removing the first substrate; forming a light-emitting element by etching the semiconductor layer, the light-emitting element including a bottom surface on the first metal layer, and a light-emitting surface located opposite to the bottom surface; forming a first insulating film that covers the second substrate and the light-emitting element; forming a circuit element on the first insulating film; forming a second insulating film that covers the circuit element and the first insulating film; exposing a surface that includes the light-emitting surface by removing portions of the first insulating film and the second insulating film; and forming a wiring layer on the second insulating film.

8 Claims, 39 Drawing Sheets

(51) Int. Cl.

| | |
|---|---|
| ***H10H 20/82*** | (2025.01) |
| ***H10H 20/825*** | (2025.01) |
| ***H10H 20/851*** | (2025.01) |
| ***H10H 20/856*** | (2025.01) |
| ***H10H 20/857*** | (2025.01) |
| ***H10W 90/00*** | (2026.01) |

(52) U.S. Cl.

CPC .......... *H10H 20/82* (2025.01); *H10H 20/825* (2025.01); *H10H 20/851* (2025.01); *H10H 20/856* (2025.01); *H10H 20/857* (2025.01); *H10H 20/0361* (2025.01); *H10H 20/0363* (2025.01); *H10H 20/0364* (2025.01)

(56) References Cited

U.S. PATENT DOCUMENTS

| | | | |
|---|---|---|---|
| 2016/0163765 | A1 | 6/2016 | Hu et al. |
| 2016/0327737 | A1 | 11/2016 | Zhang et al. |
| 2017/0269749 | A1 | 9/2017 | Bok et al. |
| 2018/0122298 | A1 | 5/2018 | Lee et al. |
| 2018/0351035 | A1 | 12/2018 | Chung et al. |
| 2019/0013305 | A1 | 1/2019 | Chang et al. |
| 2019/0131343 | A1 | 5/2019 | Templier et al. |
| 2019/0164944 | A1 * | 5/2019 | Chae .................... H10H 20/018 |
| 2019/0229235 | A1 | 7/2019 | Iguchi |
| 2019/0267357 | A1 | 8/2019 | Iguchi et al. |
| 2019/0273179 | A1 | 9/2019 | Iguchi et al. |
| 2019/0319020 | A1 | 10/2019 | Pan |
| 2019/0355766 | A1 | 11/2019 | Zhang et al. |
| 2019/0385513 | A1 | 12/2019 | Iguchi et al. |
| 2020/0035653 | A1 | 1/2020 | Chong et al. |
| 2020/0091224 | A1 | 3/2020 | Bono et al. |
| 2020/0274023 | A1 | 8/2020 | Kang |
| 2020/0303471 | A1 | 9/2020 | Akimoto |
| 2021/0210513 | A1 | 7/2021 | Ikeda et al. |
| 2021/0217805 | A1 | 7/2021 | Kusunoki et al. |

FOREIGN PATENT DOCUMENTS

| | | | |
|---|---|---|---|
| CN | 110459557 | A | 11/2019 |
| JP | H11-121735 | A | 4/1999 |
| JP | 2002-057283 | A | 2/2002 |
| JP | 2002-141492 | A | 5/2002 |
| JP | 2013-037138 | A | 2/2013 |
| JP | 2014-078575 | A | 5/2014 |
| JP | 2017-508279 | A | 3/2017 |
| JP | 2018-205741 | A | 12/2018 |
| JP | 2019-129226 | A | 8/2019 |
| JP | 2019-522894 | A | 8/2019 |
| JP | 2019-152851 | A | 9/2019 |
| JP | 2019-153783 | A | 9/2019 |
| JP | 2020-507107 | A | 3/2020 |
| JP | 2020-052154 | A | 4/2020 |
| WO | WO-2018/116814 | A1 | 6/2018 |
| WO | WO-2018/132070 | A1 | 7/2018 |
| WO | WO-2019/049360 | A1 | 3/2019 |
| WO | WO-2019/220246 | A1 | 11/2019 |

* cited by examiner

PRODUCTION METHOD FOR IMAGE DISPLAY DEVICE AND IMAGE DISPLAY DEVICE

CROSS-REFERENCE TO RELATED APPLICATIONS

The present application is a bypass continuation of PCT Application No. PCT/JP2021/021770, filed Jun. 8, 2021, which claims priority to Japanese Application No. 2020-111748, filed Jun. 29, 2020. The contents of these applications are hereby incorporated by reference in their entireties.

BACKGROUND

Embodiments of the invention relate to a production method for an image display device and an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED that is a fine light-emitting element as a self-luminous element. A method has been introduced as a production method for a display device that uses a micro LED in which individually-formed micro LEDs are sequentially transferred to a drive circuit. However, as the number of elements of micro LEDs increases with higher image quality such as full high definition, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a reduction of the yield may occur.

In known technology, a semiconductor layer that includes a light-emitting layer is grown on a Si substrate; an electrode is formed at the semiconductor layer; subsequently, bonding is performed to a circuit board in which a drive circuit is formed (see, e.g., Japanese Patent Publication No. 2002-141492).

SUMMARY

An embodiment of the invention provides a production method for an image display device in which a transfer process of a light-emitting element is shortened, and yield is increased.

According to one embodiment of the present disclosure, a production method for an image display device includes a process of preparing a second substrate including a semiconductor layer including a light-emitting layer formed on a first substrate, a process of forming a first metal layer on a third substrate, a process of bonding the semiconductor layer to the first metal layer, a process of removing the first substrate, a process of forming a light-emitting element including a bottom surface on the first metal layer and a light-emitting surface located opposite to the bottom surface by etching the semiconductor layer, a process of forming a first insulating film that covers the third substrate and the light-emitting element, a process of forming a circuit element on the first insulating film, a process of forming a second insulating film that covers the circuit element and the first insulating film, a process of exposing a surface including the light-emitting surface by removing a portion of the first insulating film and a portion of the second insulating film, and a process of forming a wiring layer on the second insulating film.

According to another embodiment of the present disclosure, a production method for an image display device includes a process of preparing a second substrate that includes a semiconductor layer including a light-emitting layer formed on a first substrate, a process of forming a second metal layer on the second substrate, a process of bonding the semiconductor layer to a third substrate via the second metal layer, a process of removing the first substrate, a process of forming a light-emitting element that includes a bottom surface on the second metal layer and a light-emitting surface located opposite to the bottom surface by etching the semiconductor layer, a process of forming a first insulating film that covers the third substrate and the light-emitting element, a process of forming a circuit element on the first insulating film, a process of forming a second insulating film that covers the circuit element and the first insulating film, a process of exposing a surface including the light-emitting surface of the light-emitting element by removing a portion of the first insulating film and a portion of the second insulating film, and a process of forming a wiring layer on the second insulating film.

According to another embodiment of the present disclosure, an image display device includes a substrate including a first surface, a conductive layer located on the first surface, a light-emitting element including a bottom surface on the conductive layer and a light-emitting surface that is a surface opposite to the bottom surface, a first insulating film covering the conductive layer and a side surface of the light-emitting element, a circuit element located on the first insulating film, a second insulating film covering the circuit element and the first insulating film, and a wiring layer located on the second insulating film.

According to another embodiment of the present disclosure, an image display device includes a substrate including a first surface, a conductive layer located on the first surface, a semiconductor layer including a bottom surface on the conductive layer and multiple light-emitting surfaces at a surface opposite to the bottom surface, a first insulating film covering the conductive layer and a side surface of the semiconductor layer, multiple transistors located on the first insulating film, a second insulating film covering the multiple transistors and the first insulating film, and a wiring layer located on the second insulating film.

According to certain embodiments of the invention, a production method for an image display device is realized in which a transfer process of a light-emitting element is shortened, and yield is increased.

DETAILED DESCRIPTION

Figure 1:
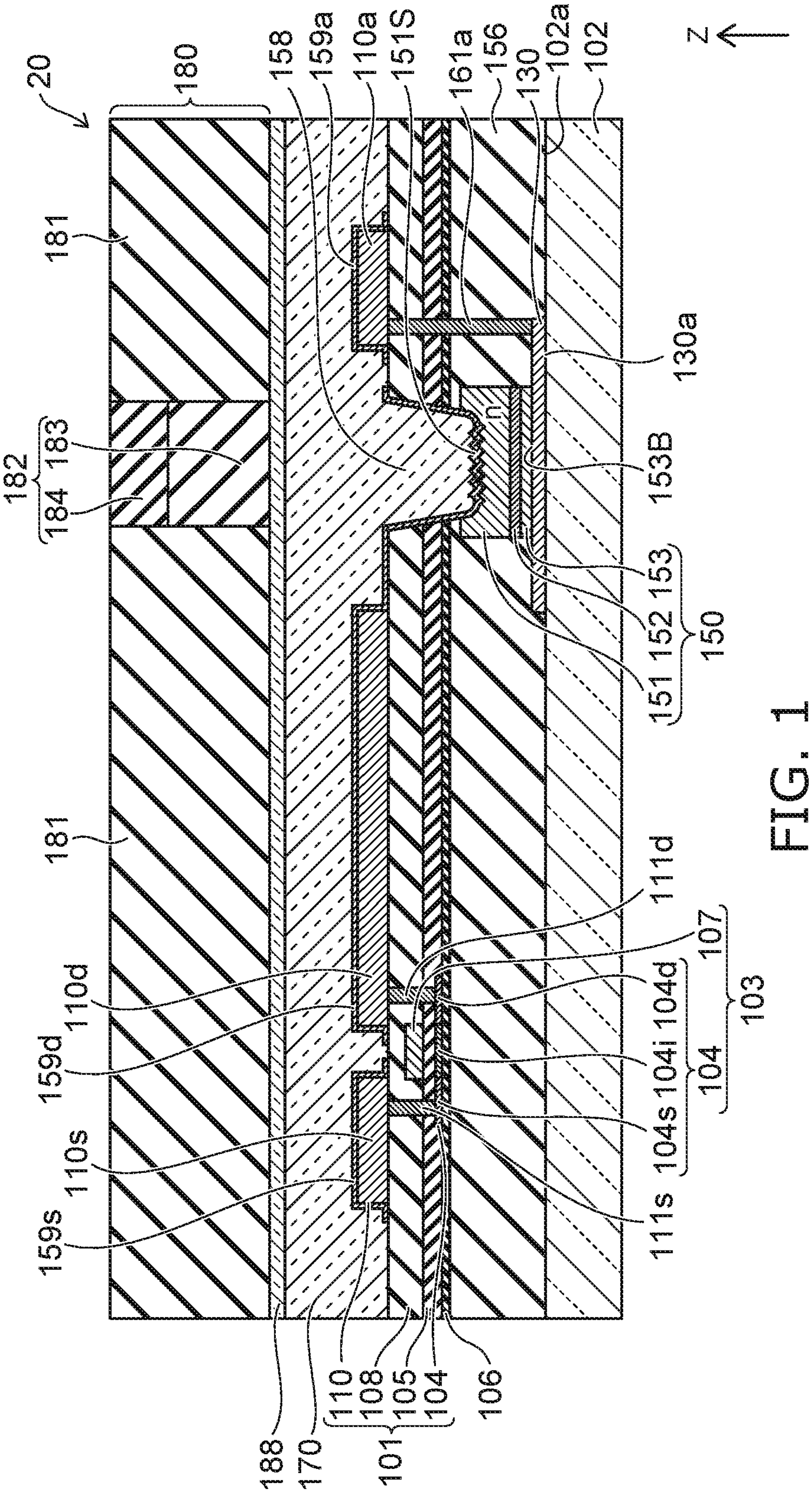
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are marked with the same reference numerals, and a detailed description is omitted as appropriate.

First Embodiment

FIG. 1 is a schematic cross-sectional view illustrating a portion of an image display device according to the embodiment.

FIG. 1 schematically shows the configuration of a subpixel 20 of the image display device of the embodiment. A pixel that is included in an image displayed in the image display device includes multiple subpixels 20.

Hereinbelow, the description may use an XYZ three-dimensional coordinate system. The subpixels 20 are arranged in a two-dimensional planar shape as in FIG. 15 below. The two-dimensional plane in which the subpixels 20 are arranged is taken as an XY plane. The subpixels 20 are arranged along an X-axis direction and a Y-axis direction. FIG. 1 illustrates an auxiliary cross section along line AA' of FIG. 4 below, and is a cross-sectional view in which cross sections of multiple planes perpendicular to the XY plane are linked in one plane. In the other drawings as well, as in FIG. 1, in a cross-sectional view of multiple planes perpendicular to the XY plane, the X-axis and the Y-axis are not illustrated, and the Z-axis that is perpendicular to the XY plane is shown. That is, in these drawings, the plane perpendicular to the Z-axis is taken as the XY plane. Although the positive direction of the Z-axis may be called "up" or "above" and the negative direction of the Z-axis may be called "down" or "below" for convenience, directions along the Z-axis are not necessarily directions in which gravity acts. Also, a length in a direction along the Z-axis may be called a height.

The subpixel 20 includes a light-emitting surface 151S that is substantially parallel to the XY plane. The light-emitting surface 151S is a surface that radiates light mainly in the positive direction of the Z-axis orthogonal to the XY plane.

As shown in FIG. 1, the subpixel 20 of the image display device includes a substrate 102, a conductive layer 130, a light-emitting element 150, a first inter-layer insulating film 156, a transistor 103, a second inter-layer insulating film 108, and a wiring layer 110.

According to the embodiment, the substrate 102 on which the light-emitting element 150 is formed is a light-transmitting substrate, e.g., a glass substrate. The substrate 102 includes a first surface 102*a*. The first surface 102*a* is a surface that is substantially parallel to the XY plane. The light-emitting element 150 is formed on the first surface 102*a*. The light-emitting element 150 is driven by the transistor 103 provided with the first inter-layer insulating film 156 interposed. The transistor 103 is a thin film transistor (Thin Film Transistor, TFT) and is formed on the first inter-layer insulating film 156. The process of forming the circuit element that includes the TFT on a large glass substrate is advantageous in that the process is established for manufacturing a liquid crystal panel, an organic EL panel, etc., and an existing plant can be utilized.

The subpixel 20 further includes a color filter 180. The color filter 180 (a wavelength conversion member) is located on a surface resin layer 170 with a transparent thin film adhesive layer 188 interposed. The surface resin layer 170 is located on the second inter-layer insulating film 108 and the wiring layer 110.

The configuration of the subpixel 20 will now be described in detail.

The conductive layer 130 is located on the first surface 102*a*. The conductive layer 130 includes a connection plate 130*a* (a first part). The light-emitting element 150 is located on the connection plate 130*a*. The connection plate 130*a* is a film-shaped, layer-shaped, or plate-shaped conductive member that has the shape of a rectangle, any polygon, an ellipse, a circle, etc., when projected onto the XY plane. The connection plate 130*a* is electrically connected by a bottom surface 1538 of the light-emitting element 150.

For example, the conductive layer 130 and the connection plate 130*a* are formed of Al, an alloy of Al, a stacked film of Al, Ti, and the like, etc. For example, in a stacked film of Al and Ti, Al is stacked on a thin film of Ti, and then Ti is stacked on the Al. Therefore, the connection plate 130*a* is light-reflective. The light reflectivity can be further improved by providing a metal material having high light reflectivity such as Ag or the like on a metal layer of Al, Ti, etc.

The light-emitting element 150 is located on the connection plate 130*a*. It is favorable for the connection plate 130*a* to be provided for each light-emitting element 150.

The light-emitting element 150 includes the bottom surface 1538 and the light-emitting surface 151S. The light-emitting element 150 is a prismatic or cylindrical element that includes the bottom surface 1538 on the connection plate 130*a*. The bottom surface 1538 is located on the connection plate 130*a* and electrically connected to the connection plate 130*a*. The light-emitting surface 151S is the surface opposite to the bottom surface 153B of the light-emitting element 150.

Favorably, the outer perimeter of the connection plate 130*a* is set to include the outer perimeter of the light-emitting element when the light-emitting element 150 is projected onto the XY plane. By making the connection plate 130*a* light-reflective, the downward-scattered light of the light-emitting element 150 is reflected toward the light-emitting surface 151S side, and the luminous efficiency is substantially increased.

Favorably, the outer perimeter of the connection plate 130*a* is set not to include the outer perimeter of the transistor 103 when the transistor 103 described below is projected onto the XY plane including the connection plate 130*a*. The transistor 103 does not easily receive the reflected light from the connection plate 130*a*, and the probability of malfunctions, etc., occurring can be sufficiently reduced. The outer perimeter of the transistor refers to the outer perimeter of the TFT channel 104.

The light-emitting element 150 includes a p-type semiconductor layer 153, a light-emitting layer 152, and an n-type semiconductor layer 151. The p-type semiconductor layer 153, the light-emitting layer 152, and the n-type semiconductor layer 151 are stacked in this order from the bottom surface 153B toward the light-emitting surface 151S. Accordingly, the p-type semiconductor layer 153 is electrically connected to the connection plate 130*a*.

When the light-emitting element 150 has a prismatic shape, the shape of the light-emitting element 150 when projected onto the XY plane is, for example, substantially square or rectangular. When the shape of the light-emitting element 150 when projected onto the XY plane is polygonal including rectangular, the corners of the light-emitting element 150 may be rounded. When the shape of the light-emitting element 150 when projected onto the XY plane is a cylindrical shape, the shape of the light-emitting element 150 when projected onto the XY plane is not limited to circular and may be, for example, elliptical. The degree of freedom of the layout is increased by appropriately selecting the shape, arrangement, etc., of the light-emitting element when viewed in plan.

For example, a gallium nitride compound semiconductor that includes a light-emitting layer of $In_XAl_YGa_{1-X-Y}N$ ($0 \le X$, $0 \le Y$, and $X+Y<1$), etc., is favorably included in the light-emitting element 150. Hereinbelow, the gallium nitride compound semiconductor described above may be called simply gallium nitride (GaN). According to an embodiment of the invention, the light-emitting element 150 is a so-called light-emitting diode. It is sufficient for the wavelength of the light emitted by the light-emitting element 150 to be a wavelength in the range of the near-ultraviolet region to the visible region, e.g., about 467 nm±20 nm. The wavelength of the light emitted by the light-emitting element 150 may be a bluish-violet light emission of about 410 nm±20 nm. The wavelength of the light emitted by the light-emitting element 150 is not limited to the values described above and can be appropriately set.

The surface areas of the light-emitting layers 152 when projected onto the XY plane are set according to the light emission colors of the red, green, and blue subpixels. Hereinbelow, the surface area when projected onto the XY plane may be called simply the surface area. The surface area of the light-emitting layer 152 is appropriately set according to the luminous efficiency, the conversion efficiency of a color conversion part 182 of the color filter 180 described below, etc. That is, the surface areas of the light-emitting layers 152 of the subpixels 20 of the light emission colors may be the same or may be different between the light emission colors. The surface area of the light-emitting layer 152 is the surface area of the region surrounded with the outer perimeter of the light-emitting layer 152 projected onto the XY plane.

The first inter-layer insulating film (a first insulating film) 156 covers the first surface 102*a* and the conductive layer 130. The first inter-layer insulating film 156 covers the side surface of the light-emitting element 150. The first inter-layer insulating film 156 does not cover the light-emitting surface 151S. The first inter-layer insulating film 156 insulates the light-emitting elements 150 from each other. The first inter-layer insulating film 156 insulates the light-emitting element 150 from circuit elements such as the transistor 103, etc. The first inter-layer insulating film 156 provides a flat surface for forming circuit elements such as the transistor 103, etc. By covering the light-emitting element 150, the first inter-layer insulating film 156 protects the light-emitting element 150 from thermal stress when forming the transistor 103, etc.

The first inter-layer insulating film 156 is formed of a dielectric such as an organic insulating material, etc. The organic insulating material that is included in the first inter-layer insulating film 156 is favorably a white resin. The white resin reflects the light of the light-emitting element 150 emit in the lateral direction, returning light caused by the interface of the color filter 180, etc.; therefore, using a white resin as the first inter-layer insulating film 156 contributes to the substantial improvement of the luminous efficiency of the light-emitting element 150.

The white resin is formed by dispersing fine scattering particles having a Mie (Mie) scattering effect in a silicon resin such as SOG (Spin On Glass) or the like, a transparent resin such as a novolak phenolic resin, etc. The fine scattering particles are colorless or white and have a diameter of about 1/10 to about several times the wavelength of the light emitted by the light-emitting element 150. The fine scattering particles that are favorably used have a diameter that is about ½ of the light wavelength. For example, $TiO_2$, $Al_2SO_3$, ZnO, etc., are examples of such a fine scattering particle.

Or, the white resin can be formed also by utilizing many fine pores or the like dispersed in the transparent resin. When whitening the first inter-layer insulating film 156, for example, a $SiO_2$ film or the like that is formed by ALD (Atomic-Layer-Deposition) or CVD (Chemical Vapor Deposition) overlapping SOG, etc., may be used.

The first inter-layer insulating film 156 may be a black resin. By using a black resin as the first inter-layer insulating film 156, the scattering of the light in the subpixel 20 is suppressed, and stray light is more effectively suppressed. An image display device in which stray light is suppressed can display a sharper image.

The TFT underlying film 106 is formed over the first inter-layer insulating film 156. The TFT underlying film 106 is provided to ensure flatness when forming the transistor 103 and to protect a TFT channel 104 of the transistor 103 from contamination when heat processing, etc. The TFT underlying film 106 is, for example, an insulating film of $SiO_2$, etc.

The transistor 103 is formed on the TFT underlying film 106. In addition to the transistor 103, other circuit elements such as transistors, capacitors, etc., are formed on the TFT underlying film 106, and a circuit 101 is configured using wiring portions, etc. For example, in FIG. 3 below, the transistor 103 corresponds to a drive transistor 26. Also, a select transistor 24, a capacitor 28, etc., are circuit elements in FIG. 3. The circuit 101 includes the TFT channel 104, an insulating layer 105, the second inter-layer insulating film 108, vias 111*s* and 111*d*, and the wiring layer 110.

In the example, the transistor 103 is an n-channel thin film transistor (Thin Film Transistor, TFT). The transistor 103 includes the TFT channel 104 and a gate 107. Favorably, the TFT channel 104 is formed by a low-temperature polysilicon (Low Temperature Poly Silicon, LTPS) process. In the LTPS process, the TFT channel 104 is formed by polycrystallizing and activating a region of amorphous Si formed on the TFT underlying film 106. For example, laser annealing is used to polycrystallize and activate the amorphous Si region. The TFT that is formed by the LTPS process has sufficiently high mobility.

The TFT channel 104 includes regions 104*s*, 104*i*, and 104*d*. The regions 104*s*, 104*i*, and 104*d* each are located on the TFT underlying film 106. The region 104*i* is located between the region 104*s* and the region 104*d*. The regions 104*s* and 104*d* are doped with n-type impurities such as phosphorus (P), etc., and have ohmic connections with the vias 111*s* and 111*d*.

The gate 107 is located on the TFT channel 104 with the insulating layer 105 interposed. The insulating layer 105 is provided to insulate the TFT channel 104 and the gate 107 and to insulate from other adjacent circuit elements. The current that flows between the regions 104*s* and 104*d* can be controlled by a channel that is formed in the region 104*i* when a potential that is higher than the region 104*s* is applied to the gate 107.

The insulating layer 105 is, for example, $SiO_2$. The insulating layer 105 may be a multilevel insulating layer that includes $SiO_2$, $Si_3N_4$, etc., according to the covered region.

For example, the gate 107 may be formed of polycrystal Si or may be formed of a refractory metal such as W, Mo, etc. For example, the polycrystal Si film of the gate 107 is formed by CVD, etc.

The second inter-layer insulating film 108 is located on the gate 107 and the insulating layer 105. For example, the second inter-layer insulating film 108 is formed of the same material as the first inter-layer insulating film 156. That is, the second inter-layer insulating film 108 is formed of a white resin, an inorganic film such as $SiO_2$, etc. The second inter-layer insulating film 108 also functions as a planarization film for forming the wiring layer 110.

The first inter-layer insulating film 156, the TFT underlying film 106, the insulating layer 105, and the second inter-layer insulating film 108 are configured as described above and therefore are not provided at the upper part of the light-emitting surface 151S. That is, the light-emitting surface 151S is exposed from the first inter-layer insulating film 156, the TFT underlying film 106, the insulating layer 105, and the second inter-layer insulating film 108 by an opening 158. As described below, the opening 158 is filled with the surface resin layer 170.

The vias 111*s* and 111*d* are provided to extend through the second inter-layer insulating film 108 and the insulating layer 105. The wiring layer 110 is formed on the second inter-layer insulating film 108. The wiring layer 110 includes multiple wiring portions that may have different potentials. In the example, the wiring layer 110 includes wiring portions 110*s*, 110*d*, and 110*a*.

A portion of the wiring portion 110*s* is located above the region 104*s*. For example, the wiring portion 110*s* is connected to a ground line 4 shown in FIG. 3 below. A portion of the wiring portion 110*d* is located above the region 104*d*. Another portion of the wiring portion 110*d* is located at the vicinity of the light-emitting surface 151S but is not connected to the light-emitting surface 151S. A portion of the wiring portion 110*a* is located above the connection plate 130*a*. For example, the wiring portion 110*a* is connected to a power supply line 3 shown in FIG. 3 below.

In FIG. 1 and subsequent cross-sectional views, unless otherwise noted, the reference numeral of the wiring layer is displayed at a position beside one wiring portion included in the wiring layer.

A light-transmitting electrode 159*d* is provided over the wiring portion 110*d*. The light-transmitting electrode 159*d* is provided over the light-emitting surface 151S. The light-transmitting electrode 159*d* also is located between the wiring portion 110*d* and the light-emitting surface 151S and electrically connects the wiring portion 110*d* and the light-emitting surface 151S.

A light-transmitting electrode 159*s* is provided over the wiring portion 110*s*. For example, the light-transmitting electrode 159*s* is connected to the ground line 4 of the circuit of FIG. 3 together with the wiring portion 110*s*. A light-transmitting electrode 159*a* is provided over the wiring portion 110*a*. For example, the light-transmitting electrode 159*a* is connected to the power supply line 3 of the circuit of FIG. 3 together with the wiring portion 110*a*. The light-transmitting electrode 159*d*, the light-transmitting electrode 159*s*, and the light-transmitting electrode 159*a* are formed of transmissive conductive films. The light-transmitting electrodes 159*d*, 159*s*, and 159*a* favorably include ITO films, ZnO films, etc.

As in the example, favorably, surface roughening of the light-emitting surface 151S is performed. When the light-emitting surface 151S of the light-emitting element 150 is a rough surface, the light extraction efficiency can be increased.

By providing the light-transmitting electrode 159*d* on the light-emitting surface 151S, the connection area between the light-transmitting electrode 159*d* and the n-type semiconductor layer 151 can be increased, the surface area of the light-emitting surface 151S can be substantially increased, and the connection resistance can be reduced. Also, the luminous efficiency can be increased because the surface area of the light-emitting surface 151S can be substantially increased. Because the light-emitting surface 151S is a rough surface, the luminous efficiency can be further increased by reducing the contact resistance by increasing the connection area between the light-emitting surface 151S and the light-transmitting electrode 159*d*.

The via 111*s* is located between the wiring portion 110*s* and the region 104*s* and electrically connects the wiring portion 110*s* and the region 104*s*. The via 111*d* is located between the wiring portion 110*d* and the region 104*d* and electrically connects the wiring portion 110*d* and the region 104*d*.

The wiring portion 110*s* is connected to the region 104*s* by the via 111*s*. The region 104*s* is a source region of the transistor 103. Accordingly, the source region of the transistor 103 is electrically connected to the ground line 4 by the via 111*s* and the wiring portion 110*s*.

The wiring portion 110*d* and the light-transmitting electrode 159*d* are connected to the region 104*d* by the via 111*d*. The region 104*d* is a drain region of the transistor 103. Accordingly, the drain region of the transistor 103 is electrically connected to the n-type semiconductor layer 151 by the via 111*d*, the wiring portion 110*d*, and the light-transmitting electrode 159*d*.

A via 161*a* is provided to extend through the second inter-layer insulating film 108, the insulating layer 105, the TFT underlying film 106, and the first inter-layer insulating film 156. The via 161*a* is located between the wiring portion 110*a* and the connection plate 130*a* and electrically connects the wiring portion 110*a* and the connection plate 130*a*. Accordingly, for example, the p-type semiconductor layer 153 is electrically connected to the power supply line 3 of the circuit of FIG. 3 via the connection plate 130*a*, the via 161*a*, the wiring portion 110*a*, and the light-transmitting electrode 159*a*.

For example, the wiring layer 110 and the vias 111*s*, 111*d*, and 161*a* are formed of Al, an alloy of Al, a stacked film of Al, Ti, and the like, etc. For example, in a stacked film of Al and Ti, Al is stacked on a thin film of Ti, and Ti is further stacked on the Al.

The surface resin layer 170 covers the second inter-layer insulating film 108, the wiring layer 110, and the light-transmitting electrodes 159*s*, 159*d*, and 159*a*. The surface resin layer 170 also is filled into the opening 158. The surface resin layer 170 is located on the light-emitting surface 151S with the light-transmitting electrode 159*d* interposed. The surface resin layer 170 that is filled into the opening 158 located on the light-transmitting electrode 159*d* is provided to cover the side surfaces of the first inter-layer insulating film 156, the TFT underlying film 106, the insulating layer 105, and the second inter-layer insulating film 108. The surface resin layer 170 is a transparent resin, protects the inter-layer insulating film 156 and the wiring layer 110, and provides a planarized surface for bonding the color filter 180.

The color filter 180 includes a light-shielding part 181 and the color conversion part 182. The color conversion part 182 is located directly above a light-emitting surface 153S of the light-emitting element 150 to correspond to the shape of the light-emitting surface 153S. The part of the color filter 180 other than the color conversion part 182 is the light-shielding part 181. The light-shielding part 181 is a so-called black matrix that reduces blur due to color mixing of the light emitted from the adjacent color conversion parts 182, etc., and makes it possible to display a sharp image.

The color conversion part 182 has one, two, or more layers. FIG. 1 shows a case where the color conversion part 182 has two layers. Whether the color conversion part 182 has one layer or two layers is determined by the color, i.e., the wavelength, of the light emitted by the subpixel 20. When the light emission color of the subpixel 20 is red, it is favorable for the color conversion part 182 to have the two layers of a color conversion layer 183 and a filter layer 184 that transmits red light. When the light emission color of the subpixel 20 is green, it is favorable for the color conversion part 182 to have the two layers of the color conversion layer 183 and the filter layer 184 that transmits green light. When the light emission color of the subpixel 20 is blue, it is favorable to use one layer.

When the color conversion part 182 has two layers, the first layer is the color conversion layer 183, and the second layer is the filter layer 184. The color conversion layer 183 of the first layer is located at a position that is more proximate to the light-emitting element 150. The filter layer 184 is stacked on the color conversion layer 183.

The color conversion layer 183 converts the wavelength of the light emitted by the light-emitting element 150 into the desired wavelength. When the subpixel 20 emits red, for example, light of the wavelength of the light-emitting element 150, i.e., 467 nm±20 nm, is converted into light of a wavelength of about 630 nm±20 nm. When the subpixel 20 emits green light, for example, light of the wavelength of the light-emitting element 150, i.e., 467 nm±20 nm, is converted into light of a wavelength of about 532 nm±20 nm.

The filter layer 184 blocks the wavelength component of the blue light emission that remains without undergoing color conversion by the color conversion layer 183.

When the color of the light emitted by the subpixel 20 is blue, the subpixel 20 may output the light via the color conversion layer 183, or may output the light as-is without the light having passed through the color conversion layer 183. When the wavelength of the light emitted by the light-emitting element 150 is about 467 nm±20 nm, the subpixel 20 may output the light without the light having passed through the color conversion layer 183. When the wavelength of the light emitted by the light-emitting element 150 is 410 nm±20 nm, it is favorable to provide a one-layer color conversion layer 183 to convert the wavelength of the output light into about 467 nm±20 nm.

The subpixel 20 may include the filter layer 184 even when the subpixel 20 is blue. By providing the filter layer 184 through which blue light passes in the blue subpixel 20, the occurrence of a micro external light reflection other than blue light at the surface of the light-emitting element 150 is suppressed.

Figure 2:
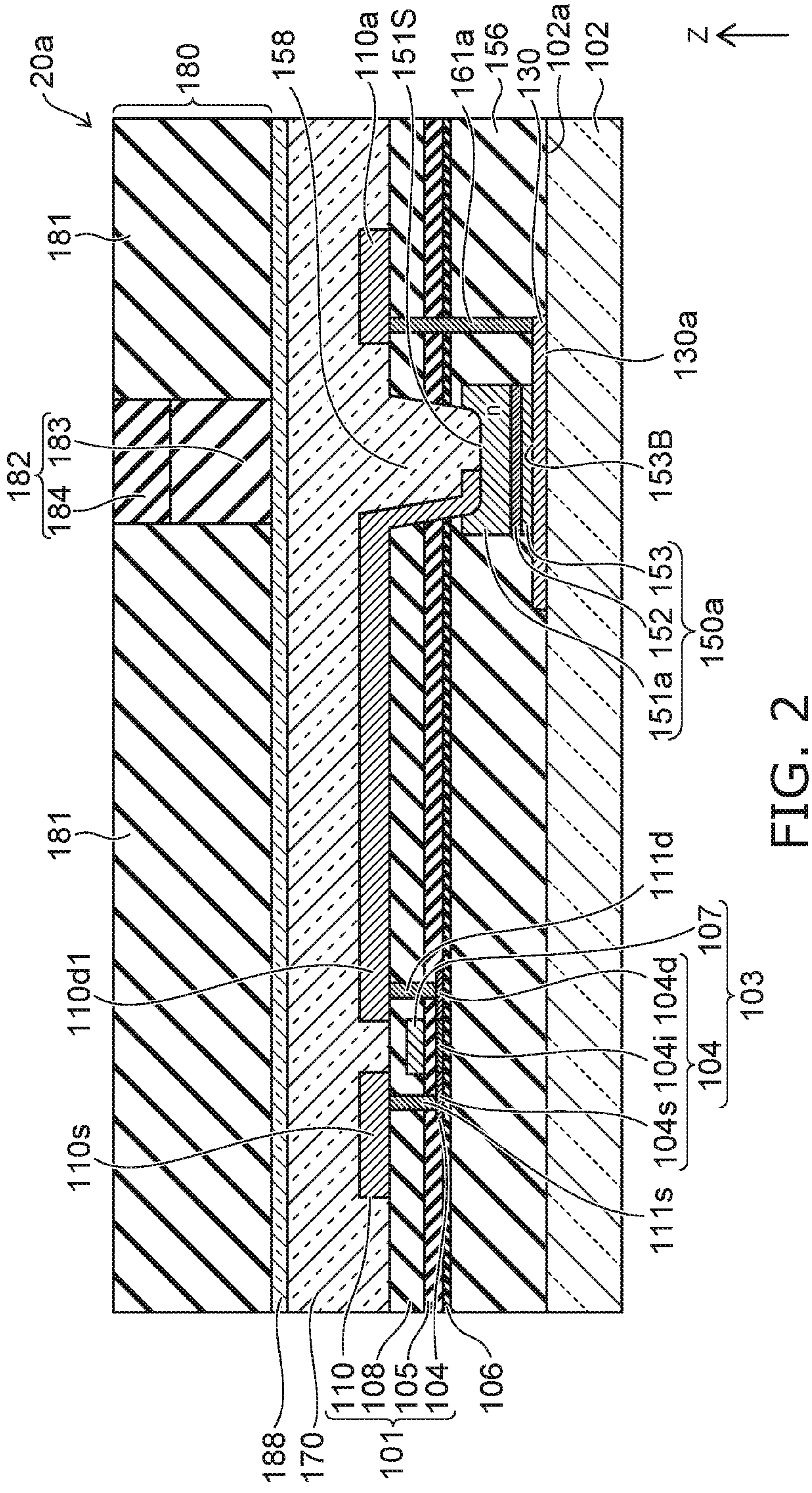
FIG. 2 is a cross-sectional view schematically showing a portion of an image display device according to a modification of the first embodiment.

FIG. 2 is a cross-sectional view schematically showing a portion of an image display device according to a modification of the embodiment.

In a subpixel 20*a* in the case of FIG. 2, the connection method between a light-emitting element 150*a* and an wiring portion 110*d*1 is different from that of the first embodiment described above. The modification differs from the first embodiment in that the light-transmitting electrode is not provided on the wiring portions 110*s*, 110*d*1, and 110*a*. Otherwise, the modification is the same as the first embodiment, the same components are marked with the same reference numerals, and a detailed description is omitted as appropriate. FIG. 2 also displays the structure of the surface resin layer 170 and higher parts. Such an upper structure also is the same as that of the first embodiment.

As shown in FIG. 2, the subpixel 20*a* includes the light-emitting element 150*a* and the wiring portion 110*d*1. A portion of the wiring portion 110*d*1 is located above the region 104*d*. Another portion of the wiring portion 110*d*1 is provided to extend to the light-emitting surface 151S, and has a tip connected to a surface including the light-emitting surface 151S. The surface including the light-emitting surface 151S is a surface in the same plane as the light-emitting surface 151S. The tip of the wiring portion 110*d*1 is connected to this surface other than the light-emitting surface 151S. Although the light-emitting surface 151S is not roughened in the example, the light-emitting surface 151S also may be roughened. When not roughened, a process for roughening can be omitted.

The embodiment can include any configuration of the subpixels 20 and 20*a* described above.

Figure 3:
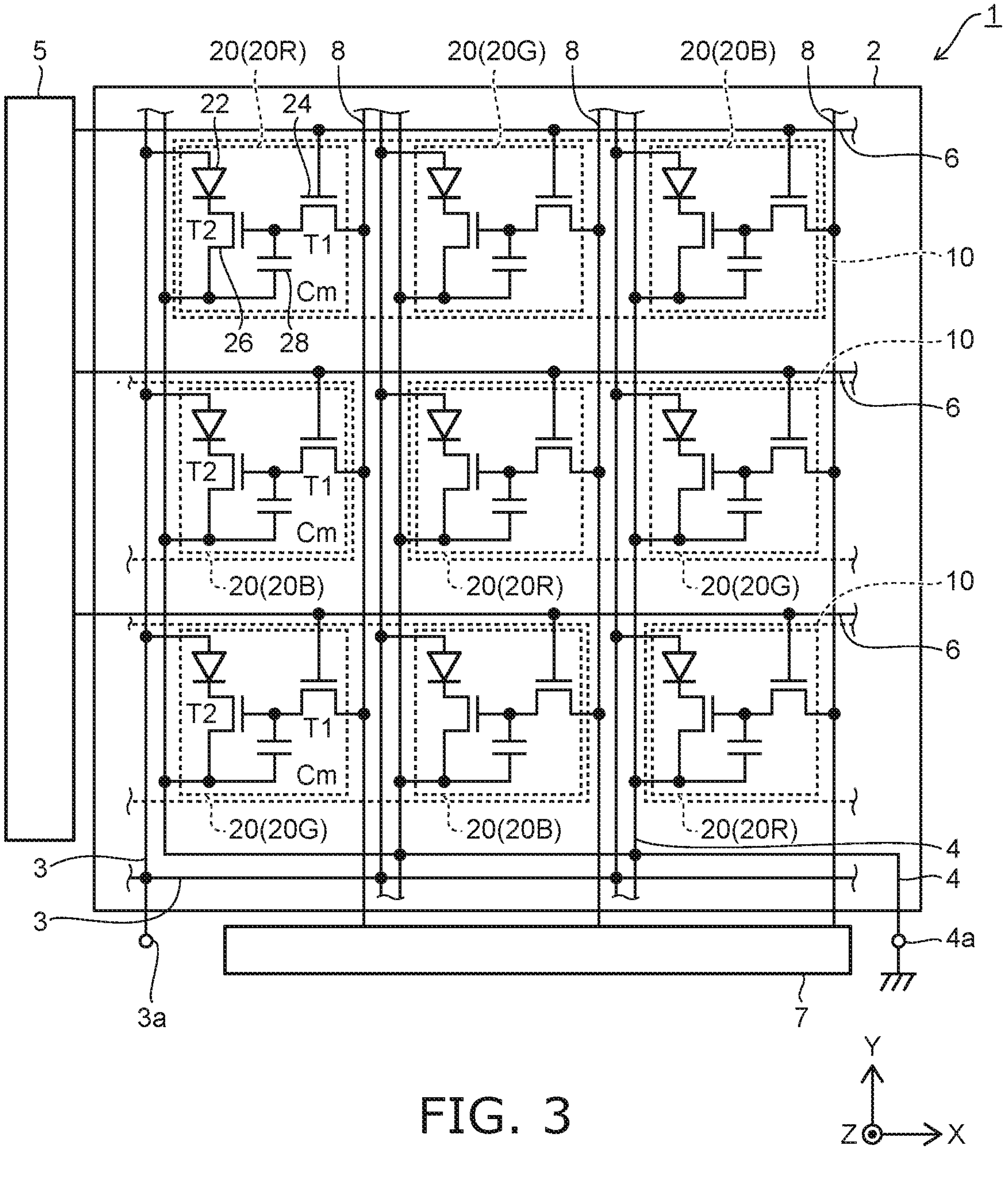
FIG. 3 is a schematic block diagram illustrating the image display device of the first embodiment.

FIG. 3 is a schematic block diagram illustrating the image display device according to the embodiment.

As shown in FIG. 3, the image display device 1 of the embodiment includes a display region 2. The subpixels 20 are arranged in the display region 2. For example, the subpixels 20 are arranged in a lattice shape. For example, n subpixels 20 are arranged along the X-axis, and m subpixels 20 are arranged along the Y-axis.

A pixel 10 includes multiple subpixels 20 that emit light of different colors. A subpixel 20R emits red light. A subpixel 20G emits green light. A subpixel 20B emits blue light. The light emission color and luminance of one pixel 10 are determined by the three types of the subpixels 20R, 20G, and 20B emitting light of the desired luminances.

One pixel 10 includes the three subpixels 20R, 20G, and 20B; for example, the subpixels 20R, 20G, and 20B are arranged in a straight line along the X-axis as shown in FIG. 3. In each pixel 10, subpixels of the same color may be arranged in the same column, or subpixels of different colors may be arranged in each column as in the example.

The image display device 1 further includes the power supply line 3 and the ground line 4. The power supply line 3 and the ground line 4 are wired in a lattice shape along the arrangement of the subpixels 20. The power supply line 3 and the ground line 4 are electrically connected to each subpixel 20, and electrical power is supplied to each subpixel 20 from a DC power supply connected between a power supply terminal 3*a* and a GND terminal 4*a*. The power supply terminal 3*a* and the GND terminal 4*a* are located respectively at end portions of the power supply line 3 and the ground line 4, and are connected to a DC power supply circuit located outside the display region 2. The power supply terminal 3*a* supplies a positive voltage when referenced to the GND terminal 4*a*.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the Y-axis direction of the outer edge of the display region 2. The row selection circuit 5 is electrically connected to the subpixel 20 of each column via the scanning line 6, and supplies a select signal to each subpixel 20.

The signal voltage output circuit 7 is located along the X-axis direction of the outer edge of the display region 2. The signal voltage output circuit 7 is electrically connected to the subpixel 20 of each row via the signal line 8, and supplies a signal voltage to each subpixel 20.

Figure 4:
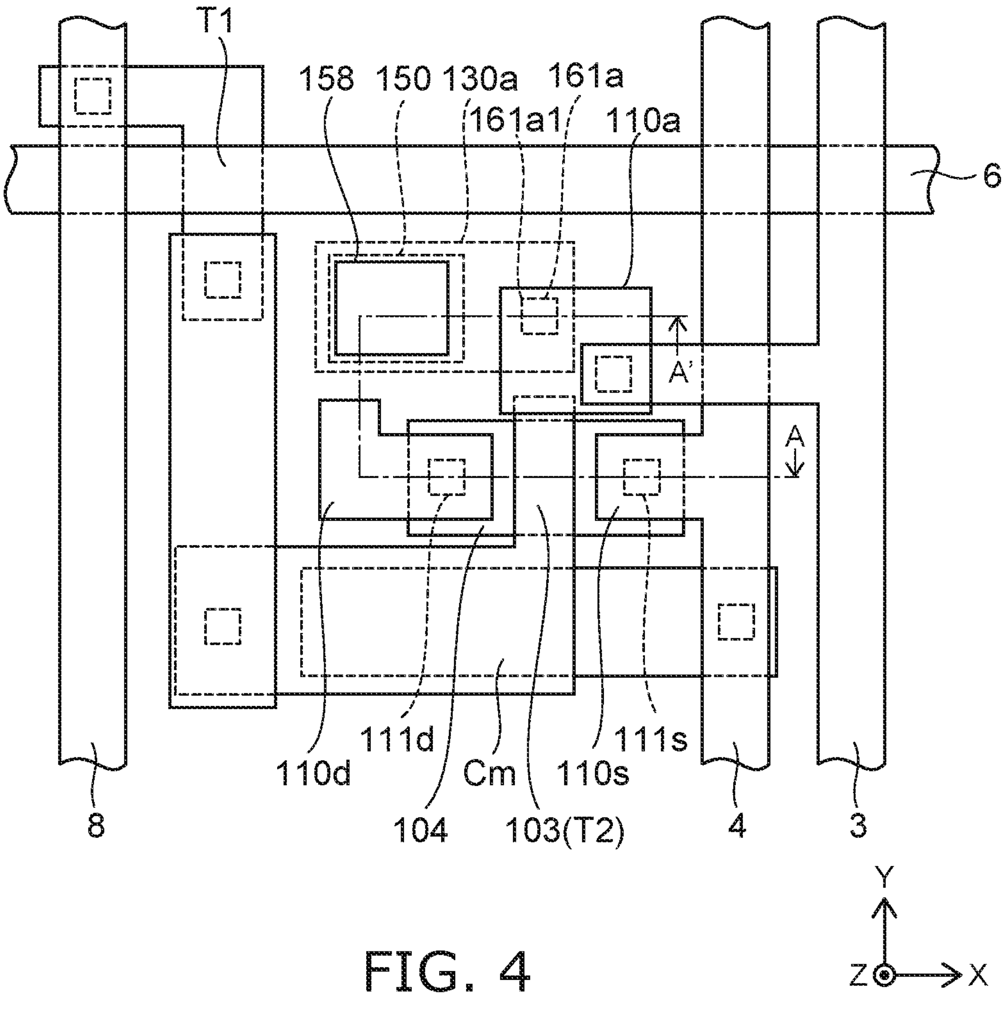
FIG. 4 is a schematic plan view illustrating a portion of the image display device of the first embodiment.

The subpixel 20 includes a light-emitting element 22, the select transistor 24, the drive transistor 26, and the capacitor 28. In FIGS. 3 and 4 below, the select transistor 24 may be displayed as T1, the drive transistor 26 may be displayed as T2, and the capacitor 28 may be displayed as Cm.

The light-emitting element 22 is connected in series with the drive transistor 26. According to the embodiment, the drive transistor 26 is an n-channel TFT, and a cathode electrode of the light-emitting element 22 is connected to a drain electrode of the drive transistor 26. Major electrodes of the drive transistor 26 and the select transistor 24 are drain electrodes and source electrodes. The anode electrode of the light-emitting element 22 is connected to a p-type semiconductor layer. The cathode electrode of the light-emitting element 22 is connected to an n-type semiconductor layer. A series circuit of the light-emitting element 22 and the drive transistor 26 is connected between the power supply line 3 and the ground line 4. The drive transistor 26 corresponds to the transistor 103 of FIG. 1, and the light-emitting element 22 corresponds to the light-emitting element 150 of FIG. 1. The current that flows in the light-emitting element 22 is determined by the voltage that is applied between the gate and source of the drive transistor 26, and the light-emitting element 22 emits light of a luminance corresponding to the current that flows.

The select transistor 24 is connected between the signal line 8 and the gate electrode of the drive transistor 26 via a major electrode. The gate electrode of the select transistor 24 is connected to the scanning line 6. The capacitor 28 is connected between the ground line 4 and the gate electrode of the drive transistor 26.

The row selection circuit 5 selects one row from the arrangement of m rows of the subpixels 20 and supplies the select signal to the scanning line 6. The signal voltage output circuit 7 supplies a signal voltage that has an analog voltage value necessary for each subpixel 20 of the selected row. The signal voltage is applied between the gate and source of the drive transistor 26 of the subpixels 20 of the selected row. The signal voltage is maintained by the capacitor 28. The drive transistor 26 causes a current that corresponds to the signal voltage to flow in the light-emitting element 22. The light-emitting element 22 emits light of a luminance that corresponds to the current flowing in the light-emitting element 22.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. An image is displayed in the display region 2 by each pixel 10 emitting the light emission color and luminance determined by the light emission color and luminance emitted by the subpixels 20 of the colors of RGB.

FIG. 4 is a schematic plan view illustrating a portion of the image display device of the embodiment.

According to the embodiment as described in reference to FIG. 1, the light-emitting element 150 and the drive transistor 103 are stacked in the Z-axis direction with the first inter-layer insulating film 156 interposed. In other words, the light-emitting element 150 is formed in a different layer from the layer in which the transistor 103 is formed. The light-emitting element 150 corresponds to the light-emitting element 22 in FIG. 3. The drive transistor 103 corresponds to the drive transistor 26 in FIG. 3 and is labeled as T2. To avoid complexity, the light-transmitting electrode is not illustrated in FIG. 4.

As shown in FIG. 4, the anode electrode of the light-emitting element 150 is located on the connection plate 130*a* and electrically connected with the connection plate 130*a*. The connection plate 130*a* is located in a lower layer than the transistor 103 and the wiring layer 110. The connection plate 130a is electrically connected to the wiring portion 110a by the via 161a. More specifically, one end of the via 161a is connected to the connection plate 130a, and the other end of the via 161a is connected to the wiring portion 110a via a contact hole 161a1.

The cathode electrode of the light-emitting element 150 is provided by the n-type semiconductor layer 151 shown in FIG. 1. The wiring portion 110d is covered with the light-transmitting electrode 159d shown in FIG. 1. The light-transmitting electrode 159d covers the light-emitting surface 151S. The light-transmitting electrode 159d is also located between the wiring portion 110d and the light-emitting surface 151S; therefore, the cathode electrode of the light-emitting element 150 is electrically connected to the wiring portion 110d.

A portion of the wiring portion 110d is connected to the drain electrode of the transistor 103 by the via 111d. The drain electrode of the transistor 103 is the region 104d shown in FIG. 1. The source electrode of the transistor 103 is connected to the wiring portion 110s by the via 111s. The source electrode of the transistor 103 is the region 104s shown in FIG. 1. In the example, the wiring layer 110 includes the ground line 4, and the wiring portion 110s is connected to the ground line 4.

In the example, the power supply line 3 is located in a higher layer than the wiring layer 110. Although not illustrated in FIG. 1, an inter-layer insulating film also is located on the wiring layer 110. The power supply line 3 is located on the inter-layer insulating film of the uppermost layer and is insulated from the ground line 4.

Thus, by using the via 161a, the light-emitting element 150 can be electrically connected to the wiring portion 110a located in a higher layer than the light-emitting element 150. Also, the light-emitting element 150 can be electrically connected to the transistor 103 located in a higher layer than the light-emitting element 150 via the wiring portion 110d by providing the opening 158 that exposes the light-emitting surface 151S and by providing the light-transmitting electrode 159d over the opening 158.

Also, the outer perimeter of the connection plate 130a includes the outer perimeter of the light-emitting element 150. The outer perimeter of the connection plate 130a is set not to include the outer perimeter of the TFT channel 104. The substantial luminous efficiency of the light-emitting element 150 can be increased, and a malfunction due to light irradiation on the transistor including the TFT channel 104 can be prevented.

A production method for the image display device 1 of the embodiment will now be described.

Figure 5A:
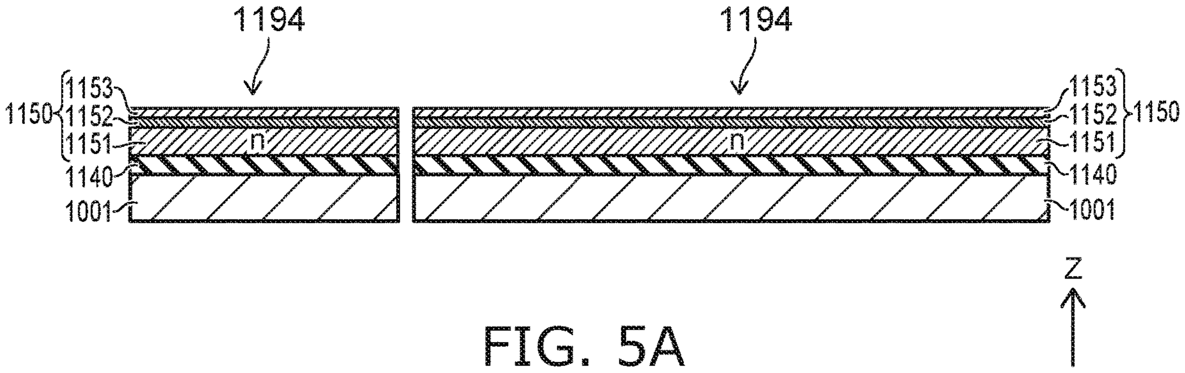
FIG. 5A is a schematic cross-sectional view illustrating a production method for the image display device of the first embodiment.
Figure 5B:
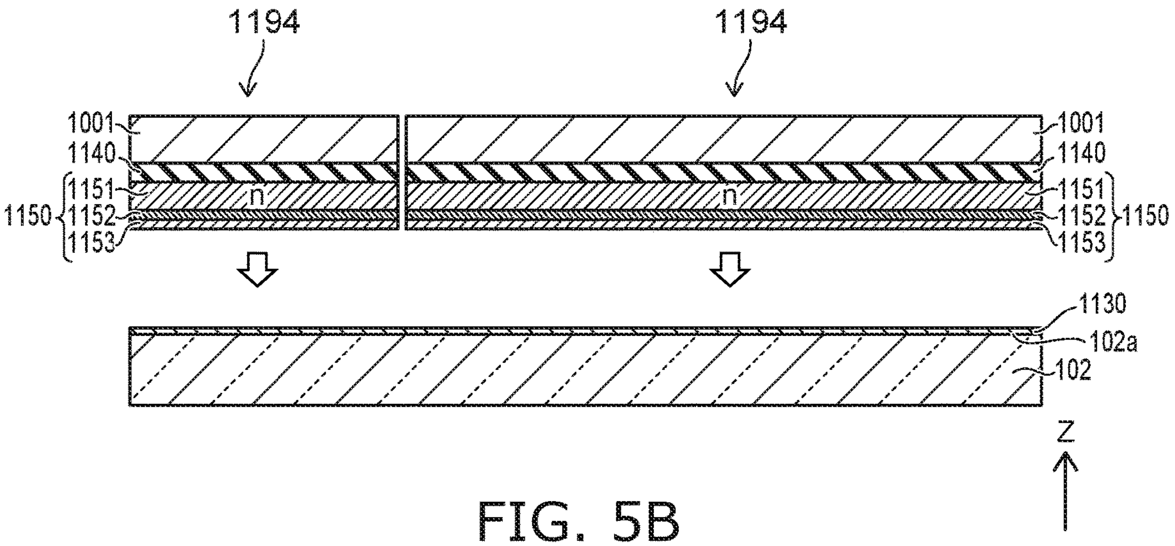
FIG. 5B is a schematic cross-sectional view illustrating the production method for the image display device of the first embodiment.

FIGS. 5A and 5B are schematic cross-sectional views illustrating the production method for the image display device of the embodiment.

According to the production method for the image display device 1 of the embodiment as shown in FIG. 5A, multiple semiconductor growth substrates 1194 are prepared. The multiple semiconductor growth substrates (second substrates) 1194 each include a crystal growth substrate 1001, a buffer layer 1140, and a semiconductor layer 1150. The crystal growth substrate 1001 (a first substrate) is, for example, a Si substrate, a sapphire substrate, etc. Favorably, a Si substrate is used as the crystal growth substrate 1001. Also, as described below, a more inexpensive glass substrate or the like also can be used as the crystal growth substrate 1001 when a low-temperature crystal growth process such as low-temperature sputtering, ALD (Atomic Layer Deposition), or the like is used.

The buffer layer 1140 is formed at one surface of the crystal growth substrate 1001. The buffer layer 1140 favorably includes a nitride such as AlN, etc. Mismatch at the interface between the crystal growth substrate 1001 and the GaN crystal can be relaxed by performing the crystal growth of the semiconductor layer 1150 via the buffer layer 1140.

The semiconductor layer 1150 is formed on the buffer layer 1140. The semiconductor layer 1150 includes an n-type semiconductor layer 1151, a light-emitting layer 1152, and a p-type semiconductor layer 1153. The n-type semiconductor layer 1151, the light-emitting layer 1152, and the p-type semiconductor layer 1153 are stacked in this order from the buffer layer 1140 side. For example, vapor deposition (Chemical Vapor Deposition, CVD) is used to form the semiconductor layer 1150, and it is favorable to use metal-organic chemical vapor deposition (Metal Organic Chemical Vapor Deposition, MOCVD). Or, epitaxial crystal growth of the semiconductor layer 1150 by low-temperature sputtering is possible even at a process temperature of not more than 700° C., which enables a manufacturing cost reduction by using machines and/or glass substrates that have low heat resistance. The semiconductor layer 1150 includes, for example, GaN, and more specifically, $In_XAl_YGa_{1-X-Y}N$ ($0 \le X$, $0 \le Y$, and $X+Y<1$), etc.

There are cases where crystal defects caused by crystal lattice constant mismatch occur in the initial stage of the crystal growth, and the crystal in which the crystal defects occur is of the n-type. Therefore, an advantage is provided in that the yield is easily increased because the production process margin can be increased when the semiconductor layer 1150 is formed on the crystal growth substrate 1001 from the n-type semiconductor layer 1151 as in the example.

As shown in FIG. 5B, the substrate 102 (a third substrate) is prepared. The metal layer (a first metal layer) 1130 is formed over the first surface 102a that is one surface of the substrate 102. For example, the metal layer 1130 is formed of Al, an alloy of Al, a stacked film of Al, Ti, and the like, etc. Favorably, a metal material that has high light reflectivity such as Ag or the like is located on a metal layer of Al, etc.

In the multiple semiconductor growth substrates 1194, the exposed surface of the p-type semiconductor layer 1153 is positioned to face the exposed surface of the metal layer 1130. The semiconductor layer 1150 is bonded to the substrate 102 via the metal layer 1130. The bonding may be performed by forming a metal layer also on the exposed surface of the p-type semiconductor layer 1153 and by arranging the exposed surfaces of the metal layers to face each other.

In the substrate bonding process, for example, the substrates can be bonded to each other by heating the substrates and by performing thermal compression bonding. A low melting-point metal and/or a low melting-point alloy may be used when performing thermal compression bonding. The low melting-point metal can be, for example, Sn, In, etc., and the low melting-point alloy can be, for example, an alloy having Zn, In, Ga, Sn, Bi, etc., as a major component.

Other than the method described above, in the substrate bonding process such as that shown in FIG. 5B, the bonding surfaces of the substrates may be closely adhered by planarizing with chemical mechanical polishing (Chemical Mechanical Polishing, CMP), etc., and then by cleaning the bonding surfaces in a vacuum by plasma processing.

The substrate 102 is, for example, a substantially rectangular glass substrate that is about 1500 mm×1800 mm. The semiconductor growth substrate 1194 has a rectangular shape or a square shape that is about several tens of mm square to 150 mm square, and when converted to wafer dimensions, has, for example, a size of about 4 inches to 6 inches. The size of the substrate 102 is appropriately selected according to the size of the image display device, etc. When the size of the substrate 102 is, for example, a rectangular shape or a square shape that is about several tens of mm square to 150 mm square, one semiconductor layer 1150 may be bonded to one substrate 102.

Figure 6:
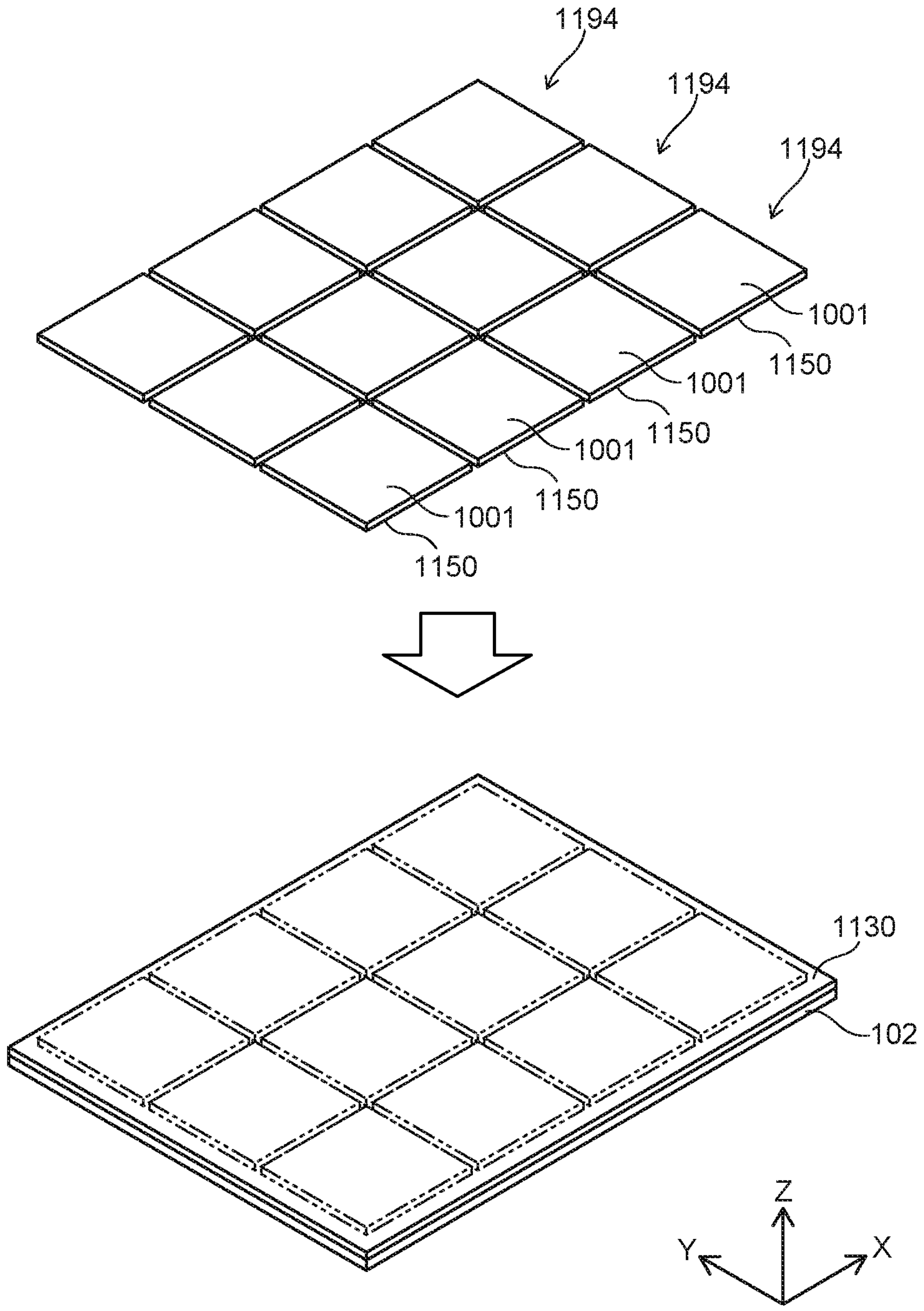
FIG. 6 is a schematic perspective view illustrating the production method for the image display device of the first embodiment.

FIG. 6 is a perspective view illustrating the production method for the image display device of the embodiment.

The diagram above the arrow of FIG. 6 shows the multiple substrates 1194 arranged in a lattice shape. The diagram below the arrow of FIG. 6 shows the disposition of the substrate 102 on which the metal layer 1130 is formed. In FIG. 6, the multiple substrates 1194 that are arranged in the lattice shape are arranged so that the semiconductor layers 1150 face the metal layer 1130, and the arrow shows bonding.

It should be noted that the light-emitting element 150 is not formed at the edge portion or the vicinity of the edge portion of the semiconductor layer 1150 because the crystal quality degrades at the edge portion and the vicinity of the edge portion of the semiconductor layer 1150.

As shown in FIG. 6, the edge portion of the semiconductor layer 1150 is formed to be substantially aligned with the edge portion of the crystal growth substrate 1001. Therefore, for example, the multiple semiconductor growth substrates 1194 are positioned to face the substrate 102 in a lattice shape as shown by the solid lines of FIG. 6 to reduce the gap between the adjacent substrates as much as possible. The semiconductor layers 1150 are bonded to the metal layer 1130 formed on the substrate 102 as shown by the double dot-dash lines of FIG. 6.

When the multiple semiconductor layers 1150 are bonded to one substrate 102, the substrate 102 to which the multiple semiconductor layers 1150 are bonded can be subdivided to make image display devices of the quantity and size corresponding to the number of subdivisions. The substrate 102 to which the multiple semiconductor layers 1150 are bonded may be subdivided before embedding the color filter or may be subdivided after embedding the color filter. Because it is favorable for the edge portion of the semiconductor layer 1150 at which the crystal quality degrades to be the edge portion of the display region, it is favorable for the subdivision unit to be set to match the shape of the semiconductor growth substrate 1194. The embedding process of the color filter is described below with reference to FIG. 13 and FIGS. 14A to 14D.

FIGS. 7A to 8C are schematic cross-sectional views illustrating the production method for the image display device of the embodiment.

FIGS. 7A to 8C show two types of modifications related to the substrate bonding process. In the substrate bonding process, the processes of FIGS. 7A and 7B can be used instead of the processes of FIGS. 5A and 5B. Also, the processes of FIGS. 8A to 8C may be used instead of the processes of FIGS. 5A and 5B.

Figure 7A:
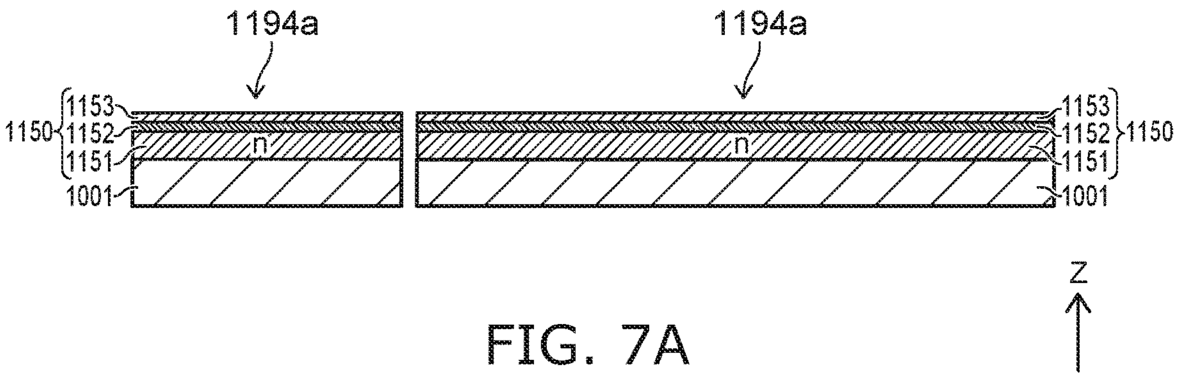
FIG. 7A is a schematic cross-sectional view illustrating the production method for the image display device of the first embodiment.
Figure 7B:
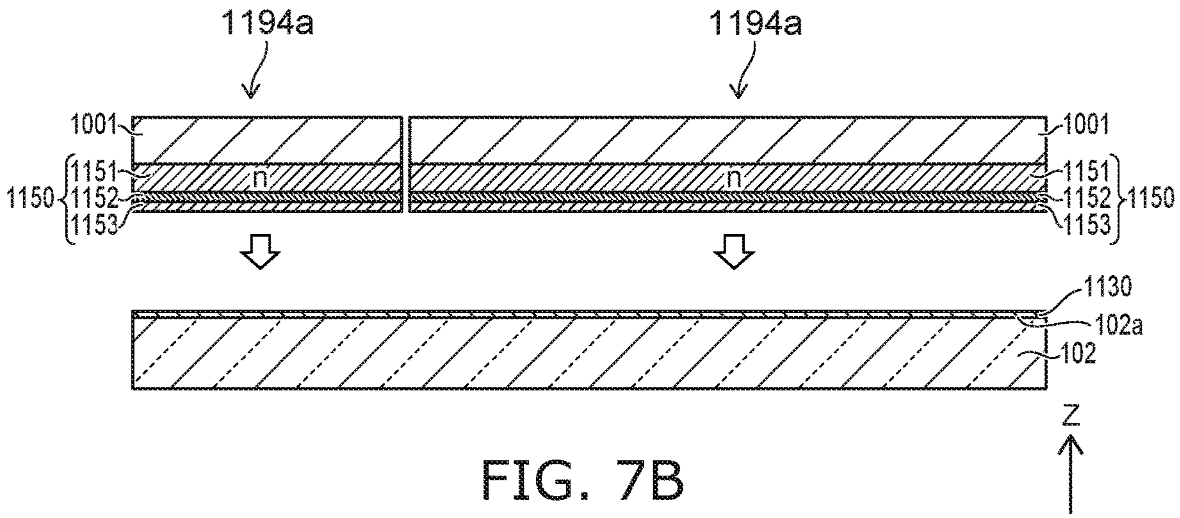
FIG. 7B is a schematic cross-sectional view illustrating the production method for the image display device of the first embodiment.

In the manufacturing processes shown in FIGS. 7A and 7B, the semiconductor layer 1150 is formed on one surface of the crystal growth substrate 1001 without interposing the buffer layer 1140 shown in FIG. 5A.

As shown in FIG. 7A, multiple semiconductor growth substrates 1194*a* are prepared instead of the multiple semiconductor growth substrates 1194 shown in FIG. 5A. The multiple semiconductor growth substrates 1194*a* each include the crystal growth substrate 1001 and the semiconductor layer 1150. The semiconductor layer 1150 is formed directly on the one surface of the crystal growth substrate 1001. Similarly to FIG. 5A, CVD, MOCVD, or the like is used to form the semiconductor layer 1150.

As shown in FIG. 7B, the exposed surface of the p-type semiconductor layer 1153 is positioned to face the exposed surface of the metal layer 1130 formed on the first surface 102*a*. Subsequently, the exposed surface of the p-type semiconductor layer 1153 is bonded to the substrate 102 via the metal layer 1130.

Figure 8A:
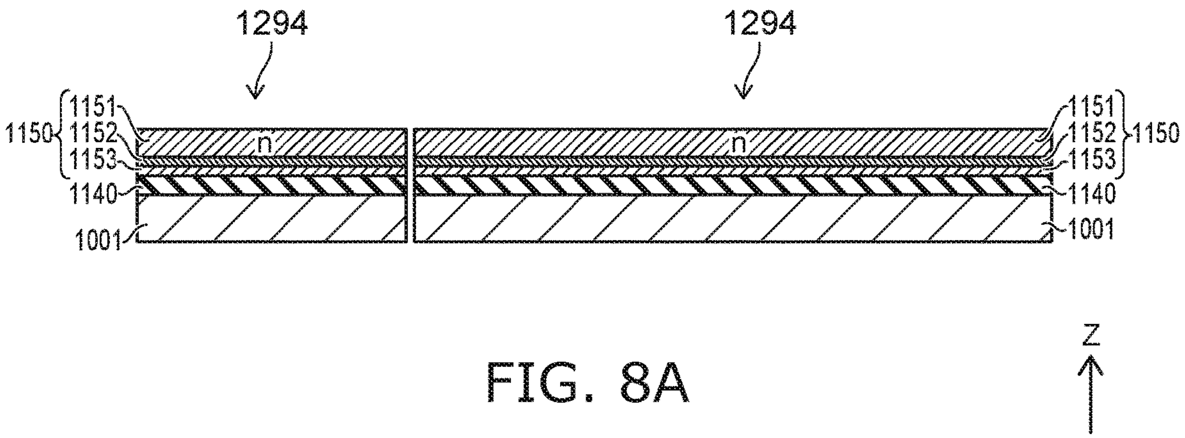
FIG. 8A is a schematic cross-sectional view illustrating the production method for the image display device of the first embodiment.
Figure 8B:
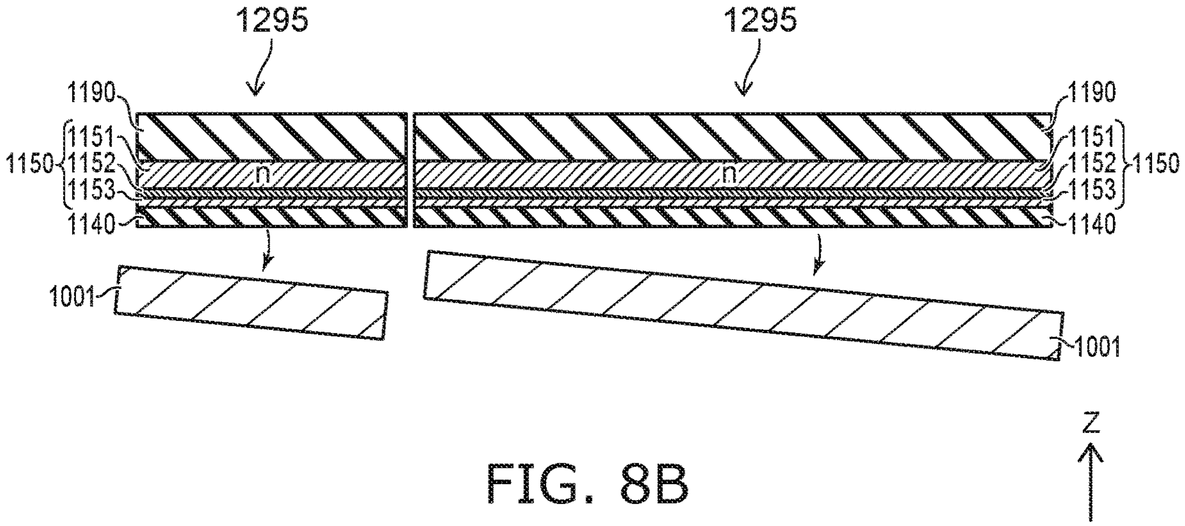
FIG. 8B is a schematic cross-sectional view illustrating the production method for the image display device of the first embodiment.
Figure 8C:
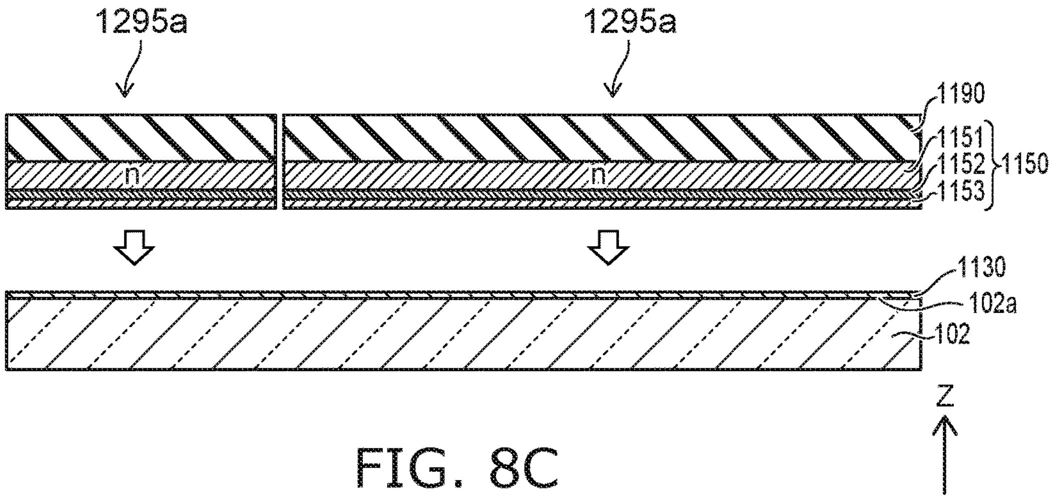
FIG. 8C is a schematic cross-sectional view illustrating the production method for the image display device of the first embodiment.

In FIGS. 8A to 8C, the semiconductor layer 1150 that is formed on the crystal growth substrate 1001 is transferred to a support substrate 1190. The transferred semiconductor layer 1150 is bonded to the substrate 102 via the metal layer 1130 formed on the substrate 102.

Multiple semiconductor growth substrates 1294 are prepared as shown in FIG. 8A. The semiconductor growth substrate 1294 includes the crystal growth substrate 1001, the buffer layer 1140, and the semiconductor layer 1150. In the semiconductor growth substrate 1294, the buffer layer 1140 is formed on one surface of the crystal growth substrate 1001, and the semiconductor layer 1150 is formed via the buffer layer 1140. In the semiconductor layer 1150, the p-type semiconductor layer 1153, the light-emitting layer 1152, and the n-type semiconductor layer 1151 are formed in this order from the buffer layer 1140 side.

As shown in FIG. 8B, the support substrate 1190 is bonded to the exposed surface of the n-type semiconductor layer 1151. For example, the support substrate 1190 is formed of quartz glass, Si, etc.

After the support substrate 1190 is bonded to the semiconductor layer 1150, a substrate 1295 is formed by removing the crystal growth substrate 1001. For example, wet etching and/or laser lift-off is used to remove the crystal growth substrate 1001.

As shown in FIG. 8C, a substrate 1295*a* is formed by removing the buffer layer 1140 shown in FIG. 8B by wet etching, etc. The exposed surface of the p-type semiconductor layer 1153 exposed by removing the buffer layer 1140 is positioned to face the metal layer 1130 formed on the first surface 102*a*. The semiconductor layer 1150 is bonded to the substrate 102 via the metal layer 1130.

Although the buffer layer 1140 is formed on the crystal growth substrate 1001 and the semiconductor layer 1150 is formed via the buffer layer 1140 according to the production method, the semiconductor layer 1150 may be formed directly on the crystal growth substrate 1001 without the buffer layer 1140 interposed.

The processes up to the formation of the semiconductor growth substrates 1194, 1194*a*, and 1294 may be performed in a different plant or in the same plant as the plant in which the process of bonding the semiconductor layer 1150 to the substrate 102 and subsequent processes are performed. For example, the semiconductor growth substrates 1194, 1194*a*, and 1294 and the substrate 1295 after bonding to the support substrate 1190 may be manufactured in a first plant, and the subsequent processes may be performed by transferring the semiconductor growth substrate 1194 to a second plant that is different from the first plant.

The method for bonding the semiconductor layer 1150 to the substrate 102 is not limited to the methods described above, and the following methods also can be used. Namely, the semiconductor layer 1150 is formed on the crystal growth substrate 1001, then is stored in a container in a state in which the crystal growth substrate 1001 is removed, has the support substrate 1190 mounted inside, for example, a container, and is stored. After storing, the semiconductor layer 1150 is removed from the container and bonded to the substrate 102. Also, the semiconductor layer 1150 may be stored in a container without having the support substrate 1190 mounted. After storing, the semiconductor layer 1150 is removed from the container and bonded to the substrate 102 as-is.

The description continues now by returning to the manufacturing process after the substrate bonding process.

FIGS. 9A to 11B are schematic cross-sectional views illustrating the production method for the image display device of the embodiment.

Figure 9A:
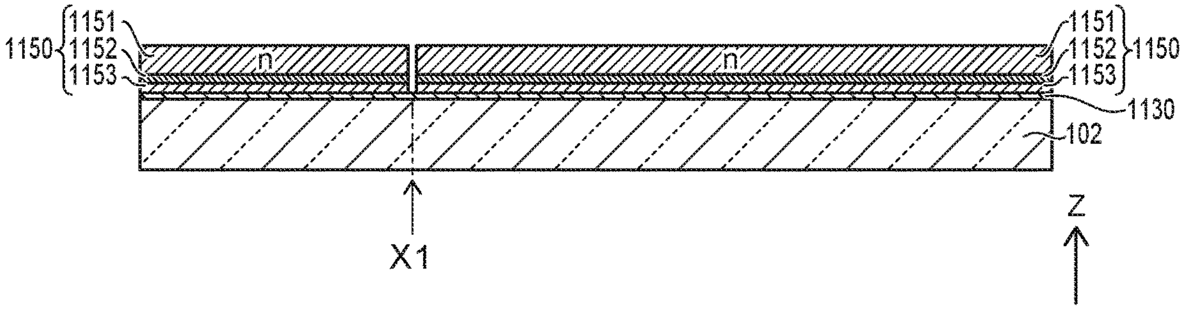
FIG. 9A is a schematic cross-sectional view illustrating the production method for the image display device of the first embodiment.

As shown in FIG. 9A, the crystal growth substrate 1001 shown in FIG. 5B is removed by wet etching, laser lift-off, etc. Also, the buffer layer 1140 shown in FIG. 5B is removed by wet etching, etc.

As described in reference to FIG. 6, the multiple semiconductor growth substrates 1194 are arranged adjacent to each other and bonded to the substrate 102. A position X1 is the position at which the edge portions of mutually-adjacent semiconductor growth substrates 1194 are located. The edge portions of the semiconductor layers 1150 also are proximate and adjacent to each other at the position X1.

Figure 9B:
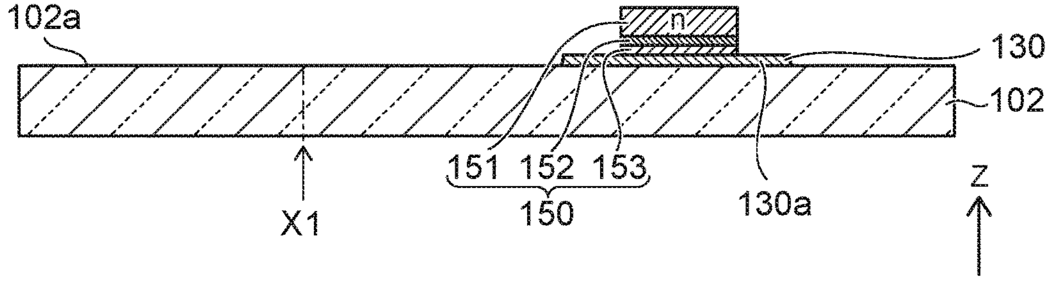
FIG. 9B is a schematic cross-sectional view illustrating the production method for the image display device of the first embodiment.

As shown in FIG. 9B, the light-emitting element 150 is formed by patterning the semiconductor layer 1150 shown in FIG. 9A into the desired shape by etching. The light-emitting element 150 is formed at a position sufficiently distant to the region including the position X1. The region that includes the position X1 removed by the etching is determined based on the evaluation result of evaluating the crystal quality at the edge portion vicinity of the semiconductor layer 1150.

For example, a dry etching process is used to form the light-emitting element 150, and anisotropic plasma etching (Reactive Ion Etching, RIE) is favorably used. The buffer layer 1140 shown in FIG. 9A may be utilized as a mask when forming the light-emitting element 150. In such a case, the buffer layer that remains on the light-emitting element 150 is removed by wet etching, etc., after the formation of the light-emitting element 150.

After forming the light-emitting element 150, the conductive layer 130 is formed by etching the metal layer 1130 shown in FIG. 9A. The connection plate 130*a* is formed in the formation process of the conductive layer 130. Thus, the connection plate 130*a* (the first part) is formed on the first surface 102*a*, and the light-emitting element 150 is formed on the connection plate 130*a*. The outer perimeter of the connection plate 130*a* is set to include the outer perimeter of the light-emitting element 150 when the light-emitting element 150 is projected when viewed in plan.

Figure 10A:
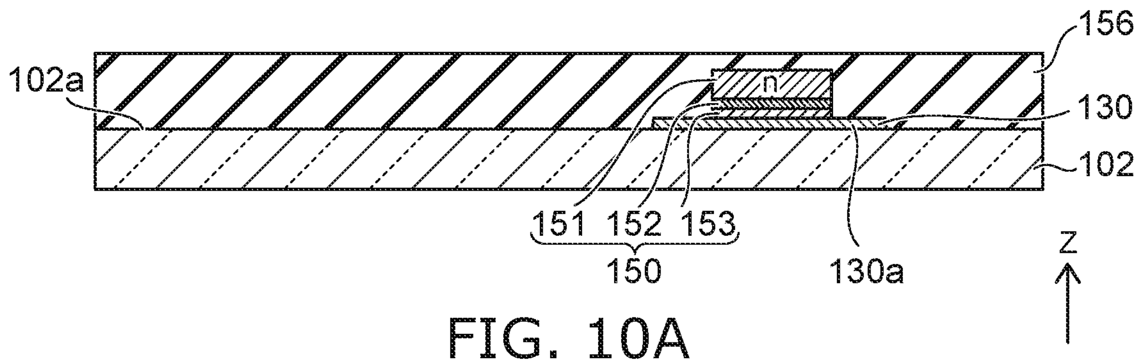
FIG. 10A is a schematic cross-sectional view illustrating the production method for the image display device of the first embodiment.

As shown in FIG. 10A, the first inter-layer insulating film 156 (a first insulating film) that covers the first surface 102*a*, the conductive layer 130, the connection plate 130*a*, and the light-emitting element 150 is formed.

Figure 10B:
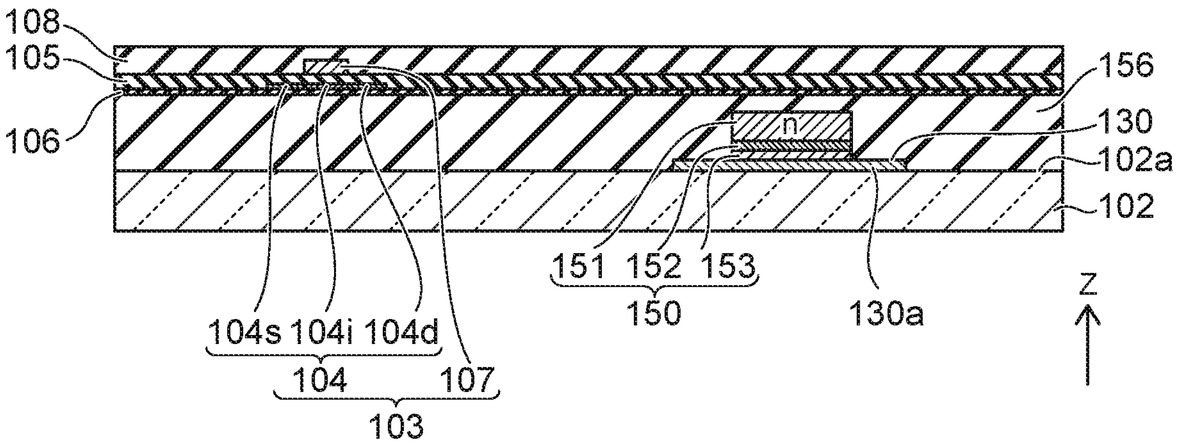
FIG. 10B is a schematic cross-sectional view illustrating the production method for the image display device of the first embodiment.

As shown in FIG. 10B, the TFT underlying film 106 is formed on the first inter-layer insulating film 156. The TFT underlying film 106 is formed by, for example, CVD, etc.

The TFT channel 104 is formed on the TFT underlying film 106. For example, the TFT channel 104 is formed as follows in a LTPS process. First, an amorphous Si film is formed in the shape of the TFT channel 104. For example, CVD or the like is used to form the amorphous Si. The amorphous Si film that is formed is polycrystallized by laser annealing, and the TFT channel 104 is formed.

Subsequently, the source electrode and the drain electrode of the TFT channel 104 are formed by, for example, introducing impurity ions of phosphorus (P) or the like into the regions 104*s* and 104*d* by using ion implantation technology, etc. The formation process of the source electrode and the drain electrode may be performed after the formation process of the gate 107.

The insulating layer 105 is formed over the TFT underlying film 106 and the TFT channel 104. For example, the insulating layer 105 is formed by CVD, etc. The gate 107 is formed at a position on the TFT channel 104 with the insulating layer 105 interposed. An appropriate formation method according to the material of the gate 107 is used to form the gate 107. For example, in the case of polycrystal Si, the gate 107 is formed similarly to the TFT channel 104 by polycrystallizing by laser annealing of amorphous Si. The transistor 103 is thus formed.

The second inter-layer insulating film 108 (a second insulating film) is provided to cover the insulating layer 105 and the gate 107. An appropriate formation method according to the material of the second inter-layer insulating film 108 is applied to form the second inter-layer insulating film 108. For example, technology such as ALD, CVD, etc., is used when the second inter-layer insulating film 108 is formed of $SiO_2$.

It is sufficient for the second inter-layer insulating film 108 to have enough flatness to form the wiring layer 110, and a planarizing process may not always be performed. The number of processes can be reduced when a planarizing process is not performed on the second inter-layer insulating film 108. For example, when there is a location at the periphery of the light-emitting element 150 at which the thickness of the second inter-layer insulating film 108 is thin, a sufficient opening diameter of the via hole extending through the first and second inter-layer insulating films 156 and 108 can be ensured because the depth of the via hole becomes shallow. It is therefore easier to ensure the electrical connection by the via, and the reduction of the yield due to defects of the electrical characteristics can be suppressed.

Figure 11A:
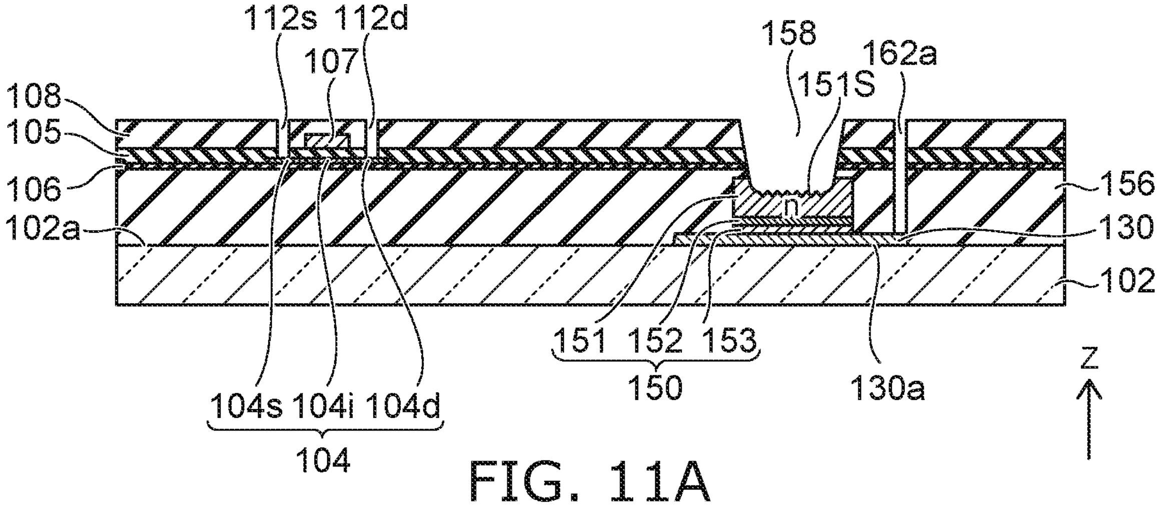
FIG. 11A is a schematic cross-sectional view illustrating the production method for the image display device of the first embodiment.

As shown in FIG. 11A, a via hole 162*a* extends through the second inter-layer insulating film 108, the insulating layer 105, the TFT underlying film 106, and the first inter-layer insulating film 156 and is formed to reach the connection plate 130*a*. The opening 158 is formed to reach the light-emitting surface 151S by removing the second inter-layer insulating film 108, the insulating layer 105, the TFT underlying film 106, and the first inter-layer insulating film 156 on the light-emitting surface 151S. As in the example, the light-emitting surface 151S may be formed by causing the etching of the central part of the n-type semiconductor layer 151 to progress in the thickness direction of the n-type semiconductor layer 151. It is favorable for the light-emitting surface 151S to be roughened as in the example.

A via hole 112*d* extends through the second inter-layer insulating film 108 and the insulating layer 105 and is formed to reach the region 104*d*. A via hole 112*s* extends through the second inter-layer insulating film 108 and the insulating layer 105 and is formed to reach the region 104*s*. For example, RIE or the like is used to form the via holes 162*a*, 112*d*, and 112*s* and the opening 158.

Figure 11B:
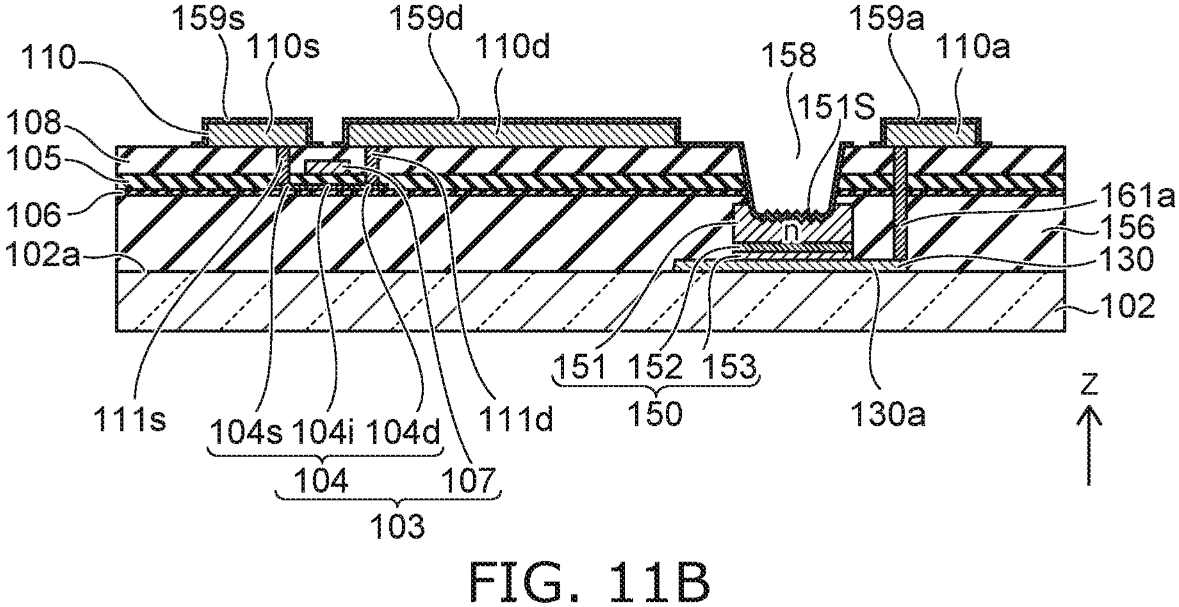
FIG. 11B is a schematic cross-sectional view illustrating the production method for the image display device of the first embodiment.

As shown in FIG. 11B, the via 161*a* (a first via) is formed by filling a conductive material into the via hole 162*a* shown in FIG. 11A. The vias 111*d* and 111*s* also are formed by filling a conductive material respectively into the via holes 112*d* and 112*s* shown in FIG. 11A. Subsequently, the wiring layer 110 is formed on the second inter-layer insulating film 108, and the wiring portions 110*a*, 110*d*, and 110*s* are formed. The wiring layer 110 may be formed simultaneously with the formation of the vias 161*a*, 111*d*, and 111*s*.

Figure 12A:
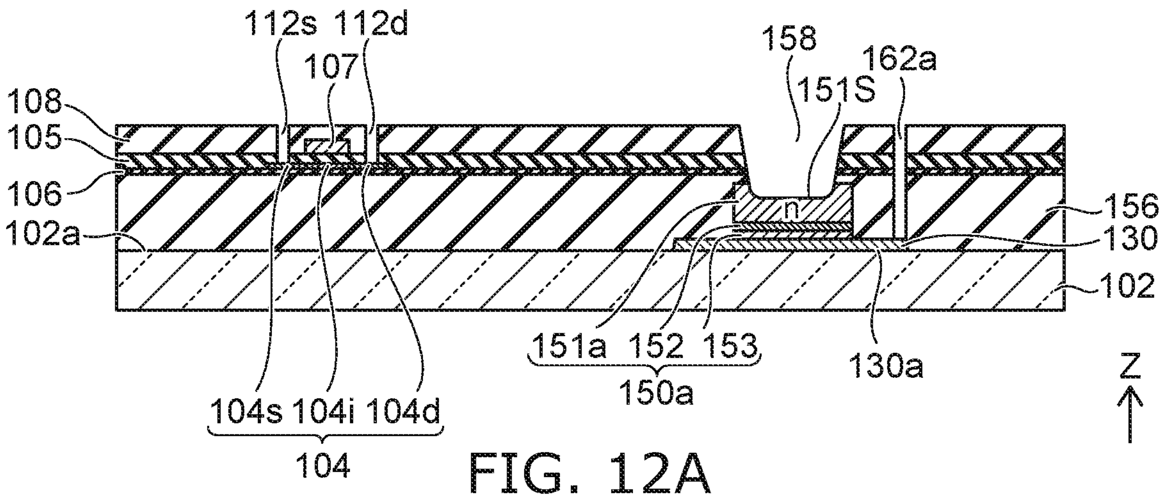
FIG. 12A is a schematic cross-sectional view illustrating a production method for an image display device of a modification of the first embodiment.
Figure 12B:
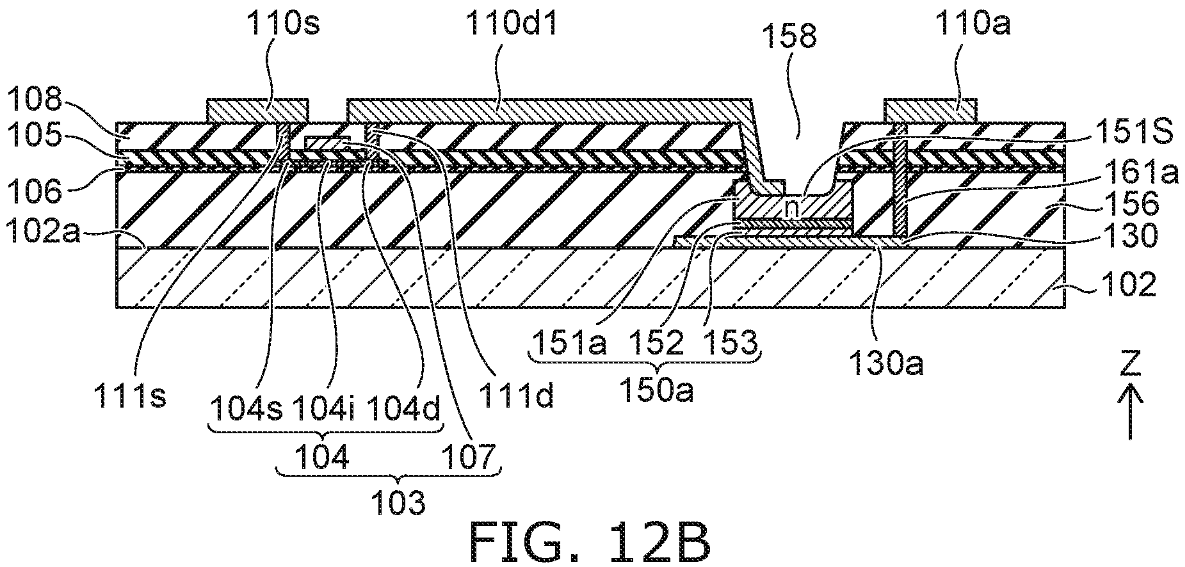
FIG. 12B is a schematic cross-sectional view illustrating the production method for the image display device of the modification of the first embodiment.

FIGS. 12A and 12B are schematic cross-sectional views illustrating a production method for an image display device of a modification of the embodiment.

FIGS. 12A and 12B show processes for forming the subpixel 20*a* shown in FIG. 2. The example includes the same processes as the processes described above up to the formation of the transistor 103 and the formation of the second inter-layer insulating film 108. In the following description, the processes of FIGS. 12A and 12B are performed in the process of FIG. 10B and subsequent processes.

As shown in FIG. 12A, the via holes 162*a*, 112*d*, and 112*s* are formed similarly to FIG. 11A. The opening 158 is formed to reach an n-type semiconductor layer 151*a*. In the example, the etching process for roughening can be omitted because the n-type semiconductor layer 151*a* is not roughened.

As shown in FIG. 12B, the vias 161*a*, 111*d*, and 111*s* are formed by filling a conductive material into the via holes 162*a*, 112*d*, and 112*s* shown in FIG. 12A. Subsequently, the wiring layer 110 is formed, and the wiring portions 110*a*, 110*d*1, and 110*s* are formed. Here, one end of the wiring portion 110*d*1 is connected with the via 111*d*. The wiring portion 110*d*1 is provided to extend to the light-emitting surface 151S from a position connected with the via 111*d*. Another end of the wiring portion 110*d*1 is connected to the surface including the light-emitting surface 151S. That is, the wiring portion 110*d*1 is directly connected to the n-type semiconductor layer 151.

Thus, the subpixel 20*a* of the modification is formed.

For example, the circuit of FIG. 3 is a drive circuit driving the light-emitting element 150 by the select transistor 24, the drive transistor 26, and the capacitor 28. Such a drive circuit is formed in the subpixels 20 and 20*a*. A portion of the circuit other than the drive circuit is formed, for example, in the peripheral edge part of the display region 2 shown in FIG. 1 outside the subpixels 20 and 20*a*. For example, the row selection circuit 5 shown in FIG. 3 is formed simultaneously with the drive transistors, the select transistors, etc., and is formed in the peripheral edge part of the display region 2. That is, the row selection circuit 5 can be simultaneously embedded by the manufacturing processes described above.

It is desirable for the signal voltage output circuit 7 to be embedded in a semiconductor device that is manufactured by manufacturing processes in which higher integration by fine patterning is possible. For example, the signal voltage output circuit 7 is mounted to another substrate together with a CPU and/or other circuit components, and is connected to the subpixels 20 and 20*a* via, for example, connectors and the like located in the peripheral edge part of the display region before embedding the color filter described below or after embedding the color filter.

In the image display device 1 of the embodiment, an image can be generated in the display region 2 by each light-emitting element 150 radiating light upward from the light-emitting surface 153S. However, when light is scattered lower than the light-emitting surface 153S, the luminous efficiency is substantially reduced because the substrate 102 is transmissive. Therefore, for example, by providing a light-reflecting film, a light-reflecting plate, etc., at the side of the surface of the substrate 102 opposite to the first surface 102*a*, the scattering of the light in the substrate 102 direction can be reflected in the direction of the light-emitting surface 153S. Such a light-reflecting film or the like may be included in the substrate 102 or may be provided inside a case, a frame, or the like that fixes the image display device 1.

Figure 13:
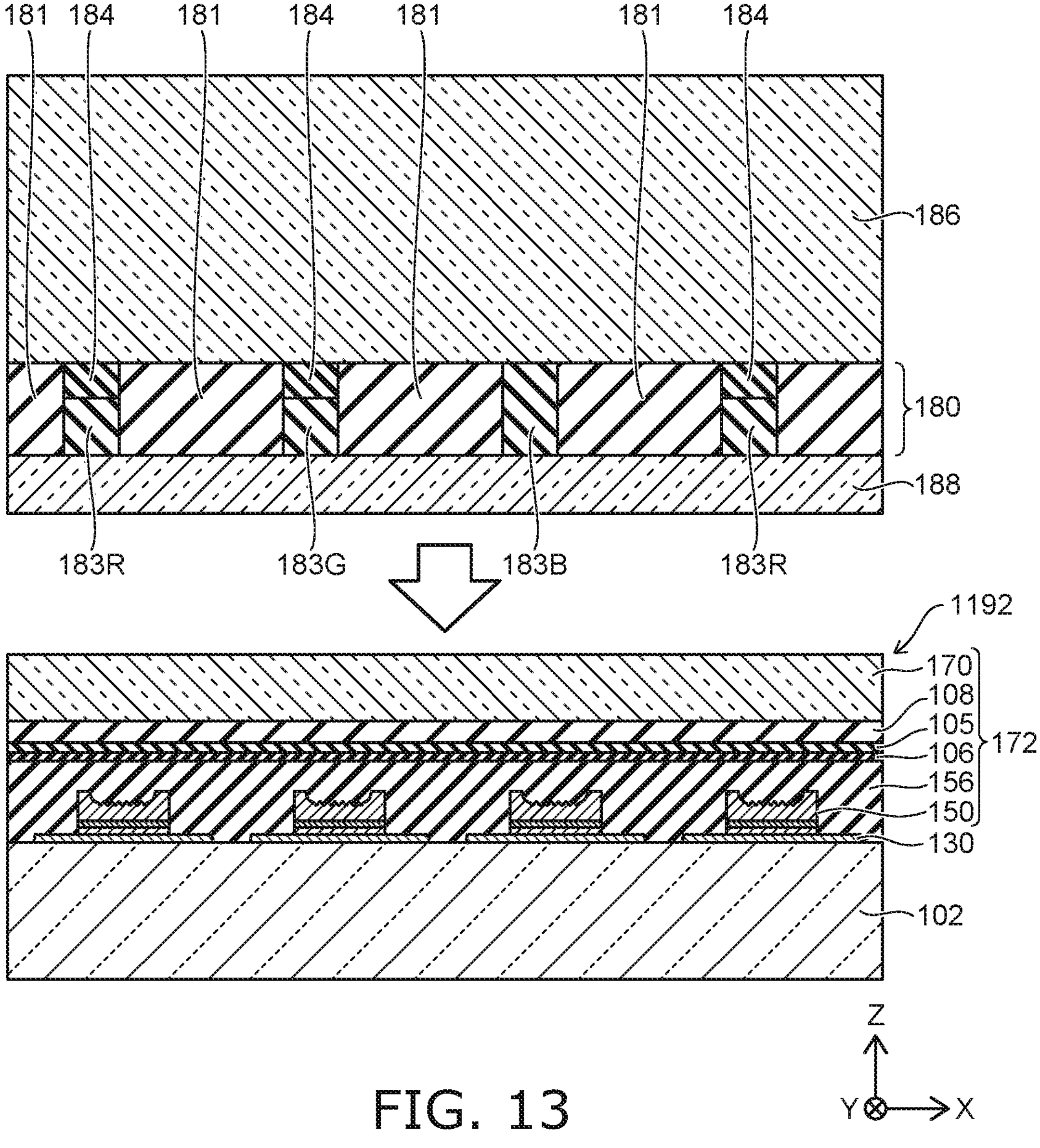
FIG. 13 is a schematic cross-sectional view illustrating the production method for the image display device of the first embodiment.

FIG. 13 is a schematic cross-sectional view illustrating the production method for the image display device of the embodiment.

In FIG. 13, the diagram above the arrow shows a configuration including the color filter 180, and the diagram below the arrow shows a structural component including the light-emitting element 150, etc., formed in the processes described above. The arrow of FIG. 13 shows the process of bonding the color filter to the structural component including the light-emitting element 150, etc.

To avoid complexity in FIG. 13, the components other than the illustrated components on the substrate 102 are not illustrated. The components that are not illustrated are the TFT channel 104, the circuit 101 including the wiring layer 110, etc., and the via 161*a* shown in FIG. 1. Also, a portion of the color conversion members such as the color filter 180, etc., is displayed in FIG. 13. In the description related to FIG. 13 and FIGS. 14A to 14D, the structural component that includes the light-emitting element 150, the first inter-layer insulating film 156, the TFT underlying film 106, the insulating layer 105, the second inter-layer insulating film 108, and the surface resin layer 170 is called a light-emitting circuit part 172. The structural component that includes the substrate 102, the conductive layer 130, the light-emitting circuit part 172, and the components that are not illustrated is called a structure body 1192. In FIG. 13, the TFT channel 104, the gate 107, the vias 111*s* and 111*d*, and the wiring layer 110 in the circuit 101 shown in FIG. 1 are not illustrated.

As shown in FIG. 13, the color filter 180 (the wavelength conversion member) is bonded to the structure body 1192 at one surface. The other surface of the color filter 180 is bonded to a glass substrate 186. The transparent thin film adhesive layer 188 is located at one surface of the color filter 180, and bonding to the exposed surface of the surface resin layer 170 of the structure body 1192 is performed via the transparent thin film adhesive layer 188.

In the color filter 180 of the example, color conversion parts are arranged in the positive direction of the X-axis in the order of red, green, and blue. For red, a red color conversion layer 183R is located in the first layer; for green, a green color conversion layer 183G is located in the first layer. The filter layer 184 is located in the second layer for both red and green. For blue, a single-layer color conversion layer 183B may be provided, and the filter layer 184 may be provided. Although the light-shielding part 181 is located between the color conversion parts, it goes without saying that the frequency characteristics of the filter layer 184 can be modified for each color of the color conversion parts.

The color filter 180 is adhered to the structure body 1192 so that the positions of the color conversion layers 183R, 183G, and 183B of each color match the positions of the light-emitting elements 150.

FIGS. 14A to 14D are schematic cross-sectional views showing a modification of the production method for the image display device of the embodiment.

FIGS. 14A to 14D show a method of using an inkjet method to form the color filter.

Figure 14A:
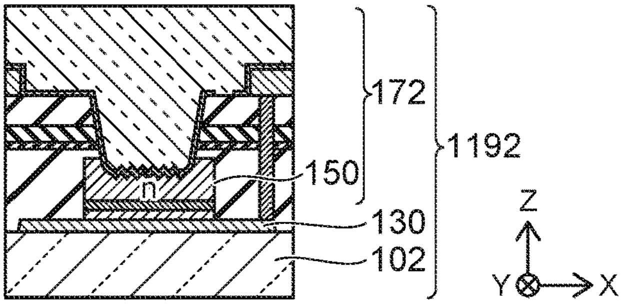
FIG. 14A is a schematic cross-sectional view illustrating the production method for the image display device of the first embodiment.

As shown in FIG. 14A, the structure body 1192 in which the components such as the light-emitting element 150, etc., are formed on the substrate 102 is prepared.

Figure 14B:
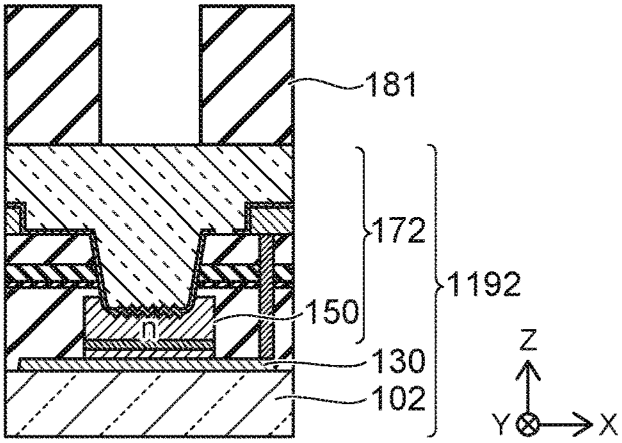
FIG. 14B is a schematic cross-sectional view illustrating the production method for the image display device of the first embodiment.

As shown in FIG. 14B, the light-shielding part 181 is formed on the structure body 1192. For example, the light-shielding part 181 is formed using screen printing, photolithography technology, etc.

Figure 14C:
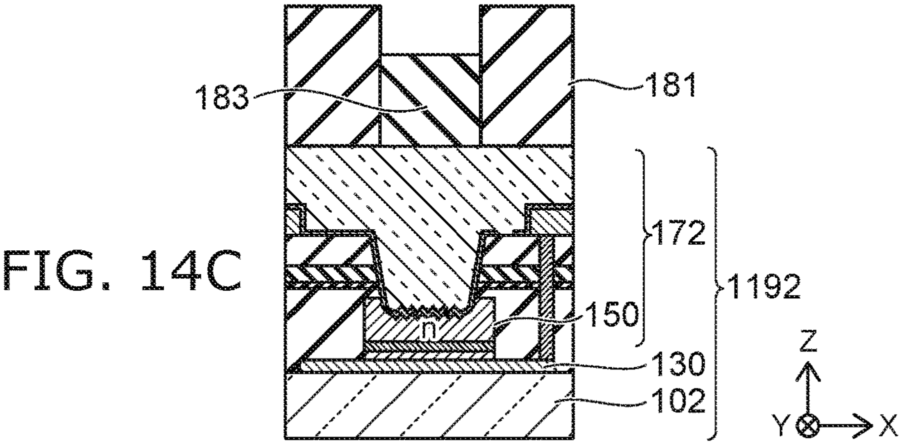
FIG. 14C is a schematic cross-sectional view illustrating the production method for the image display device of the first embodiment.

As shown in FIG. 14C, the color conversion layer 183 is formed by dispensing a fluorescer that corresponds to the light emission color from an inkjet nozzle. The fluorescer colors the region in which the light-shielding part 181 is not formed. The fluorescer includes, for example, a fluorescent coating that uses a general fluorescer material, a perovskite fluorescer material, or a quantum dot fluorescer material. It is favorable to use a perovskite fluorescer material or a quantum dot fluorescer material because the light emission colors can be realized with high monochromaticity and high color reproducibility. After printing with the inkjet nozzle, drying processing is performed using an appropriate temperature and time. The thickness of the coating when coloring is set to be less than the thickness of the light-shielding part 181.

As described above, the color conversion layer 183 is not formed in the subpixel of blue light emission when the color conversion part is not formed. Also, when a blue color conversion layer is formed in the subpixel of blue light emission, and when the color conversion part may have one layer, it is favorable for the thickness of the coating of the blue fluorescer to be about equal to the thickness of the light-shielding part 181.

Figure 14D:
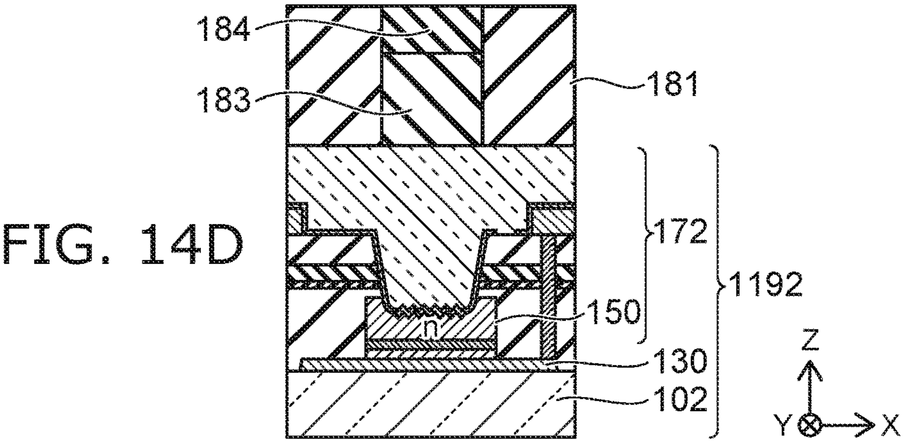
FIG. 14D is a schematic cross-sectional view illustrating the production method for the image display device of the first embodiment.

As shown in FIG. 14D, the coating for the filter layer 184 is dispensed from the inkjet nozzle. The coating is applied to overlap the coating of the fluorescer. The total thickness of the coating of the fluorescer and the coating is set to be about equal to the thickness of the light-shielding part 181.

It is desirable to make the color conversion layer 183 as thick as possible to increase the color conversion efficiency for both a film-type color filter and an inkjet-type color filter. On the other hand, when the color conversion layer 183 is too thick, the emitted light of the color-converted light approximates Lambertian, but the blue light that is not color-converted has an emission angle limited by the light-shielding part 181. Therefore, a problem undesirably occurs in that the display color of the display image has viewing angle dependence. To match the light distribution of the blue light that is not color-converted and the light distribution of the light of the subpixels in which the color conversion layer 183 is provided, it is desirable to set the thickness of the color conversion layer 183 to be about half of the opening size of the light-shielding part 181.

For example, in the case of a high-definition image display device of about 250 ppi (pitch per inch), the pitch of the subpixels 20 is about 30 μm, and so it is desirable for the thickness of the color conversion layer 183 to be about 15 μm. Here, when the color conversion material is made of spherical fluorescer particles, it is favorable to stack in a close-packed structure to suppress light leakage from the light-emitting element 150. It is therefore necessary to use at least three layers of particles. Accordingly, it is favorable for the particle size of the fluorescer material included in the color conversion layer 183 to be, for example, not more than about 5 μm, and more favorably not more than about 3 μm.

Figure 15:
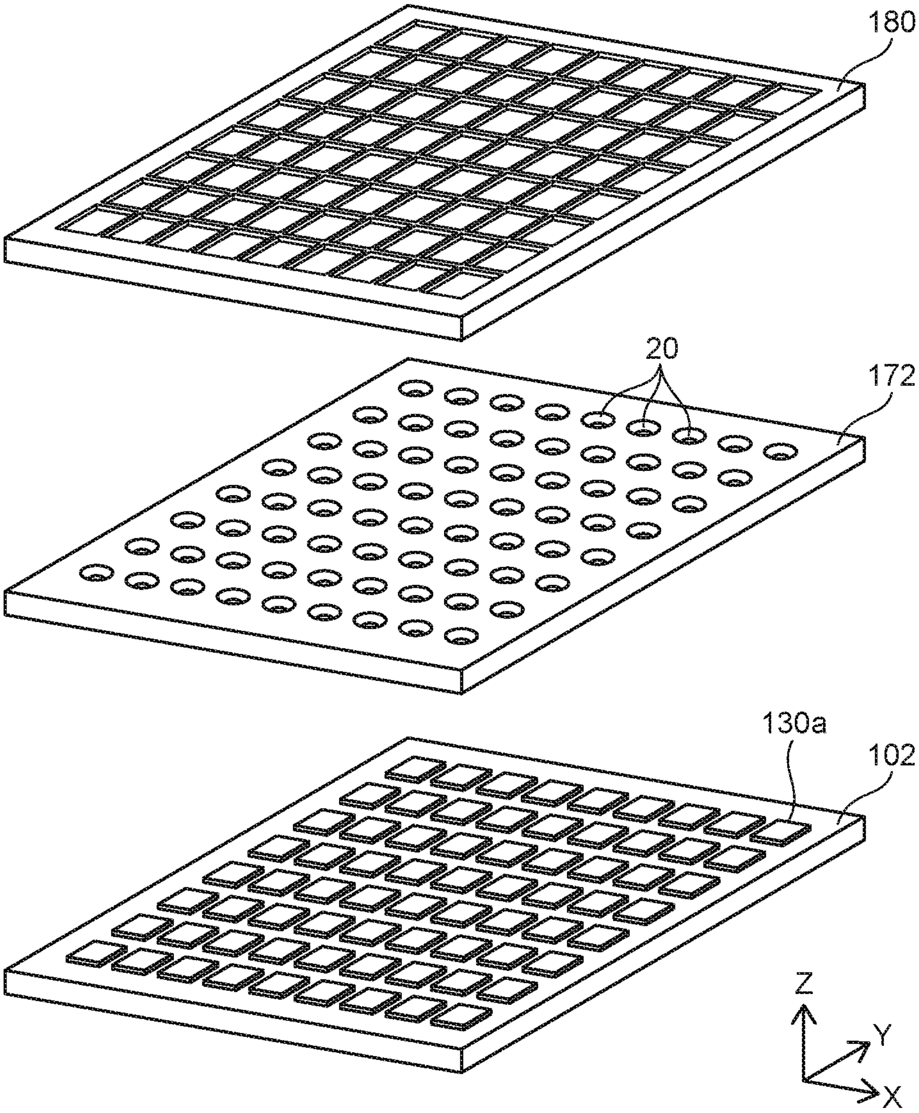
FIG. 15 is a schematic perspective view illustrating the image display device according to the first embodiment.

FIG. 15 is a schematic perspective view illustrating the image display device according to the embodiment.

In the image display device of the embodiment as shown in FIG. 15, the light-emitting circuit part 172 that includes many subpixels 20 is located on the substrate 102. The conductive layer 130 shown in FIG. 13 includes the connection plate 130*a*. The connection plate 130*a* is located in each of the subpixels 20 on the substrate 102. The color filter 180 is located on the light-emitting circuit part 172. The other embodiments and their modifications described below also have configurations similar to that shown in FIG. 15.

Effects of the image display device 1 of the embodiment will now be described.

According to the production method for the image display device 1 of the embodiment, the light-emitting element 150 is formed by etching the semiconductor layer 1150 after bonding the semiconductor layer 1150 to the substrate 102. Subsequently, the light-emitting element 150 is covered with the first inter-layer insulating film 156, and the circuit 101 that includes circuit elements such as the transistor 103 driving the light-emitting element 150, etc., is made on the first inter-layer insulating film 156. Therefore, the manufacturing processes are markedly reduced compared to when singulated light-emitting elements are individually transferred to the substrate 102.

For example, in an image display device having 4K image quality, the number of subpixels is greater than 24 million, and in the case of an image display device having 8K image quality, the number of subpixels is greater than 99 million. When individually forming and mounting such a large quantity of light-emitting elements to a circuit board, an enormous amount of time is necessary. It is therefore difficult to realize an image display device that uses micro LEDs at a realistic cost. Also, when individually mounting a large quantity of light-emitting elements, the yield decreases due to connection defects when mounting, etc., and an even higher cost is unavoidable; however, the production method for the image display device of the embodiment obtains the following effects.

As described above, according to the production method for the image display device 1 of the embodiment, the transfer process is completed in one process because the light-emitting elements are formed by etching after bonding the entire semiconductor layer 1150 to the substrate 102. Therefore, according to the production method for the image display device 1 of the embodiment, the time of the transfer process of a conventional production method for having the same number of transfers as the number of light-emitting elements corresponding to the number of pixels can be reduced, and the number of processes can be reduced.

Furthermore, the semiconductor layer 1150 is bonded to the substrate 102 at the wafer level without pre-singulation or forming electrodes at positions corresponding to the circuit elements. Therefore, alignment is unnecessary at the bonding stage. Accordingly, the bonding process can be easily performed in a short period of time. Because alignment is unnecessary when bonding, it is also easy to downsize the light-emitting element 150, which is favorable for a higher definition display.

According to the embodiment, for example, a glass substrate formed as described above can be covered with an inter-layer insulating film, and drive circuits, scanning circuits, etc., that include TFTs, etc., can be formed on the planarized surface by using a LTPS process, etc. Therefore, an advantage is provided in that existing flat panel display manufacturing processes and plants can be utilized.

According to the embodiment, the light-emitting element 150 that is formed in a lower layer than the transistor 103, etc., can be electrically connected to power supply lines, ground lines, drive transistors, etc., formed in the upper layer by forming vias extending through the first inter-layer insulating film 156, the TFT underlying film 106, the insulating layer 105, and the second inter-layer insulating film 108. Thus, a uniform connection structure can be easily realized by using technically-established multilayer wiring technology, and the yield can be increased. Accordingly, the reduction of the yield due to connection defects of the light-emitting elements, etc., is suppressed.

According to the embodiment, the conductive layer 130 is formed on the first surface 102*a* of the substrate 102. The conductive layer 130 includes the connection plate 130*a*. The light-emitting element 150 is formed on the connection plate 130*a* and electrically connected to the connection plate 130*a* at the bottom surface 153B. The connection plate 130*a* is formed of a material having high conductivity such as a metal material, etc. Therefore, the p-type semiconductor layer 153 of the light-emitting element 150 can be electrically connected with another circuit with low resistance.

Also, the p-type semiconductor layer 153 of the lower layer is connected to the connection plate 130*a* having a high conductivity at the bottom surface 153B; it is therefore unnecessary to form a connection part in the lateral direction, and the thickness of the entire light-emitting element 150 can be reduced. Accordingly, the thickness of the first inter-layer insulating film 156 also can be reduced, and the via 161*a* can have a shallow depth and a small diameter. Therefore, the patterning precision of the via hole for forming the via 161*a* can be substantially increased.

The surface of the connection plate 130*a* can be formed of a material having high light reflectivity such as Ag, etc. The outer perimeter of the connection plate 130*a* is formed to include the outer perimeter of the light-emitting element 150 when the light-emitting element 150 is projected when viewed in plan. Therefore, the connection plate 130*a* also can function as a light-reflecting plate, reflect the downward-scattered light of the light-emitting element 150, etc., toward the light-emitting surface 151S, and substantially improve the luminous efficiency of the light-emitting element 150.

Second Embodiment

Figure 16:
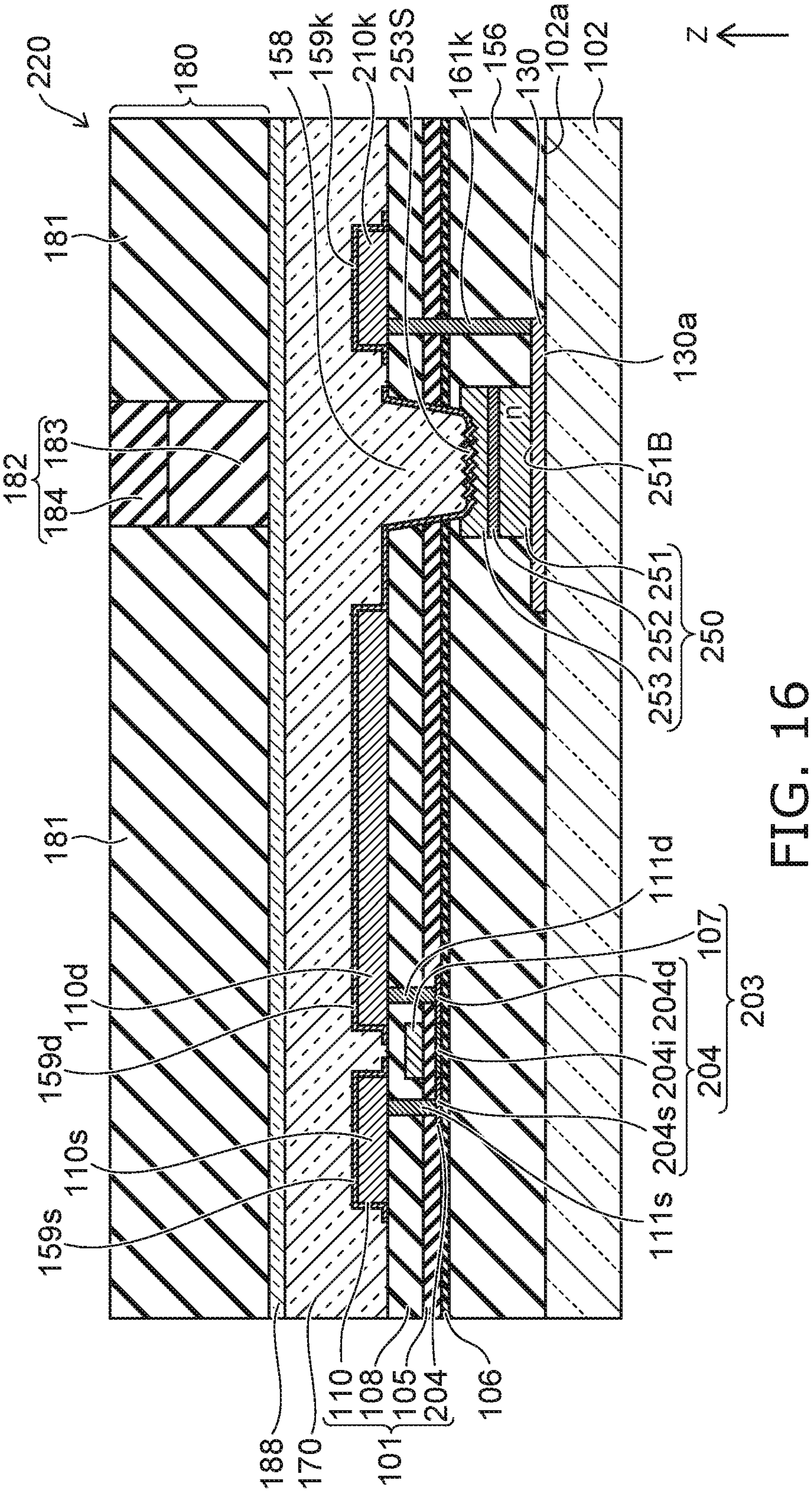
FIG. 16 is a schematic cross-sectional view illustrating a portion of an image display device according to a second embodiment.

FIG. 16 is a schematic cross-sectional view illustrating a portion of an image display device according to the embodiment.

The embodiment differs from the other embodiments described above in that a p-type semiconductor layer 253 provides a light-emitting surface 253S, and the configuration of a transistor 203 is different. The same components as the other embodiments are marked with the same reference numerals, and a detailed description is omitted as appropriate.

As shown in FIG. 16, a subpixel 220 of the image display device of the embodiment includes the substrate 102, the conductive layer 130, a light-emitting element 250, the first inter-layer insulating film 156, the transistor 203, the second inter-layer insulating film 108, and the wiring layer 110.

The light-emitting element 250 is located on the connection plate 130*a*. The outer perimeter of the connection plate 130*a* is set to include the outer perimeter of the light-emitting element 250 when the light-emitting element 250 is projected when viewed in plan. Therefore, similarly to the other embodiments described above, the downward-scattered light of the light-emitting element 250, etc., can be reflected toward the light-emitting surface 253S side, and the luminous efficiency of the light-emitting element 250 is substantially improved.

The light-emitting element 250 includes the light-emitting surface 253S. Similarly to the other embodiments described above, the light-emitting element 250 is a prismatic or cylindrical element that includes a bottom surface 2518 on the connection plate 130*a*. The light-emitting surface 253S is the surface opposite to the bottom surface 2518. The bottom surface 2518 is connected to the connection plate 130*a*.

The light-emitting element 250 includes an n-type semiconductor layer 251, a light-emitting layer 252, and the p-type semiconductor layer 253. The n-type semiconductor layer 251, the light-emitting layer 252, and the p-type semiconductor layer 253 are stacked in this order from the bottom surface 2518 toward the light-emitting surface 253S. According to the embodiment, the light-emitting surface 253S is provided by the p-type semiconductor layer 253.

The light-emitting element 250 has a shape similar to that of the light-emitting element 150 shown in FIG. 1 when projected onto the XY plane. An appropriate shape is selected according to the layout of the circuit elements, etc.

The light-emitting element 250 is a light-emitting diode similar to the light-emitting element 150 of the other embodiments described above. Namely, the wavelength of the light emitted by the light-emitting element 250 is, for example, blue light emission of about 467 nm±20 nm or bluish-violet light emission of about 410 nm±20 nm. The wavelength of the light emitted by the light-emitting element 250 is not limited to the values described above and can be an appropriate value.

The transistor 203 is located on the TFT underlying film 106. The transistor 203 is a p-channel TFT. The transistor 203 includes the TFT channel 204 and the gate 107. Favorably, similarly to the other embodiments described above, the transistor 203 is formed by a LTPS process, etc. According to the embodiment, the circuit 101 includes the TFT channel 204, the insulating layer 105, the second inter-layer insulating film 108, the vias 111*s* and 111*d*, and the wiring layer 110.

The TFT channel 204 includes regions 204*s*, 204*i*, and 204*d*. The regions 204*s*, 204*i*, and 204*d* are located on the TFT underlying film 106. The regions 204*s* and 204*d* are doped with a p-type impurity such as boron (B), etc. The region 204*s* has an ohmic connection with the via 111*s*. The region 204*d* has an ohmic connection with the via 111*d*.

The gate 107 is located on the TFT channel 204 with the insulating layer 105 interposed. The insulating layer 105 insulates the TFT channel 204 and the gate 107.

In the transistor 203, a channel is formed in the region 204*i* when a lower voltage than that of the region 204*s* is applied to the gate 107. The current that flows between the regions 204*s* and 204*d* is controlled by the voltage of the gate 107 with respect to the region 204*s*. The TFT channel 204 and the gate 107 are formed using materials and formation methods similar to those of the other embodiments described above.

The wiring layer 110 includes the wiring portions 110*s*, 110*d*, and 210*k*. The wiring portions 110*s* and 110*d* are the same as those of the first embodiment. A portion of the wiring portion 210*k* is located above the connection plate 130*a*. For example, another part of the wiring portion 210*k* extends to the ground line 4 shown in FIG. 17 below and is connected to the ground line 4.

The vias 111*s* and 111*d* are provided to extend through the second inter-layer insulating film 108. The via 111*s* is located between the wiring portion 110*s* and the region 204*s*. The via 111*s* electrically connects the wiring portion 110*s* and the region 204*s*. The via 111*d* is located between the wiring portion 110*d* and the region 204*d*. The via 111*d* electrically connects the wiring portion 110*d* and the region 204*d*. The vias 111*s* and 111*d* are formed using materials and formation methods similar to those of the other embodiments described above.

A via 161*k* is provided to extend through the second inter-layer insulating film 108, the insulating layer 105, the TFT underlying film 106, and the first inter-layer insulating film 156. The via 161*k* is located between the wiring portion 210*k* and the connection plate 130*a* and electrically connects the wiring portion 210*k* and the connection plate 130*a*.

For example, the wiring portion 110*s* is electrically connected to the power supply line 3 shown in FIG. 17 below. The wiring portion 110*d* is electrically connected to the p-type semiconductor layer 253 via the light-transmitting electrode 159*d*.

According to the embodiment, the light-transmitting electrode 159*d* is provided over the roughened light-emitting surface 253S of the p-type semiconductor layer 253. The light-transmitting electrode 159*d* is provided over the wiring portion 110*d*. The light-transmitting electrode 159*d* also is located between the light-emitting surface 253S and the wiring portion 110*d* and electrically connects the p-type semiconductor layer 253 and the wiring portion 110*d*. According to the modification of the first embodiment described above, as in the example shown in FIG. 2, the wiring portion 110*d*1 may be extended to be directly connected to the p-type semiconductor layer 253.

Figure 17:
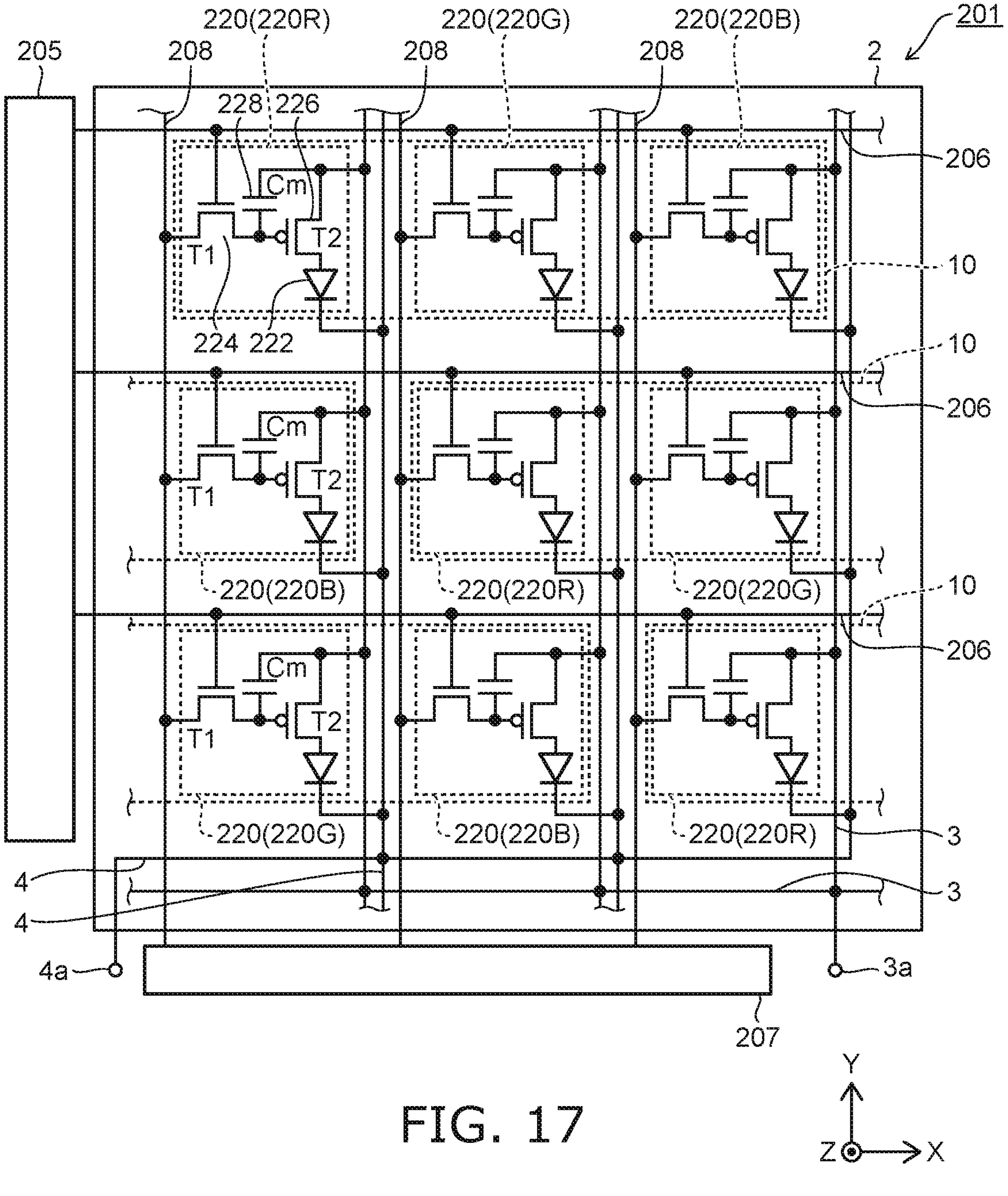
FIG. 17 is a schematic block diagram illustrating the image display device of the second embodiment.

FIG. 17 is a schematic block diagram illustrating the image display device according to the embodiment.

As shown in FIG. 17, the image display device 201 of the embodiment includes the display region 2, a row selection circuit 205, and a signal voltage output circuit 207. In the display region 2, similarly to the other embodiments described above, for example, the subpixels 220 are arranged in a lattice shape in the XY plane.

Similarly to the other embodiments described above, the pixel 10 includes multiple subpixels 220 that emit light of different colors. A subpixel 220R emits red light. A subpixel 220G emits green light. A subpixel 2208 emits blue light. The light emission color and luminance of one pixel 10 are determined by the three types of the subpixels 220R, 220G, and 2208 emitting light of the desired luminances.

One pixel 10 includes the three subpixels 220R, 220G, and 220B; for example, the subpixels 220R, 220G, and 2208 are arranged in a straight line along the X-axis as in the example. In the pixels 10, subpixels of the same color may be arranged in the same column, or subpixels of different colors may be arranged in each column as in the example.

The subpixel 220 includes a light-emitting element 222, a select transistor 224, a drive transistor 226, and a capacitor 228. In FIG. 15, the select transistor 224 may be displayed as T1, the drive transistor 226 may be displayed as T2, and the capacitor 228 may be displayed as Cm.

According to the embodiment, the light-emitting element 222 is located at the ground line 4 side, and the drive transistor 226 that is connected in series to the light-emitting element 222 is located at the power supply line 3 side. That is, the drive transistor 226 is connected to a lower potential side than the light-emitting element 222. The drive transistor 226 is a p-channel transistor.

The select transistor 224 is connected between a signal line 208 and the gate electrode of the drive transistor 226. The capacitor 228 is connected between the power supply line 3 and the gate electrode of the drive transistor 226.

To drive the drive transistor 226 that is a p-channel transistor, the row selection circuit 205 and the signal voltage output circuit 207 supply a signal voltage that has a different polarity from that of the other embodiments described above to the signal line 208.

According to the embodiment, because the polarity of the drive transistor 226 is a p-channel, the polarity of the signal voltage and the like are different from those of the other embodiments described above. Namely, the row selection circuit 205 supplies a select signal to a scanning line 206 to sequentially select one row from the arrangement of the m rows of the subpixels 220. The signal voltage output circuit 207 supplies a signal voltage having an analog voltage value necessary for each subpixel 220 of the selected row. The drive transistors 226 of the subpixels 220 of the selected row cause currents corresponding to the signal voltages to flow in the light-emitting elements 222. The light-emitting elements 222 emit light of luminances corresponding to the currents that flow.

A production method for the image display device of the embodiment will now be described.

FIGS. 18A to 21B are schematic cross-sectional views illustrating the production method for the image display device of the embodiment.

In the example, the semiconductor growth substrate 1194*a* described with reference to FIG. 7A of the other embodiment described above is used. In the following description, the process of FIG. 18A and subsequent processes are applied to the process of preparing the semiconductor growth substrate 1194*a* shown in FIG. 7A and subsequent processes.

Figure 18A:
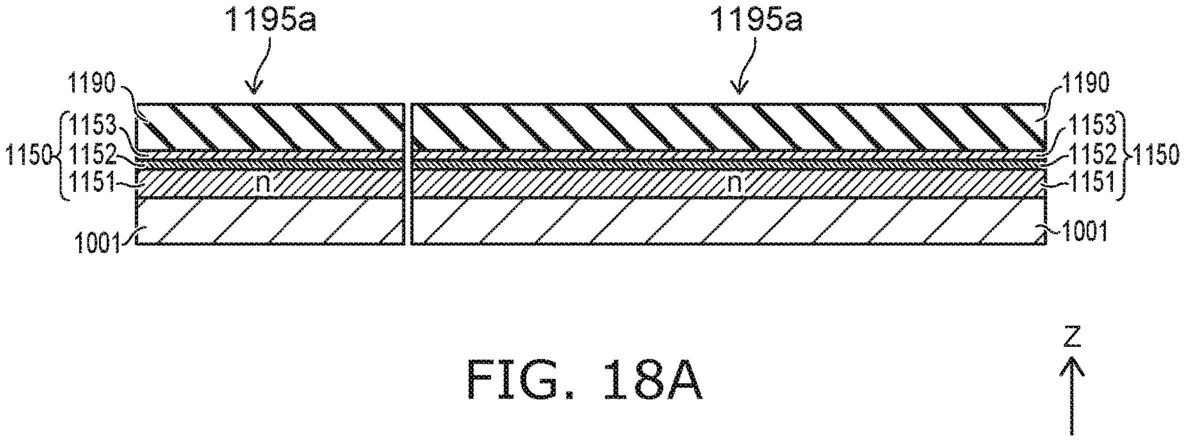
FIG. 18A is a schematic cross-sectional view illustrating a production method for the image display device of the second embodiment.

According to the production method for the image display device of the embodiment as shown in FIG. 18A, the multiple semiconductor growth substrates 1194*a* shown in FIG. 7A are prepared, and a substrate 1195*a* is formed by bonding the support substrate 1190 to the exposed surface of the p-type semiconductor layer 1153.

Figure 18B:
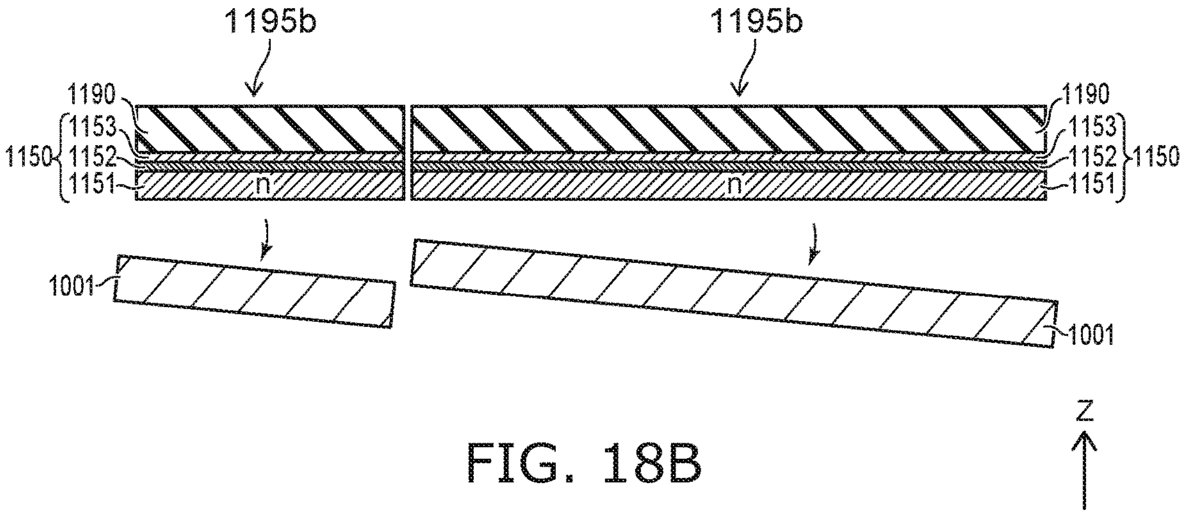
FIG. 18B is a schematic cross-sectional view illustrating the production method for the image display device of the second embodiment.

As shown in FIG. 18B, a substrate 1195*b* is formed by removing the crystal growth substrate 1001 shown in FIG. 18A from the substrate 1195*a* by wet etching, laser lift-off, etc.

Figure 18C:
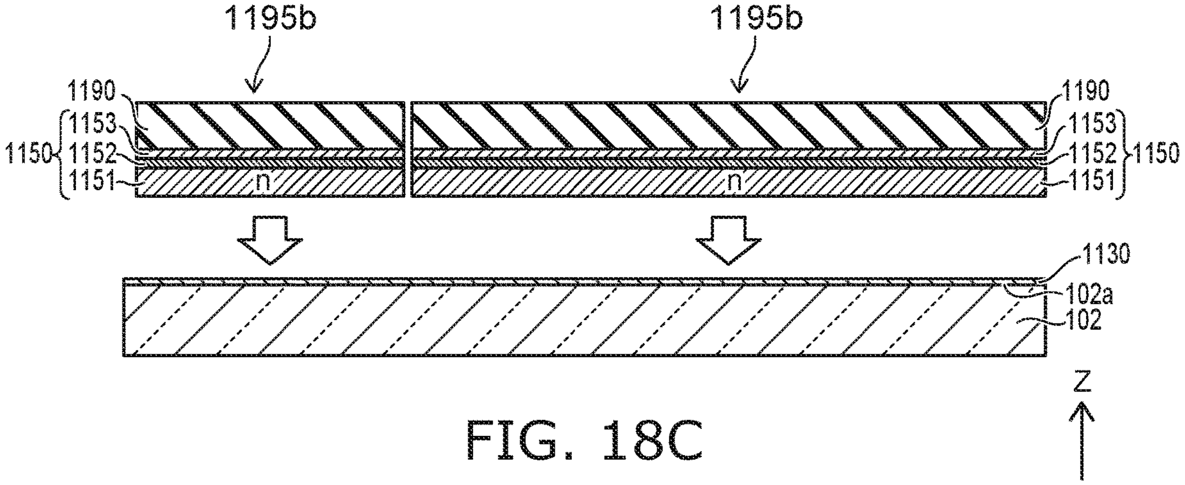
FIG. 18C is a schematic cross-sectional view illustrating the production method for the image display device of the second embodiment.

As shown in FIG. 18C, the substrate 102 in which the metal layer 1130 is formed on the first surface 102*a* is prepared. For example, the multiple substrates 1195*b* are arranged in a lattice shape, and the exposed surfaces of the n-type semiconductor layers 1151 are positioned to face the exposed surface of the metal layer 1130. The exposed surfaces of the n-type semiconductor layers 1151 are bonded to the substrate 102 via the metal layer 1130.

The configurations and their modifications described as the production method according to the first embodiment are applicable to the process of bonding the semiconductor layer 1150 and the substrate 102 via the metal layer 1130. For example, a semiconductor growth substrate in which the semiconductor layer 1150 is grown on the crystal growth substrate 1001 via a buffer layer may be used. In such a case, it is necessary to remove the buffer layer before the bonding to the metal layer 1130. Also, the growth may be performed on the crystal growth substrate 1001 from the p-type semiconductor layer, and the exposed surface of the n-type semiconductor layer 1151 may be bonded to a metal layer without transferring to a support substrate. Also, similarly to the other embodiments described above, a metal layer may be formed on the exposed surface of the n-type semiconductor layer 1151 of the substrate 1195*b* as well, and the metal layers may be bonded to each other.

Figure 19A:
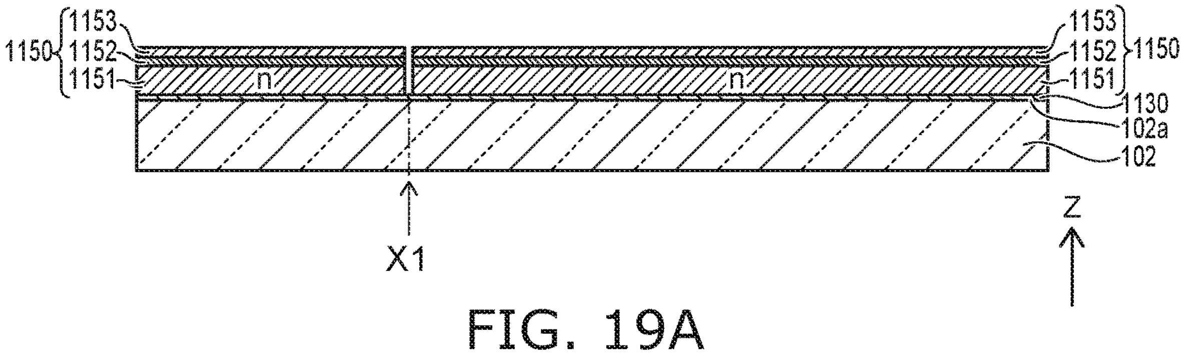
FIG. 19A is a schematic cross-sectional view illustrating the production method for the image display device of the second embodiment.

As shown in FIG. 19A, the support substrate 1190 shown in FIG. 18B is removed by wet etching, etc. The position X1 is the position at which the edge portions of the multiple bonded semiconductor layers 1150 are located.

Figure 19B:
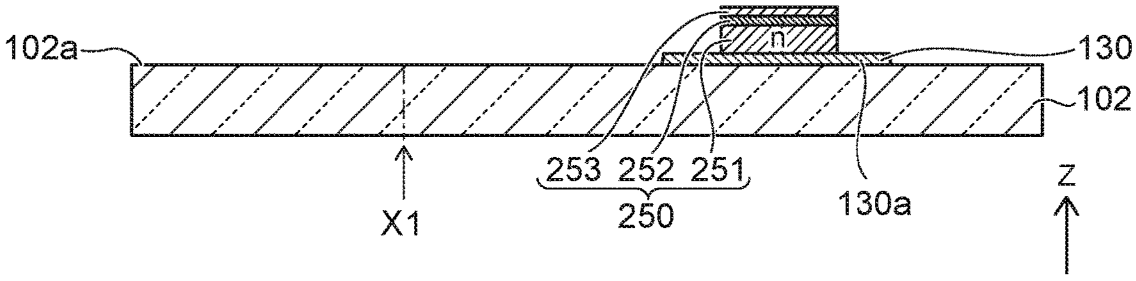
FIG. 19B is a schematic cross-sectional view illustrating the production method for the image display device of the second embodiment.

As shown in FIG. 19B, the light-emitting element 250 is formed by shaping the semiconductor layer 1150 shown in FIG. 19A in the desired shape by etching. For example, a dry etching process is used to form the light-emitting element 250, and RIE is favorably used.

After the formation of the light-emitting element 250, the conductive layer 130 is formed by etching the metal layer 1130 shown in FIG. 19A. By the etching of the metal layer 1130, the connection plate 130*a* that forms the conductive layer 130 is formed under the light-emitting element 250.

Figure 20A:
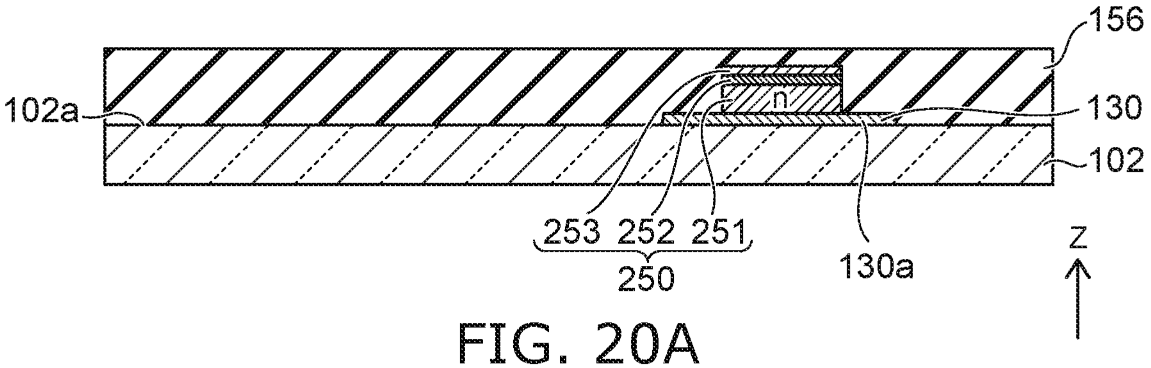
FIG. 20A is a schematic cross-sectional view illustrating the production method for the image display device of the second embodiment.

As shown in FIG. 20A, the first inter-layer insulating film 156 is formed to cover the first surface 102*a*, the conductive layer 130, the connection plate 130*a*, and the light-emitting element 250.

Figure 20B:
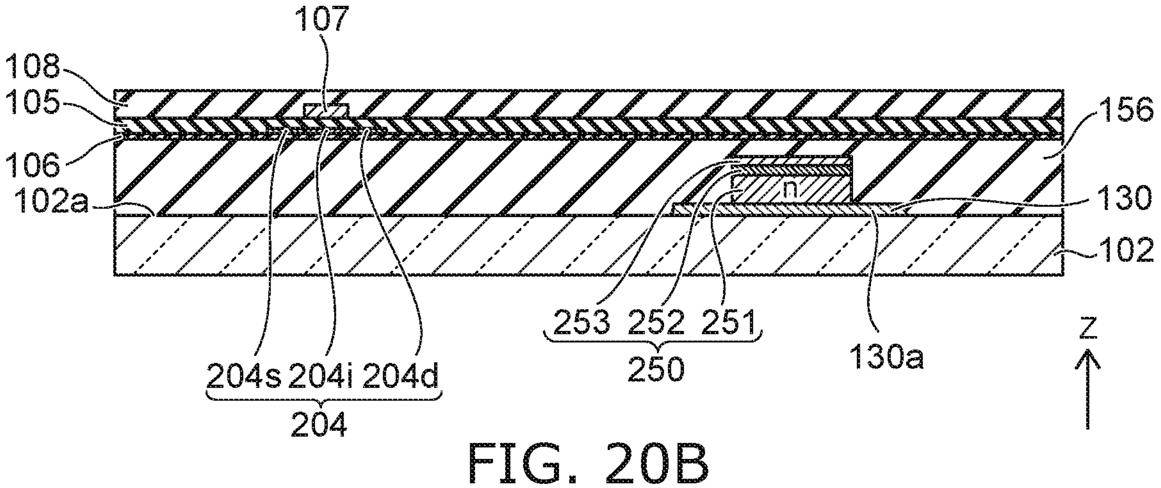
FIG. 20B is a schematic cross-sectional view illustrating the production method for the image display device of the second embodiment.

As shown in FIG. 20B, the TFT underlying film 106 is formed by CVD, etc., over the first inter-layer insulating film 156. The TFT channel 204 is formed on the planarized TFT underlying film 106. The insulating layer 105 that covers the TFT underlying film 106 and the TFT channel 204 is formed. The gate 107 is formed on the TFT channel 204 with the insulating layer 105 interposed. The second inter-layer insulating film 108 is formed to cover the insulating layer 105 and the gate 107.

Figure 21A:
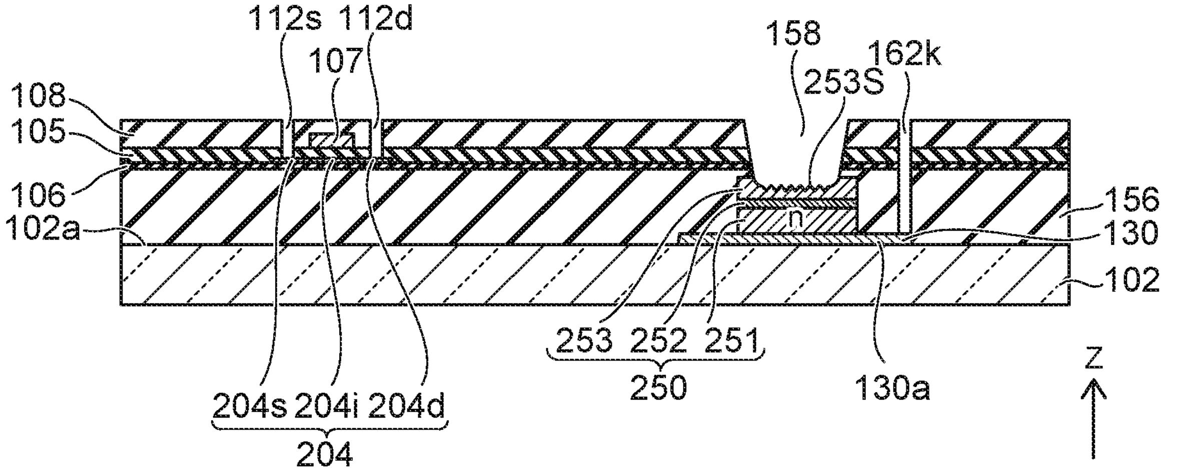
FIG. 21A is a schematic cross-sectional view illustrating the production method for the image display device of the second embodiment.

As shown in FIG. 21A, a via hole 162*k* extends through the second inter-layer insulating film 108, the insulating layer 105, the TFT underlying film 106, and the first inter-layer insulating film 156 and is formed to reach the connection plate 130*a*. The opening 158 is formed to reach the light-emitting surface 253S by removing the second inter-layer insulating film 108, the insulating layer 105, the TFT underlying film 106, and the first inter-layer insulating film 156 on the light-emitting surface 253S. The via hole 112*d* extends through the second inter-layer insulating film 108 and the insulating layer 105 and is formed to reach the region 204*d*. The via hole 112*s* extends through the second inter-layer insulating film 108 and the insulating layer 105 and is formed to reach the region 204*s*. For example, RIE or the like is used to form the via holes 162*k*, 112*d*, and 112*s* and the opening 158.

Figure 21B:
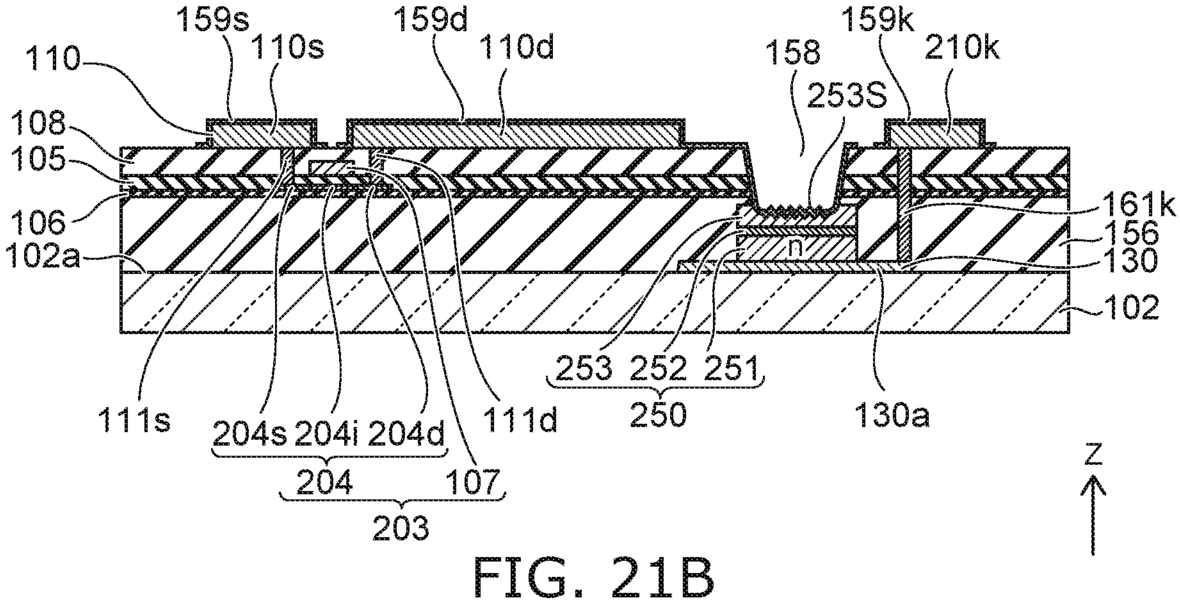
FIG. 21B is a schematic cross-sectional view illustrating the production method for the image display device of the second embodiment.

As shown in FIG. 21B, the via 161*k* is formed by filling a conductive material into the via hole 162*k* shown in FIG. 21A. The vias 111*d* and 111*s* also are formed by filling a conductive material respectively into the via holes 112*d* and 112*s* shown in FIG. 21A. Subsequently, the wiring layer 110 is formed, and the wiring portions 210*k*, 110*d*, and 110*s* are formed. The wiring layer 110 may be formed simultaneously with the formation of the vias 161*k*, 111*d*, and 111*s*.

A transmissive conductive film that covers the second inter-layer insulating film 108, the light-emitting surface 253S, and the wiring layer 110 is formed. The light-transmitting electrodes 159*d* and 159*s* are formed by performing photolithography of the conductive film that is formed.

The light-transmitting electrode 159*d* is formed over the light-emitting surface 253S and over the wiring portion 110*d*. The light-transmitting electrode 159*d* also is formed between the light-emitting surface 253S and the wiring portion 110*d* and electrically connects the light-emitting surface 253S and the wiring portion 110*d*. The light-transmitting electrode 159*s* is formed over the wiring portion 110*s*. A light-transmitting electrode 159*k* is formed over the wiring portion 210*k*. The light-transmitting electrodes 159*d*, 159*s*, and 159*k* are simultaneously formed.

Thereafter, the subpixel 220 of the image display device 201 of the embodiment is formed by providing the color filter 180 (the wavelength conversion member), etc.

Effects of the image display device of the embodiment will now be described.

In the image display device of the embodiment, similarly to the other embodiments described above, in addition to the effects of reducing the time of the transfer process for forming the light-emitting element 250 and reducing the number of processes, the light-emitting surface 253S can be of the p-type semiconductor layer 253 by setting the polarity of the TFT to a p-channel.

Third Embodiment

Figure 22:
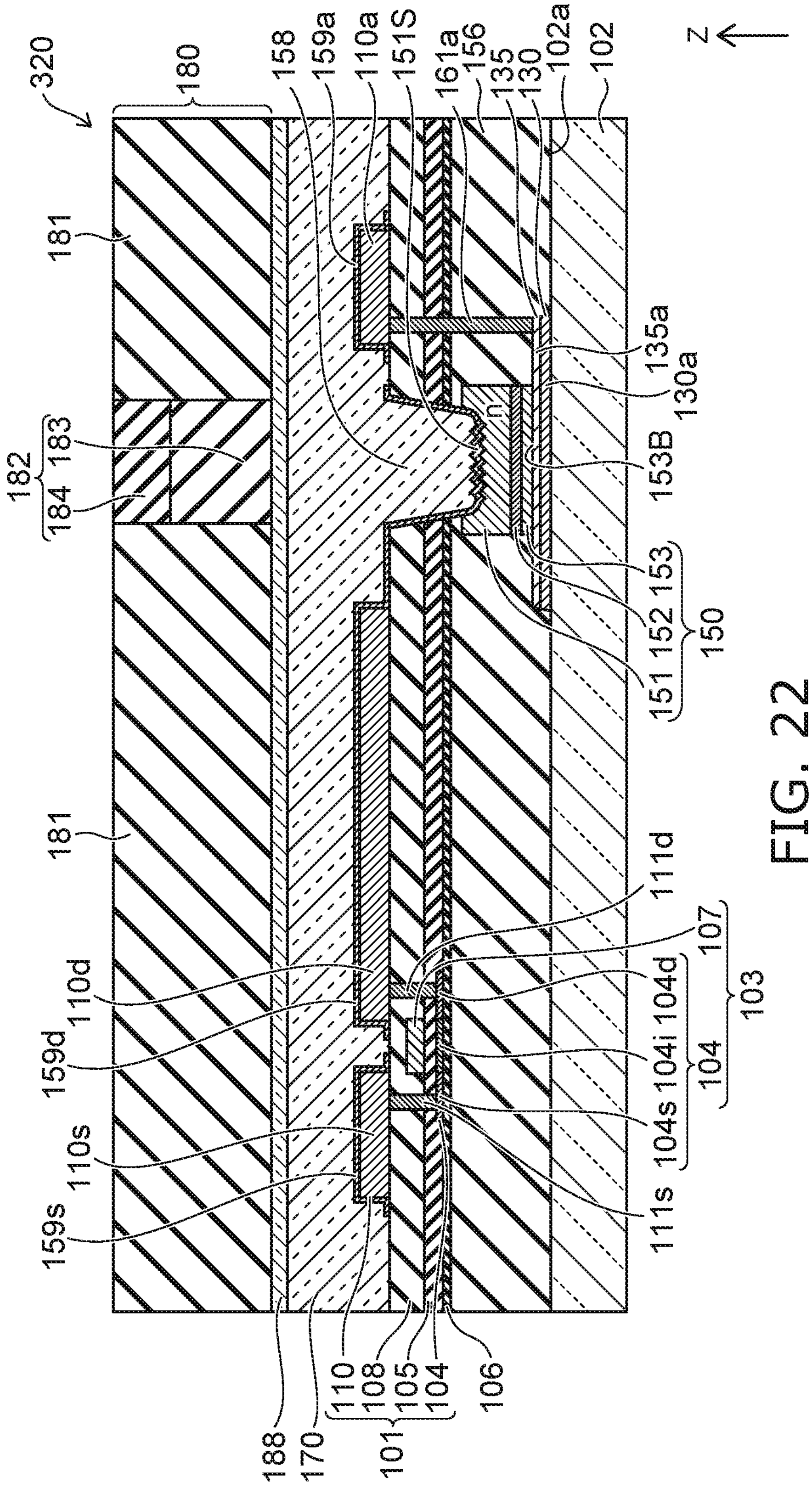
FIG. 22 is a schematic cross-sectional view illustrating a portion of an image display device according to a third embodiment.

FIG. 22 is a schematic cross-sectional view illustrating a portion of an image display device according to the embodiment.

The embodiment differs from the other embodiments described above in that a conductive auxiliary plate 135*a* is located between the connection plate 130*a* and the light-emitting element 150. The same components as the first embodiment are marked with the same reference numerals, and a detailed description is omitted as appropriate.

As shown in FIG. 22, a subpixel 320 of the image display device of the embodiment includes a conductive auxiliary layer 135. The conductive auxiliary layer 135 is a layer located on the conductive layer 130. The conductive auxiliary layer 135 includes the conductive auxiliary plate 135*a*, and the conductive auxiliary plate 135*a* is provided for each light-emitting element 150. The conductive auxiliary plate 135*a* is located between the connection plate 130*a* and the p-type semiconductor layer 153. The p-type semiconductor layer 153 has an ohmic connection with the conductive auxiliary plate 135*a* at the bottom surface 153B, and the connection plate 130*a* and the p-type semiconductor layer 153 are electrically connected.

The conductive auxiliary layer 135 and the conductive auxiliary plate 135*a* are formed of a material that has hole injectability. The hole-injection material is, for example, ITO, etc. According to the embodiment, the drive voltage of the light-emitting element 150 can be reduced by the hole-injection material having an ohmic connection with the p-type semiconductor layer 153.

In the example, the conductive auxiliary plate 135*a* and the connection plate 130*a* have the same rectangular or other shape when projected onto the XY plane. Because it is favorable for the conductive auxiliary plate 135*a* to be connected to the bottom surface 153B over a wide surface area, it is sufficient for the outer perimeter of the conductive auxiliary plate 135*a* to match the outer perimeter of the bottom surface 153B or to include the outer perimeter of the bottom surface 153B.

The via 161*a* is located between the conductive auxiliary plate 135*a* and the wiring portion 110*a* and electrically connects the conductive auxiliary plate 135*a* and the wiring portion 110*a*. The p-type semiconductor layer 153 is electrically connected to the wiring portion 110*a* (a first wiring portion) via the conductive auxiliary plate 135*a*, the connection plate 130*a*, and the via 161*a*. Because the purpose is for the conductive auxiliary plate 135*a* to be electrically connected with the p-type semiconductor layer 153, for example, one end of the via 161*a* may extend through the conductive auxiliary plate 135*a* and may be connected to the connection plate 130*a*.

The light-emitting surface 151S is electrically connected to the wiring portion 110*d* (a second wiring portion) via the light-transmitting electrode 159*d*. The other detailed configuration including the transistor 103 are the same as those of the first embodiment, and a description is omitted.

A production method for the image display device of the embodiment will now be described.

FIGS. 23A to 25B are schematic cross-sectional views illustrating the production method for the image display device of the embodiment.

Figure 23A:
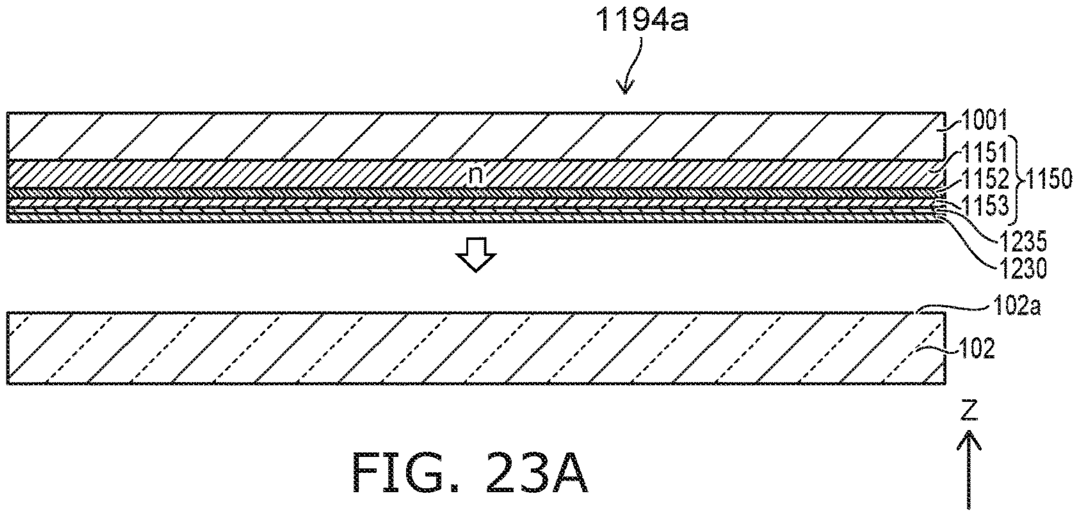
FIG. 23A is a schematic cross-sectional view illustrating a production method for the image display device of the third embodiment.

The semiconductor growth substrate 1194*a* is prepared as shown in FIG. 23A. The semiconductor growth substrate 1194*a* is the same as that described with reference to FIG. 7A. In other words, in the semiconductor growth substrate 1194*a*, the semiconductor layer 1150 is formed on one surface of the crystal growth substrate 1001. The semiconductor layer 1150 includes the n-type semiconductor layer 1151, the light-emitting layer 1152, and the p-type semiconductor layer 1153 stacked in this order from the crystal growth substrate 1001 side.

A conductive auxiliary film 1235 is formed over the exposed surface of the p-type semiconductor layer 1153 of the semiconductor growth substrate 1194*a*. The metal layer (a second metal layer) 1230 is formed over the exposed surface of the conductive auxiliary film 1235. For example, the conductive auxiliary film 1235 is formed of a hole-injection material such as ITO, etc. The metal layer 1230 is formed of Al, an alloy of Al, a stacked film of Al, Ti, and the like, etc.

The semiconductor growth substrate 1194*a* on which the conductive auxiliary film 1235 and the metal layer 1230 are formed is bonded to the first surface 102*a* of the substrate 102 via the metal layer 1230. Subsequently, the crystal growth substrate 1001 is removed by wet etching, laser lift-off, etc.

After the substrate 102 is prepared, the metal layer may be formed over the first surface 102*a*, and the bonding may be performed by causing the exposed surface of the metal layer that is formed and the exposed surface of the metal layer 1230 formed in the semiconductor growth substrate 1194*a* to face each other.

Although a case where a single semiconductor growth substrate 1194*a* is bonded to the substrate 102 is described in the example, similarly to the other embodiments described above, multiple semiconductor growth substrates may be arranged in, for example, a lattice shape and bonded to one substrate 102. Also, the methods described in the other embodiments described above are applicable to the configuration of the semiconductor growth substrate, the existence or absence of the support substrate, etc.

Figure 23B:
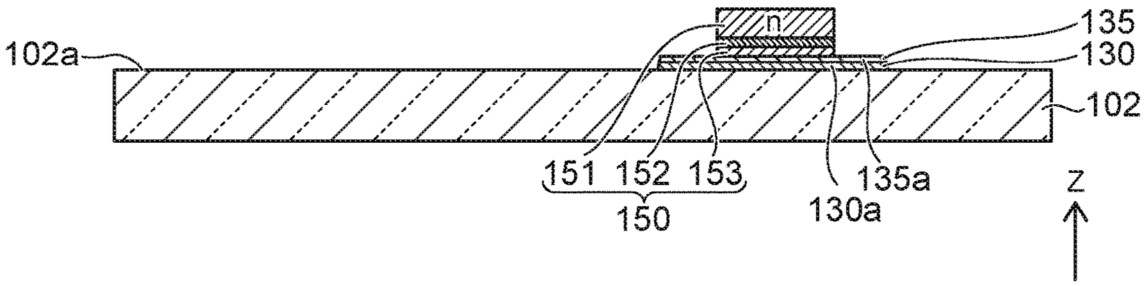
FIG. 23B is a schematic cross-sectional view illustrating the production method for the image display device of the third embodiment.

As shown in FIG. 23B, the light-emitting element 150 is formed by shaping the semiconductor layer 1150 shown in FIG. 23A into the desired shape by etching by RIE, etc. The metal layer 1230 and the conductive auxiliary film 1235 shown in FIG. 23A are shaped by etching to include the outer perimeter of the light-emitting element 150, and the conductive auxiliary layer 135 that includes the conductive auxiliary plate 135*a* and the conductive layer 130 including the connection plate 130*a* (the second part) is formed.

Figure 24A:
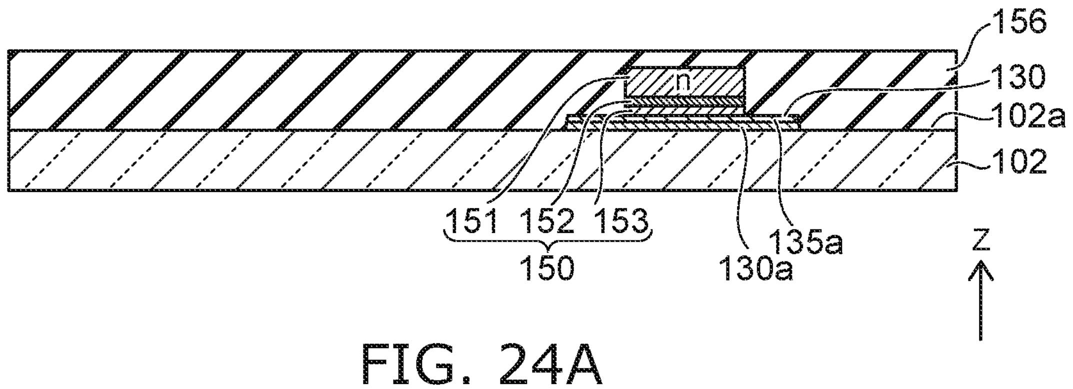
FIG. 24A is a schematic cross-sectional view illustrating the production method for the image display device of the third embodiment.

As shown in FIG. 24A, the first inter-layer insulating film 156 that covers the first surface 102*a*, the connection plate 130*a*, the conductive auxiliary plate 135*a*, and the light-emitting element 150 is formed.

Figure 24B:
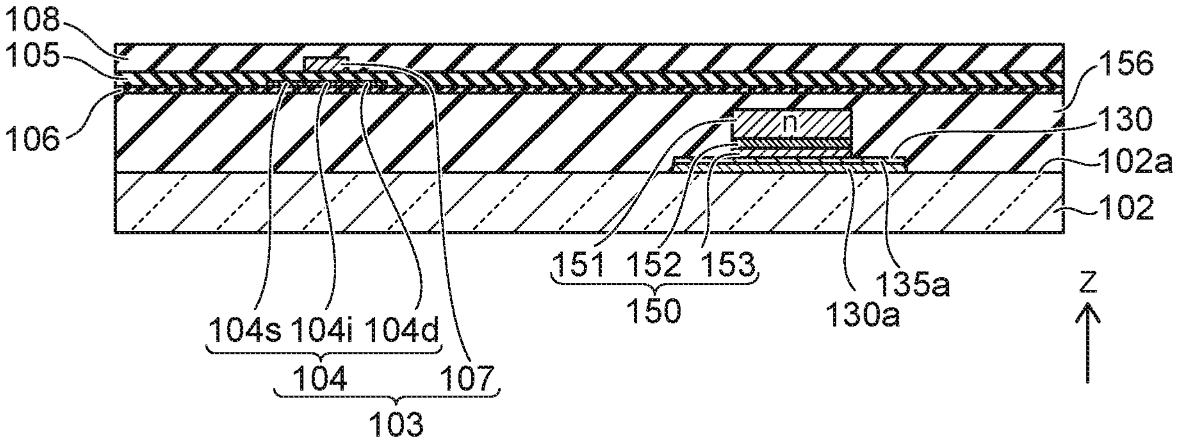
FIG. 24B is a schematic cross-sectional view illustrating the production method for the image display device of the third embodiment.

As shown in FIG. 24B, similarly to the other embodiments described above, the TFT underlying film 106 is formed, the TFT channel 104 is formed, the insulating layer 105 is formed, and the gate 107 is formed. The second inter-layer insulating film 108 that covers the insulating layer 105 and the gate 107 is formed.

Figure 25A:
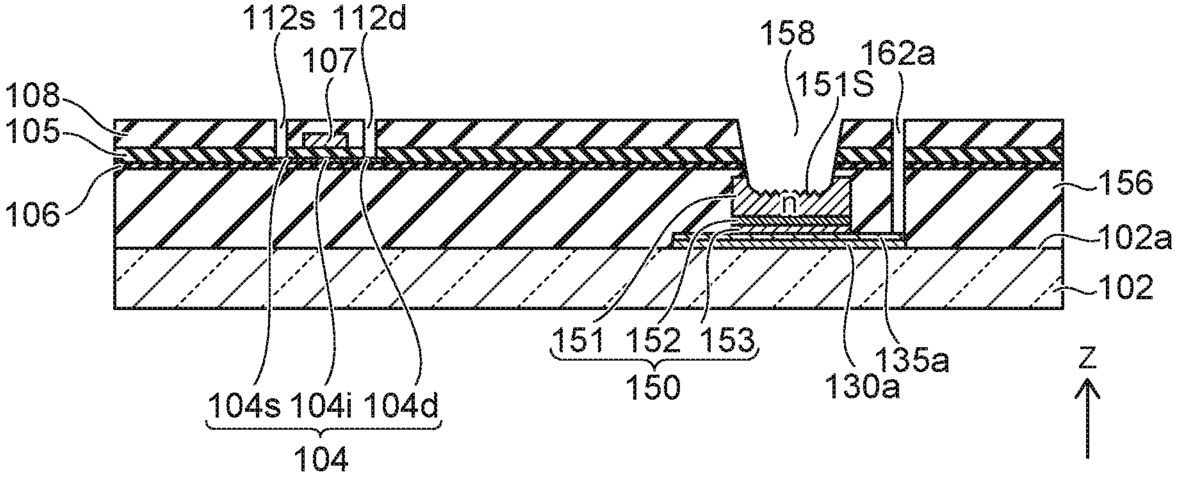
FIG. 25A is a schematic cross-sectional view illustrating the production method for the image display device of the third embodiment.

As shown in FIG. 25A, the via hole 162*a* extends through the second inter-layer insulating film 108, the insulating layer 105, the TFT underlying film 106, and the first inter-layer insulating film 156 and is formed to reach the conductive auxiliary plate 135*a*. The opening 158 and the via holes 112*d* and 112*s* are formed similarly to those of the other embodiments described above.

Figure 25B:
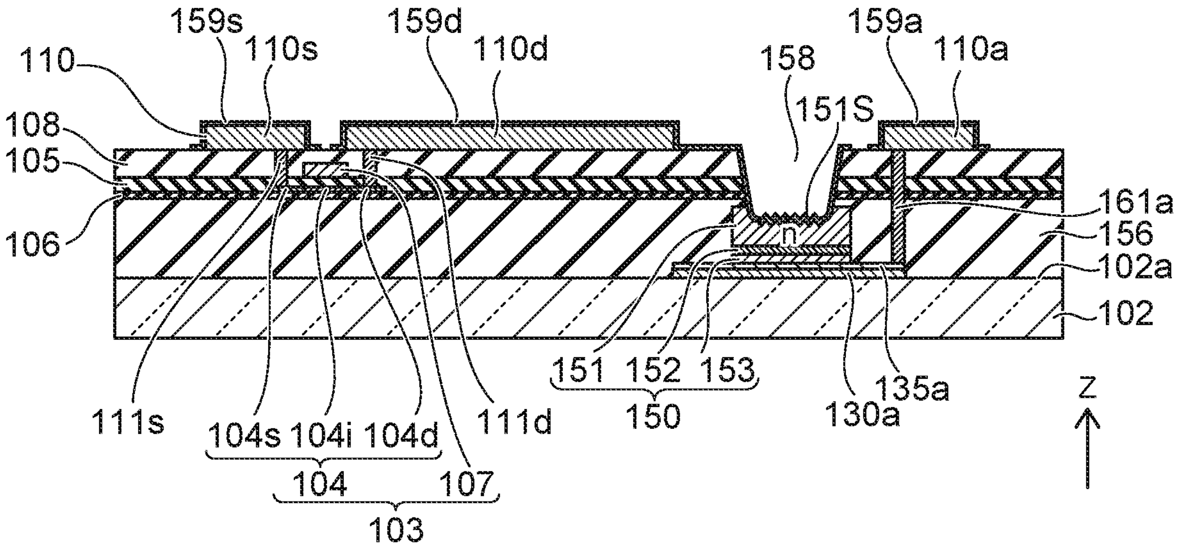
FIG. 25B is a schematic cross-sectional view illustrating the production method for the image display device of the third embodiment.

As shown in FIG. 25B, the vias 161*a* (the second vias), 111*d* and 111 are formed by filling a conductive material into the via holes 162*a*, 112*d*, and 112*s* shown in FIG. 25A. The wiring layer 110 is formed on the second inter-layer insulating film 108. The light-transmitting electrodes 159*a*, 159*d*, and 159*s* are formed by forming a transmissive conductive film on the wiring layer 110.

Effects of the image display device of the embodiment will now be described.

According to the image display device of the embodiment, the conductive auxiliary layer 135 and the conductive auxiliary plate 135*a* are formed of a hole-injection material such as ITO, etc. Because the p-type semiconductor layer 153 is connected to the conductive auxiliary plate 135*a*, the potential barrier is reduced, and the operating voltage of the light-emitting element 150 can be reduced. The power consumption of the light-emitting element 150 is reduced by the reduction of the operating voltage of the light-emitting element 150. As the operating voltage of the light-emitting element 150 is reduced, the drive voltage of the subpixel 20 itself also can be reduced, and the power consumption of the entire image display device can be further reduced.

Fourth Embodiment

Figure 26:
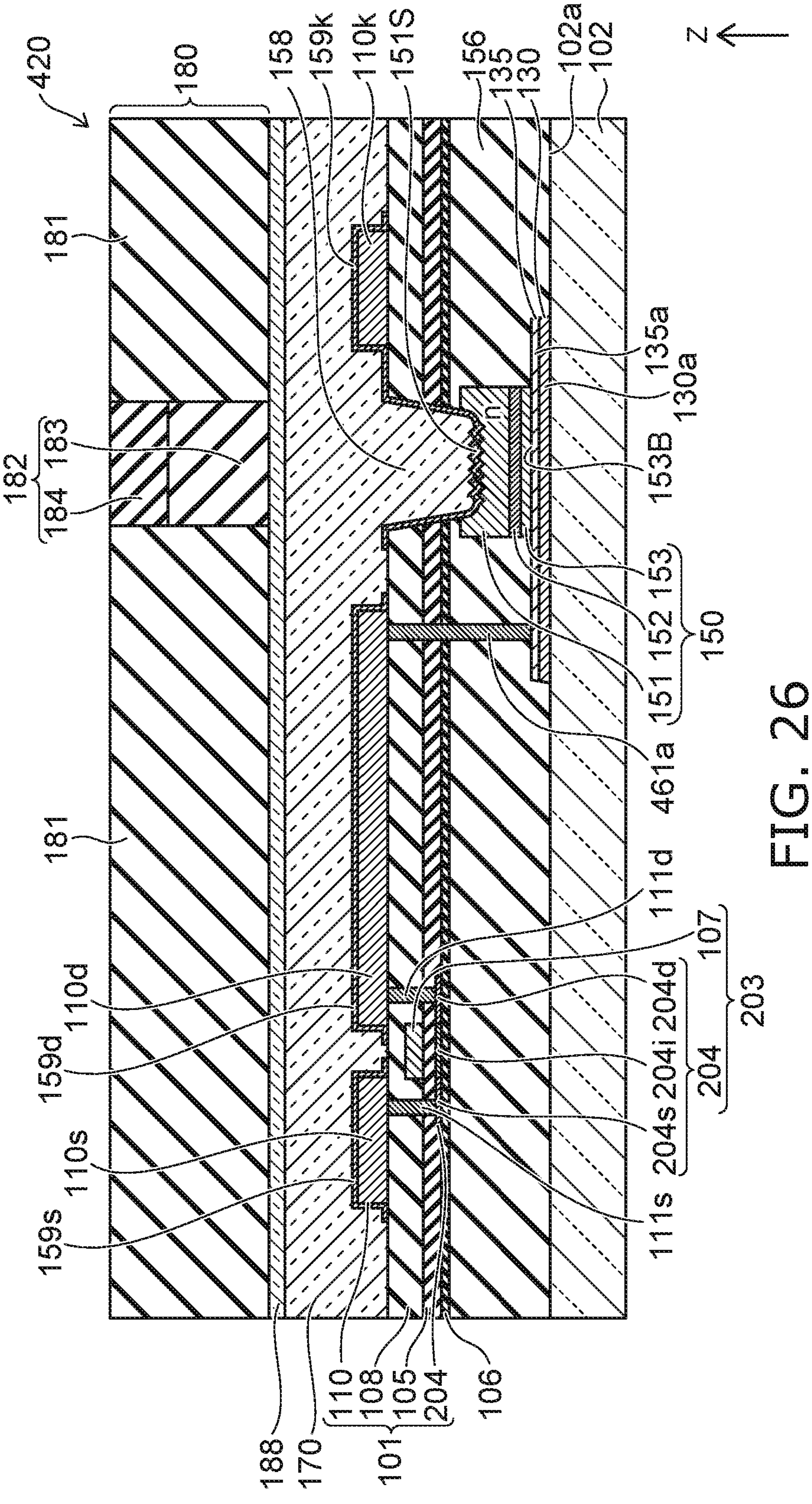
FIG. 26 is a schematic cross-sectional view illustrating a portion of an image display device according to a fourth embodiment.

FIG. 26 is a schematic cross-sectional view illustrating a portion of an image display device according to the embodiment.

The embodiment differs from the third embodiment in that a via 461*a* is provided between the conductive auxiliary plate 135*a* and the wiring portion 110*d*. Also, the light-emitting element 150 differs from the third embodiment in that the driving is performed by the p-type transistor 203. The same components as those of the other embodiments described above are marked with the same reference numerals, and a detailed description is omitted as appropriate.

As shown in FIG. 26, a subpixel 420 of the image display device of the embodiment includes the substrate 102, the conductive layer 130, the light-emitting element 150, the first inter-layer insulating film 156, the transistor 203, the second inter-layer insulating film 108, the via 461*a*, and the wiring layer 110. The transistor 203 is a p-channel TFT. In the light-emitting element 150, the light-emitting surface 151S is provided by the n-type semiconductor layer 151. The bottom surface 153B of the light-emitting element 150 is located on the conductive auxiliary plate 135*a*, and the p-type semiconductor layer 153 is electrically connected to the conductive auxiliary plate 135*a*.

The light-emitting element 150 is located on the conductive auxiliary plate 135*a*. The conductive auxiliary plate 135*a* is located similarly to that of the third embodiment. The connection plate 130*a* is located directly under the light-emitting element 150, functions also as a light-reflecting plate, and increases the substantial luminous efficiency of the light-emitting element 150.

The wiring layer 110 is formed on the second inter-layer insulating film 108. The wiring layer 110 includes wiring portions 110*k*, 110*d*, and 110*s*. For example, the wiring portion 110*k* is connected to the ground line 4 of the circuit shown in FIG. 17.

A portion of the wiring portion 110*d* is located above the transistor 203 and is connected to the region 204*d* by the via 111*d*. Another portion of the wiring portion 110*d* (a third wiring portion) is located at the vicinity of the light-emitting element 150 and is connected to the conductive auxiliary plate 135*a* by the via 461*a*. That is, the via 461*a* is located between the conductive auxiliary plate 135*a* and the wiring portion 110*d* and electrically connects the conductive auxiliary plate 135*a* and the wiring portion 110*d*. Similarly to the third embodiment, the via 461*a* may extend through the conductive auxiliary plate 135*a* to be connected to the conductive auxiliary plate 135*a*.

For example, the wiring portion 110*s* is connected to the power supply line 3 of the circuit shown in FIG. 17.

The light-transmitting electrode 159*k* is provided over the wiring portion 110*k* (a fourth wiring portion). The light-transmitting electrode 159*k* is provided over the light-emitting surface 151S. The light-transmitting electrode 159*k* is located between the wiring portion 110*k* and the light-emitting surface 151S. Accordingly, for example, the n-type semiconductor layer 151 is electrically connected to the ground line 4 via the light-transmitting electrode 159*k* and the wiring portion 110*k*.

The light-transmitting electrode 159*d* is provided over the wiring portion 110*d*. Accordingly, the p-type semiconductor layer 153 is electrically connected to the region 204*d* that is the drain electrode of the transistor 203 via the conductive auxiliary plate 135*a*, the connection plate 130*a*, the via 461*a*, the wiring portion 110*d*, the light-transmitting electrode 159*d*, and the via 111*d*.

The light-transmitting electrode 159*s* is provided over the wiring portion 110*s*. For example, the wiring portion 110*s* and the light-transmitting electrode 159*s* are connected to the power supply line 3 shown in FIG. 13. Accordingly, the region 204*s* of the transistor 203 is electrically connected to the power supply line 3 by the via 111*s*, the wiring portion 110*s*, and the light-transmitting electrode 159*s*.

The vias 461*a*, 111*d*, and 111*s* and the wiring portions 110*k*, 110*d*1, and 110*s* are formed using materials and formation methods similar to those of the other embodiments and their modifications described above.

Similarly to the other embodiments described above, the color filter 180, etc., are further provided.

A production method for the image display device of the embodiment will now be described.

Figure 27A:
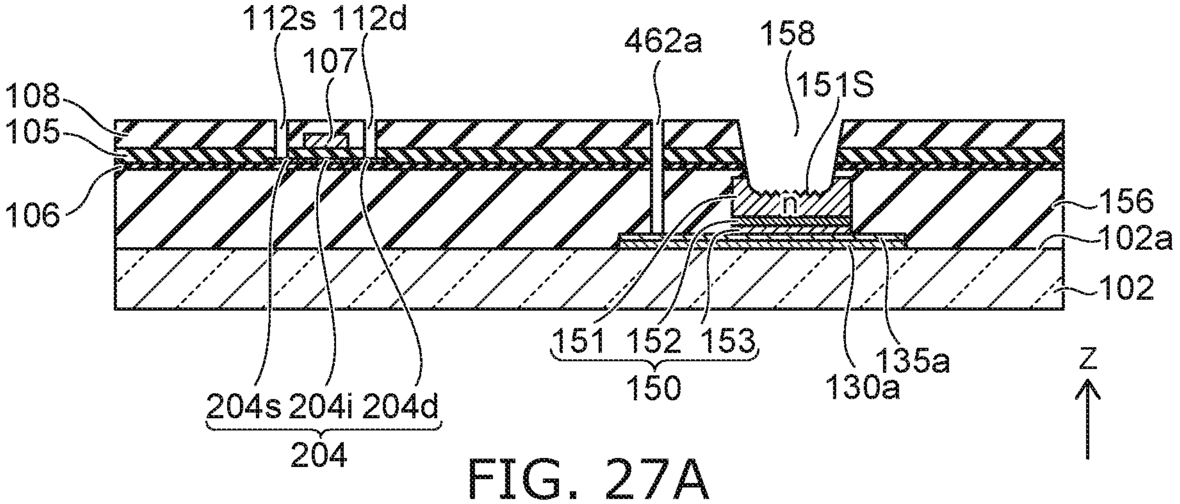
FIG. 27A is a schematic cross-sectional view illustrating a production method for the image display device of the fourth embodiment.
Figure 27B:
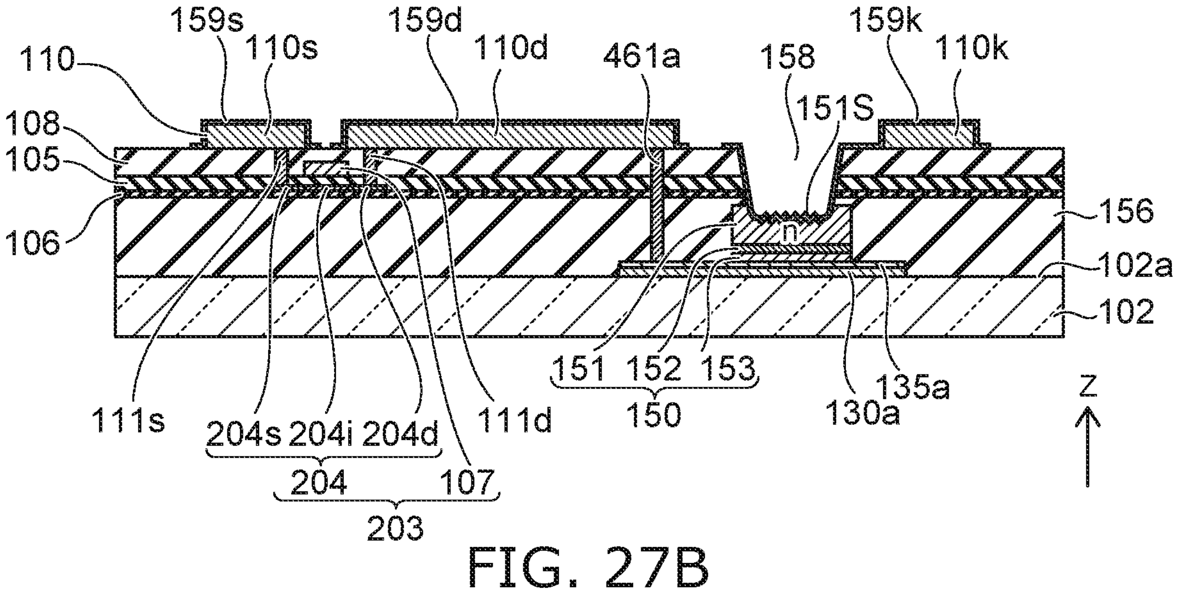
FIG. 27B is a schematic cross-sectional view illustrating the production method for the image display device of the fourth embodiment.

FIGS. 27A and 27B are schematic cross-sectional views illustrating the production method for the image display device of the embodiment.

The procedure of the production method of the embodiment partway through is the same as the procedure of the production method according to the third embodiment. In the following description, the processes of FIGS. 27A and 27B are performed after the process of forming the second inter-layer insulating film 108 in FIG. 24B. However, in FIG. 24B, the embodiment differs in that the p-channel transistor 203 is formed on the TFT underlying film 106 instead of the n-channel transistor 103 being formed on the TFT underlying film 106. The method for forming the p-channel transistor 203 is similar to that of the second embodiment described above, and a detailed description is omitted.

As shown in FIG. 27A, a via hole 462*a* extends through the second inter-layer insulating film 108, the insulating layer 105, the TFT underlying film 106, and the first inter-layer insulating film 156 and is formed to reach the conductive auxiliary plate 135*a*. The opening 158 and the via holes 112*d* and 112*s* are formed similarly to those of the other embodiments described above.

As shown in FIG. 27B, the vias 461*a*, 111*d*, and 111*s* are formed by filling a conductive material into the via holes 462*a*, 112*d*, and 112*s* shown in FIG. 27A. The wiring layer 110 is formed on the second inter-layer insulating film 108. The light-transmitting electrodes 159*k*, 159*d*, and 159*s* are formed by forming a transmissive conductive film on the wiring layer 110.

Effects of the image display device of the embodiment will now be described.

The image display device of the embodiment has the following effects in addition to the effects of the third embodiment described above. In other words, according to the embodiment, a circuit configuration in which the light-emitting element 150 is driven by the p-channel transistor 203 can be used while using the n-type semiconductor layer 151 as the light-emitting surface 151S. Therefore, wider variation of the circuit layout, etc., is possible, and flexible circuit design is possible. Also, by using the n-type semiconductor layer 151 as the light-emitting surface 151S, similarly to the first embodiment, the effect of easier roughening of the light-emitting surface is obtained. Also, by roughening the light-emitting surface, the effects of increasing the luminous efficiency and suppressing an increase of the loss due to the contact resistance also can be obtained.

Fifth Embodiment

An image display device of the embodiment includes a flexible substrate 502 instead of the glass substrate. The light-emitting element and the circuit elements such as the transistors, etc., are formed on a first surface 502*a* of the substrate 502. Otherwise, the embodiment is similar to the third embodiment described above, the same components are marked with the same reference numerals, and a detailed description is omitted as appropriate.

Figure 28:
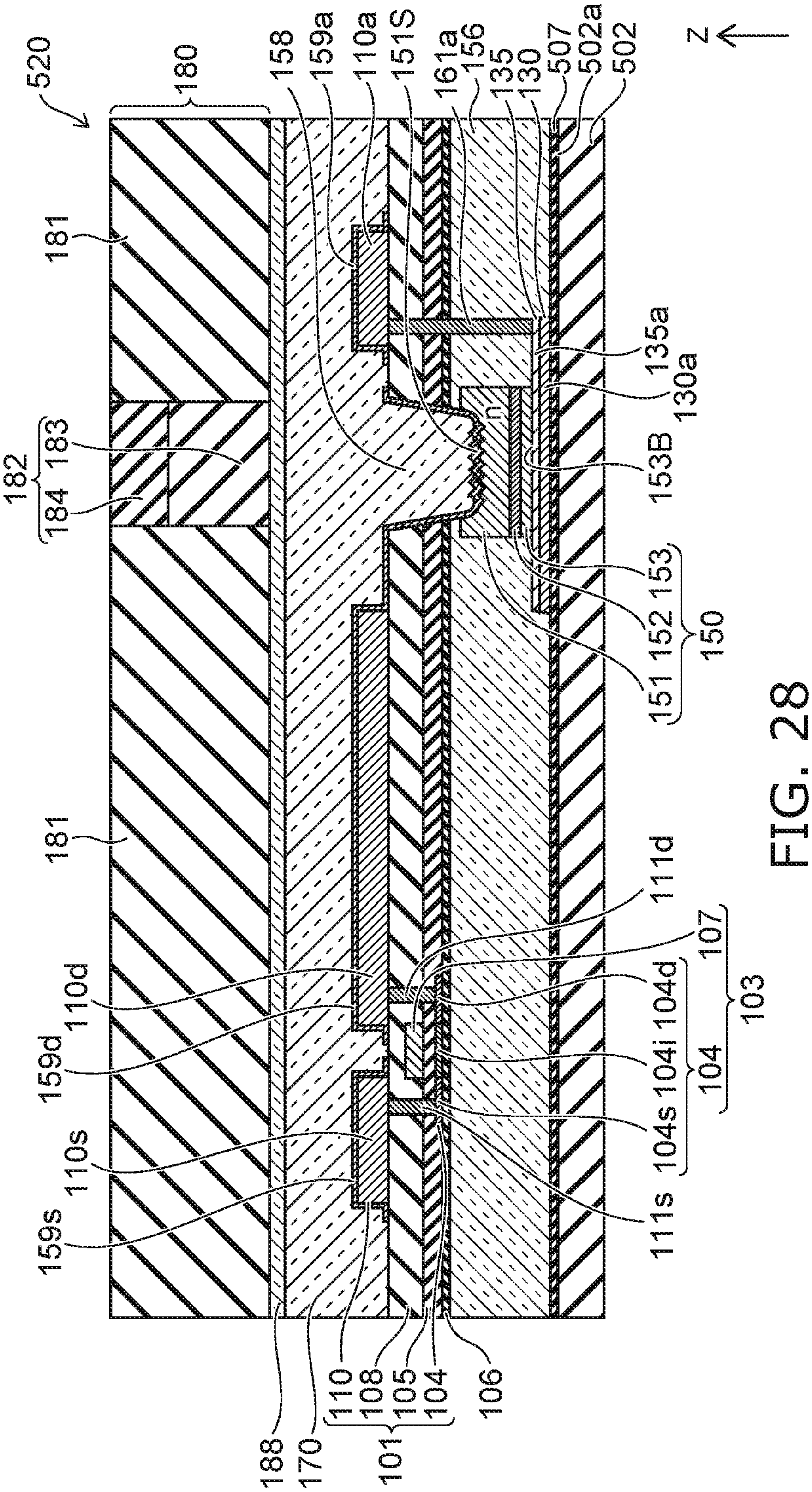
FIG. 28 is a schematic cross-sectional view illustrating a portion of an image display device according to a fifth embodiment.

FIG. 28 is a schematic cross-sectional view illustrating a portion of the image display device according to the embodiment.

As shown in FIG. 28, the image display device of the embodiment includes a subpixel 520. The subpixel 520 includes the substrate 502. The substrate 502 includes the first surface 502*a*. When the substrate 502 is formed of an organic material such as a resin, etc., a layer 507 that includes a silicon compound is formed on the first surface 502*a*. The silicon compound-including layer 507 is formed of $SiO_2$, $SiN_x$, etc. Because the conductive layer 130 is formed of a metal material, the silicon compound-including layer 507 is provided to improve the adhesion between the substrate 502 and the conductive layer 130.

The conductive layer 130 and the connection plate 130*a* are located on the first surface 502*a* with the silicon compound-including layer 507 interposed. Favorably, the conductive auxiliary plate 135*a* is located on the connection plate 130*a*, and the light-emitting element 150 is located on the conductive auxiliary plate 135*a*. The structures and components higher than the conductive layer 130 and the connection plate 130*a* of the example are the same as those of the third embodiment described above, and a detailed description is omitted.

The substrate 502 is flexible. For example, the substrate 502 is formed of a polyimide resin, etc. It is favorable for the first inter-layer insulating film 156, the second inter-layer insulating film 108, the wiring layer 110, etc., to be formed of a material that is somewhat flexible to correspond to the flexibility of the substrate 502. The wiring layer 110 that has the longest wiring length has the highest risk of damage when bending. It is therefore desirable to adjust the various film thicknesses, film properties, and materials so that the neutral surface when including the multiple protective films added to the front surface and the back surface, etc., is at the position of the wiring layer 110 as necessary.

In the example, the structures and the components that are higher than the silicon compound-including layer 507 are the same as those of the third embodiment, but can be those of the other embodiments and their modifications described above. Also, the configuration of the sixth embodiment described below is applicable.

A production method for the image display device of the embodiment will now be described.

Figure 29A:
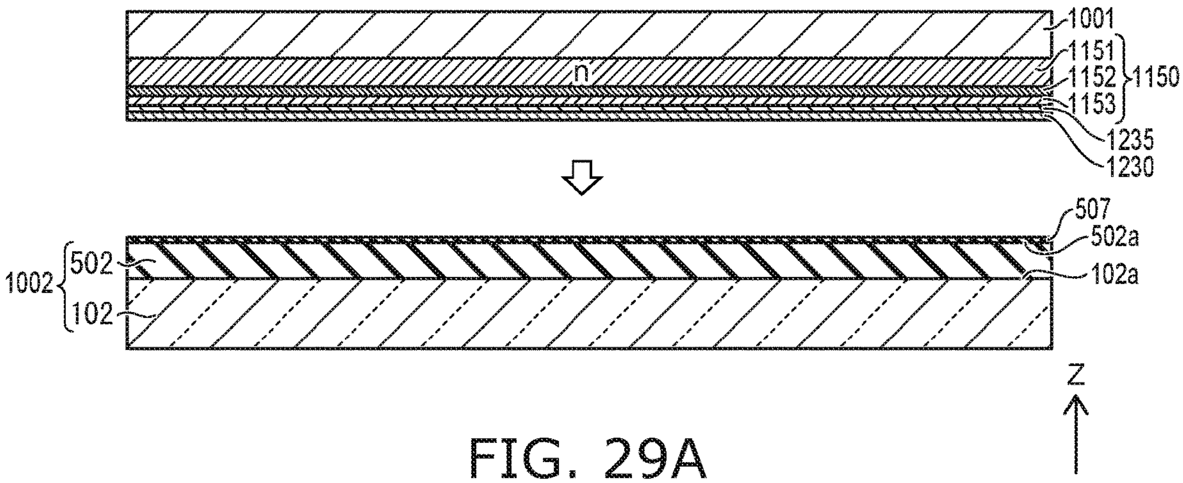
FIG. 29A is a schematic cross-sectional view illustrating the production method for the image display device of the fifth embodiment.
Figure 29B:
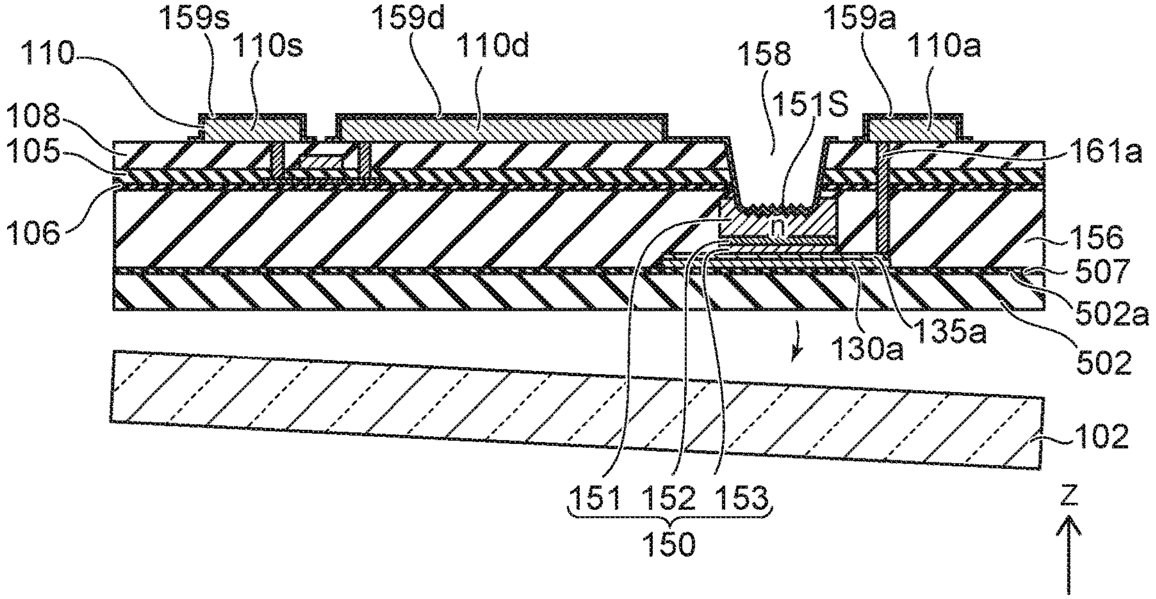
FIG. 29B is a schematic cross-sectional view illustrating the production method for the image display device of the fifth embodiment.

FIGS. 29A and 29B are schematic cross-sectional views illustrating the production method for the image display device of the embodiment.

As shown in FIG. 29A, the embodiment differs from the other embodiments described above in that a substrate 1002 is prepared. The substrate 1002 (a fourth substrate) includes the two layers of the substrates 102 and 502. The substrate 102 is, for example, a glass substrate. The substrate 502 is located on the first surface 102*a* of the substrate 102. For example, the substrate 502 is formed by coating polyimide on the first surface 102*a* and by sintering. An inorganic film of $SiN_x$ or the like may be formed on the first surface 102*a* before forming the substrate 502. In such a case, the substrate 502 is formed by coating a polyimide material on an inorganic film and by sintering.

The silicon compound-including layer 507 is formed over the first surface 502*a* of the substrate 502. The first surface 502*a* of the substrate 502 is the surface opposite to the surface at which the substrate 102 is located.

For example, the upper structure of the subpixel 520 is formed by applying the processes of FIGS. 23A to 25B, FIG. 13, and FIGS. 14A to 14D above to such a substrate 1002.

As shown in FIG. 29B, the substrate 102 is removed from the structure body in which the upper structural component including the not-illustrated color filter, etc., is formed. For example, laser lift-off or the like is used to remove the substrate 102.

The removal of the substrate 102 is not limited to the timing described above and can be performed at an appropriate timing. When the substrate 502 is made of an organic resin and there is a process of exposing to a high temperature after removing the substrate 102, there is a risk that the heating may cause the substrate 502 to contract, etc. It is therefore favorable to remove the substrate 102 in a process that is after such a process of exposing to a high temperature. For example, it is favorable to remove the substrate 102 after the process of forming the wiring layer 110 has ended. By removing the substrate 102 at an appropriate timing, discrepancies such as cracking, chipping, etc., in the manufacturing processes may be reduced.

Effects of the image display device of the embodiment will now be described.

In addition to the effects according to the other embodiments described above, the image display device of the embodiment has the effects described below. In other words, because the substrate 502 is flexible, bending of the image display device is possible, and adhering to a curved surface, utilizing in a wearable terminal, etc., can be performed without discomfort.

Sixth Embodiment

Figure 30:
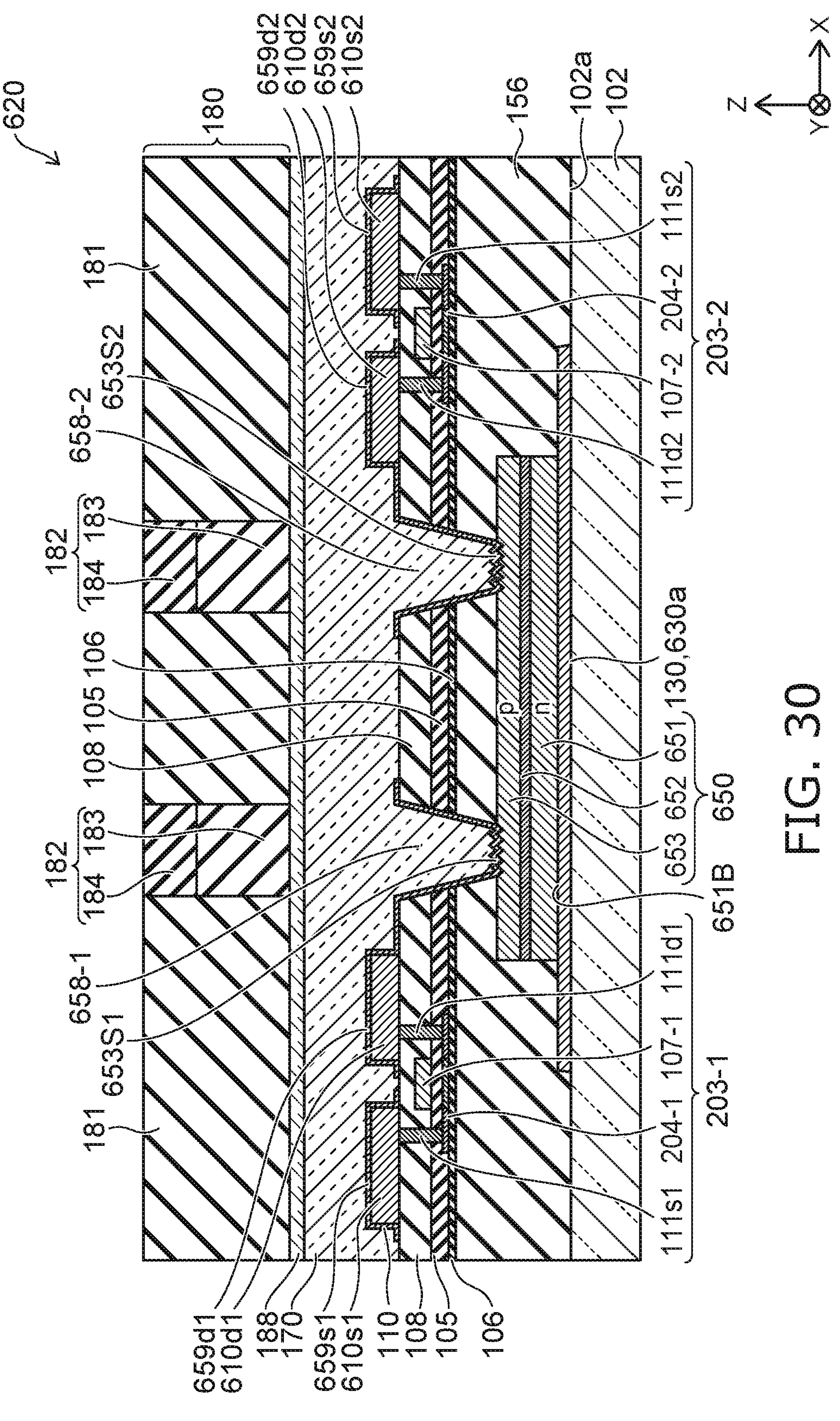
FIG. 30 is a schematic cross-sectional view illustrating a portion of an image display device according to a sixth embodiment.

FIG. 30 is a schematic cross-sectional view illustrating a portion of an image display device according to the embodiment.

According to the embodiment, an image display device that has a higher luminous efficiency is realized by forming multiple light-emitting surfaces 653S1 and 653S2 in a single semiconductor layer 650 that includes a light-emitting layer. In the following description, the same components as those of the other embodiments described above are marked with the same reference numerals, and a detailed description is omitted as appropriate.

As shown in FIG. 30, the image display device of the embodiment includes a subpixel group 620. The subpixel group 620 includes the substrate 102, the semiconductor layer 650, the first inter-layer insulating film 156, transistors 203-1 and 203-2, the second inter-layer insulating film 108, and the wiring layer 110. The semiconductor layer 650 is located on a connection plate 630*a* located at the first surface 102*a* of the substrate 102. To avoid a complex display in the cross-sectional views of the embodiment, the reference numeral of the conductive layer 130 is labeled next to the reference numeral of the connection plate 630*a*.

According to the embodiment, for example, the conductive layer 130 and the connection plate 630*a* are connected to the ground line 4 of the circuit of FIG. 17. By switching the p-channel transistor 203-1 on, holes are injected into the light-emitting surface 653S1 via a light-transmitting electrode 659*d*1. Also, by switching the p-channel transistor 203-2 on, holes are injected into the light-emitting surface 653S2 via a light-transmitting electrode 659*d*2. In the semiconductor layer 650, a light-emitting layer 652 is caused to emit light by the combination of the holes and electrons at the vicinities of the light-emitting surfaces 653S1 and 653S2 into which the holes are injected. For example, the circuit configuration shown in FIG. 17 is applied to the drive circuit for driving the light-emitting layer 652. As in the other embodiments described above, a configuration in which an n-channel transistor drives the semiconductor layer also is possible by vertically interchanging the n-type semiconductor layer and the p-type semiconductor layer of the semiconductor layer. In such a case, the circuit configuration of FIG. 3 is applied to the drive circuit.

The configuration of the subpixel group 620 will now be described in detail.

The conductive layer 130 is located on the first surface 102*a*. The conductive layer 130 includes the connection plate 630*a*. The semiconductor layer 650 is located on the first surface 102*a* with the connection plate 630*a* interposed. The semiconductor layer 650 includes a bottom surface 651B, and the connection plate 630*a* is connected to the bottom surface 651B. When projected onto the XY plane, the outer perimeter of the connection plate 630*a* is set to include the outer perimeter of the semiconductor layer 650 when the semiconductor layer 650 is projected onto the connection plate 630*a*. Accordingly, the connection plate 630*a* reflects the downward-scattered light of the semiconductor layer 650 upward toward the side of the light-emitting surfaces 653S1 and 653S2. Therefore, the substantial luminous efficiency of the semiconductor layer 650 is increased.

The semiconductor layer 650 includes multiple light-emitting surfaces 653S1 and 653S2. The semiconductor layer 650 is a prismatic or cylindrical stacked body that includes the bottom surface 651B connected on the connection plate 630*a*. The light-emitting surfaces 653S1 and 653S2 are surfaces opposite to the bottom surface 651B. It is favorable for the light-emitting surfaces 653S1 and 653S2 to be surfaces in a plane substantially parallel to the bottom surface 651B. The plane that includes the light-emitting surface 653S1 and the plane that includes the light-emitting surface 653S2 may be the same plane or may be different planes. The light-emitting surfaces 653S1 and 653S2 are provided to be separated in the X-axis direction.

The semiconductor layer 650 includes an n-type semiconductor layer 651, the light-emitting layer 652, and a p-type semiconductor layer 653. The n-type semiconductor layer 651, the light-emitting layer 652, and the p-type semiconductor layer 653 are stacked in this order from the bottom surface 651B toward the light-emitting surfaces 653S1 and 653S2.

The bottom surface 651B is an n-type semiconductor, and the n-type semiconductor layer 651 is electrically connected to an external circuit, e.g., the ground line 4 of the circuit of FIG. 17, that is connected via the bottom surface 651B and the connection plate 130*a*.

The p-type semiconductor layer 653 includes the two light-emitting surfaces 653S1 and 653S2 at the upper surface. That is, one subpixel group 620 substantially includes two subpixels. According to the embodiment, similarly to the other embodiments described above, a display region is formed by arranging the subpixel groups 620 substantially including two subpixels in a lattice shape.

The first inter-layer insulating film 156 (the first insulating film) covers the first surface 102*a*, the conductive layer 130, the connection plate 630*a*, the side surface of the n-type semiconductor layer 651, the side surface of the light-emitting layer 652, and the side surface of the p-type semiconductor layer 653. The first inter-layer insulating film 156 covers a portion of the upper surface of the p-type semiconductor layer 653. Of the p-type semiconductor layer 653, the light-emitting surfaces 653S1 and 653S2 are not covered with the first inter-layer insulating film 156. Similarly to the other embodiments described above, the first inter-layer insulating film 156 is favorably a white resin.

The TFT underlying film 106 is formed over the first inter-layer insulating film 156. The TFT underlying film 106 is not provided on the light-emitting surfaces 653S1 and 653S2. The TFT underlying film 106 is planarized, and the TFT channels 204-1 and 204-2, etc., are formed on the TFT underlying film 106.

The insulating layer 105 covers the TFT underlying film 106 and the TFT channels 204-1 and 204-2. A gate 107-1 is located on the TFT channel 204-1 with the insulating layer 105 interposed. A gate 107-2 is located on the TFT channel 204-2 with the insulating layer 105 interposed. The transistor 203-1 includes the TFT channel 204-1 and the gate 107-1. The transistor 203-2 includes the TFT channel 204-2 and the gate 107-2.

The second inter-layer insulating film 108 (the second insulating film) covers the insulating layer 105 and the gates 107-1 and 107-2.

The TFT channels 204-1 and 204-2 include regions doped to be of the p-type, and the transistors 203-1 and 203-2 are p-channel TFTs. The transistor 203-1 is located at a position more proximate to the light-emitting surface 653S1 than the light-emitting surface 653S2. The transistor 203-2 is located at a position more proximate to the light-emitting surface 653S2 than the light-emitting surface 653S1.

The light-transmitting electrode 659*d*1 is provided over the light-emitting surface 653S1. An opening 658-1 is provided above the light-emitting surface 653S1 and the light-transmitting electrode 659*d*1. The light-transmitting electrode 659*d*2 is provided over the light-emitting surface 653S2. An opening 658-2 is provided above the light-emitting surface 653S2 and the light-transmitting electrode 659*d*2. The second inter-layer insulating film 108, the insulating layer 105, the TFT underlying film 106, and the first inter-layer insulating film 156 are not provided in the openings 658-1 and 658-2. The light-emitting surfaces 653S1 and 653S2 are exposed from the second inter-layer insulating film 108, the insulating layer 105, the TFT underlying film 106, and the first inter-layer insulating film 156. The openings 658-1 and 658-2 are filled with the surface resin layer 170.

The light-emitting surfaces 653S1 and 653S2 are squares, rectangles, other polygons, circles, etc., when projected onto the XY plane. The shapes of the uppermost portions of the openings 658-1 and 658-2 also can be squares, rectangles, other polygons, circles, etc. For example, as in the example, it is favorable for the openings 658-1 and 658-2 to be formed in tapered shapes so that the surface areas widen upward to reduce loss due to light reflected by the wall surfaces of the openings 658-1 and 658-2. When projected onto the XY plane, the shapes of the light-emitting surfaces 653S1 and 653S2 and the shapes of the uppermost portions of the openings 658-1 and 658-2 may be similar or may not be similar.

The wiring layer 110 is located on the second inter-layer insulating film 108. The wiring layer 110 includes wiring portions 610*s*1, 610*d*1, 610*d*2, and 610*s*2. For example, the wiring portions 610*s*1 and 610*s*2 are connected to the power supply line 3 of the circuit shown in FIG. 17.

Vias 111*d*1, 111*s*1, 111*d*2, and 111*s*2 are provided to extend through the second inter-layer insulating film 108, the insulating layer 105, and the TFT underlying film 106. The via 111*d*1 is located between the wiring portion 610*d*1 and one region of the transistor 203-1 doped to be of the p-type. The via 111*s*1 is located between the wiring portion 610*s*1 and another region of the transistor 203-1 doped to be of the p-type. The via 111*d*2 is located between the wiring portion 610*d*2 and one region of the transistor 203-2 doped to be of the p-type. The via 111*s*2 is located between the wiring portion 610*s*2 and another region of the transistor 203-2 doped to be of the p-type.

The wiring portion 610*d*1 is connected to a p-type region corresponding to the drain electrode of the transistor 203-1 by the via 111*d*1. The wiring portion 610*s*1 is connected to a p-type region corresponding to the source electrode of the transistor 203-1 by the via 111*s*1. The wiring portion 610*d*2 is connected to a region corresponding to the drain electrode of the transistor 203-2 by the via 111*d*2. The wiring portion 610*s*2 is connected to a region corresponding to the source electrode of the transistor 203-2 by the via 111*s*2.

The light-transmitting electrode 659*d*1 is provided over the light-emitting surface 653S1 and the wiring portion 610*d*1. The light-transmitting electrode 659*d*1 also is located between the light-emitting surface 653S1 and the wiring portion 610*d*1 and electrically connects the light-emitting surface 653S1 and the wiring portion 610*d*1. A light-transmitting electrode 659*s*1 is provided over the wiring portion 610*s*1. Accordingly, the p-type semiconductor layer 653 is electrically connected to a region corresponding to the drain electrode of the channel region 204-1 via the light-emitting surface 653S1, the light-transmitting electrode 659*d*1, the wiring portion 610*d*1, and the via 111*d*1. A region that corresponds to the source electrode of the channel region 204-1 is electrically connected to the power supply line 3 by the via 111*s*1, the wiring portion 610*s*1, and the light-transmitting electrode 659*s*1.

The light-transmitting electrode 659*d*2 is provided over the light-emitting surface 653S2 and the wiring portion 610*d*2. The light-transmitting electrode 659*d*2 also is located between the light-emitting surface 653S2 and the wiring portion 610*d*2 and electrically connects the light-emitting surface 653S2 and the wiring portion 610*d*2. A light-transmitting electrode 659*s*2 is provided over the wiring portion 610*s*2. Accordingly, the p-type semiconductor layer 653 is electrically connected to a region corresponding to the drain electrode of the channel region 204-2 via the light-emitting surface 653S2, the light-transmitting electrode **659*d*2, the wiring portion 610*d*2, and the via 111*d*2. A region that corresponds to the source electrode of the channel region 204-2 is electrically connected to the power supply line 3 by the via 111*s*2, the wiring portion 610*s*2, and the light-transmitting electrode 659*s*2**.

The transistors 203-1 and 203-2 are, for example, drive transistors of adjacent subpixels and are sequentially driven. Holes that are supplied from one of the two transistors 203-1 and 203-2 are injected into the light-emitting layer 652, electrons that are supplied from the connection plate **630*a* are injected into the light-emitting layer 652, and the light-emitting layer 652** emits light.

According to the embodiment, the drift current that flows in a direction parallel to the XY plane is suppressed by the resistance of the n-type semiconductor layer 651 and the p-type semiconductor layer 653. Therefore, the holes that are injected from the light-emitting surfaces 653S1 and 653S2 and the electrons that are injected from the connection plate **630*a* both travel along the stacking direction of the semiconductor layer 650. Because a light emission source substantially does not operate further outward of the light-emitting surfaces 653S1 and 653S2, the multiple light-emitting surfaces 653S1 and 653S2 that are located in one semiconductor layer 650 can be selectively caused to emit light respectively by the transistors 203-1 and 203-2**.

Thus, the light emission source of the semiconductor layer 650 is substantially determined by the arrangement of the light-emitting surfaces 653S1 and 653S2. Therefore, the connection plate **630*a* may be provided for each light-emitting surfaces 653S1 and 653S2 according to the positions and shapes of the light-emitting surfaces 653S1 and 653S2**.

A production method for the image display device of the embodiment will now be described.

FIGS. 31A to 33B are schematic cross-sectional views illustrating the production method for the image display device of the embodiment.

Figure 31A:
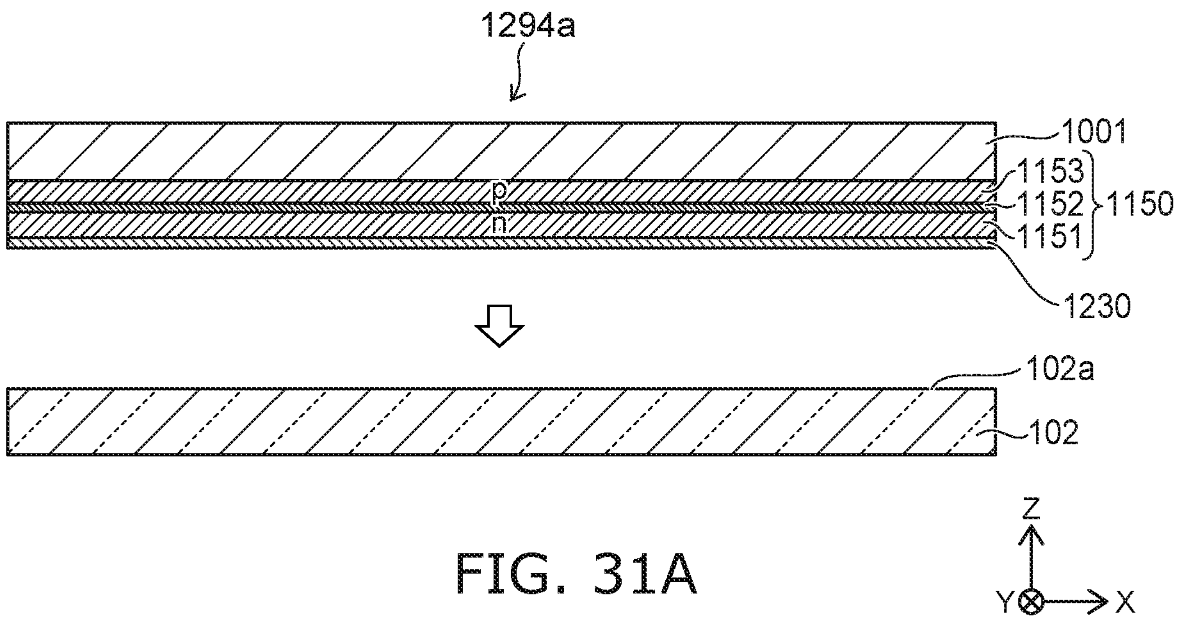
FIG. 31A is a schematic cross-sectional view illustrating a production method for the image display device of the sixth embodiment.

As shown in FIG. 31A, a semiconductor growth substrate (the second substrate) **1294*a* and the substrate 102 (the third substrate) are prepared. The semiconductor growth substrate 1294*a* includes the crystal growth substrate 1001 and a semiconductor layer. The semiconductor layer 1150 includes the p-type semiconductor layer 1153, the light-emitting layer 1152, and the n-type semiconductor layer 1151 stacked in this order from the crystal growth substrate 1001 side. The metal layer 1230 is formed at the exposed surface of the n-type semiconductor layer 1151. The substrate 102** is the same substrate as that of the other embodiments described above, and a detailed description is omitted.

The semiconductor growth substrate **1294*a* in which the metal layer 1230 is formed is positioned so that the exposed surface of the metal layer 1230 faces the first surface 102*a* of the substrate 102. The semiconductor layer 1150 is bonded to the first surface 102*a* via the metal layer 1230**.

Although the metal layer 1230 is formed at the semiconductor layer 1150 side in the example above, it is sufficient for the metal layer to be formed on at least one of the substrate 102 side or the semiconductor layer 1150 side.

As described below, the metal layer functions as a light-reflecting plate and is used for the electrical connection of the lower layer of the semiconductor layer 650. Therefore, there are cases where it is favorable to make the metal layer thick to reduce the resistance value. For example, a metal layer also may be formed on the first surface **102*a*** and may be utilized as a wiring layer having lower resistance by bonding the metal layers to each other.

Figure 31B:
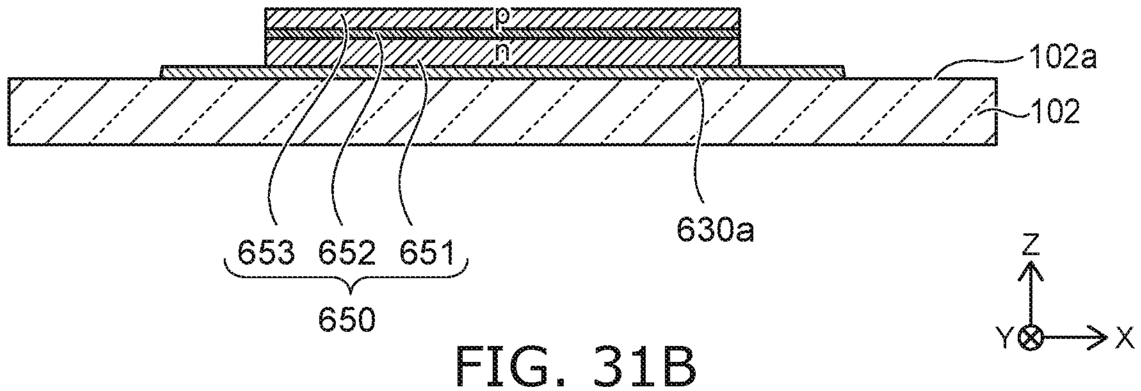
FIG. 31B is a schematic cross-sectional view illustrating the production method for the image display device of the sixth embodiment.

As shown in FIG. 31B, the crystal growth substrate 1001 shown in FIG. 31A is removed. For example, wet etching, laser lift-off, or the like is used to remove the crystal growth substrate 1001. The semiconductor layer 1150 shown in FIG. 31A is patterned into the desired shape by etching. Subsequently, the metal layer 1230 shown in FIG. 31A is shaped into the connection plate **630*a* by etching. The connection plate 630*a* is included in the conductive layer 130 shown in FIG. 30 and is connected to, for example, the ground line 4 of the circuit of FIG. 17**.

When projected onto the XY plane, the outer perimeter of the connection plate **630*a* is set to include the outer perimeter of the semiconductor layer 650 when the semiconductor layer 650 is projected onto the connection plate 630*a*. When projected onto the XY plane, it is favorable for the outer perimeter of the connection plate 630*a* to be set not to include the outer perimeter of the transistors 203-1 and 203-2 when the transistors 203-1 and 203-2 are projected onto the connection plate 630*a*. The outer perimeters of the transistors 203-1 and 203-2 when projected onto the XY plane are the outer perimeters of the TFT channels 204-1 and 204-2** when projected onto the XY plane.

Figure 32A:
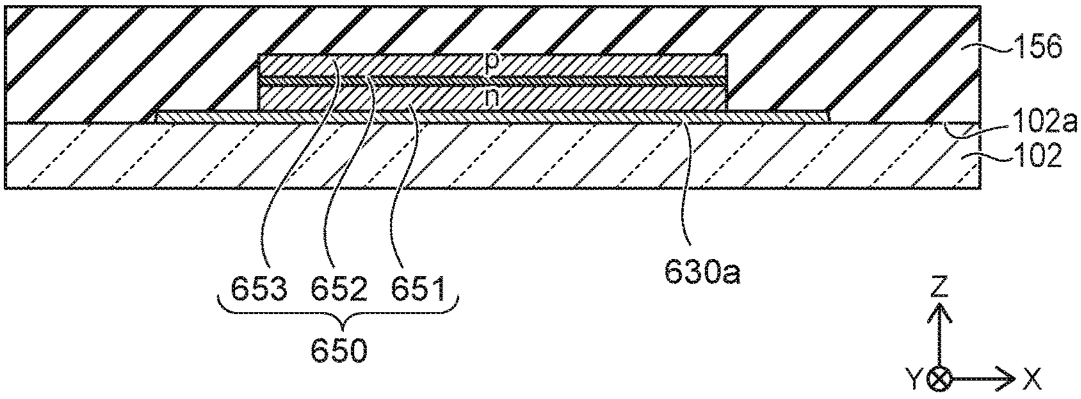
FIG. 32A is a schematic cross-sectional view illustrating the production method for the image display device of the sixth embodiment.

As shown in FIG. 32A, the first inter-layer insulating film 156 is formed to cover the first surface **102*a*, the connection plate 630*a*, and the semiconductor layer 650**.

Figure 32B:
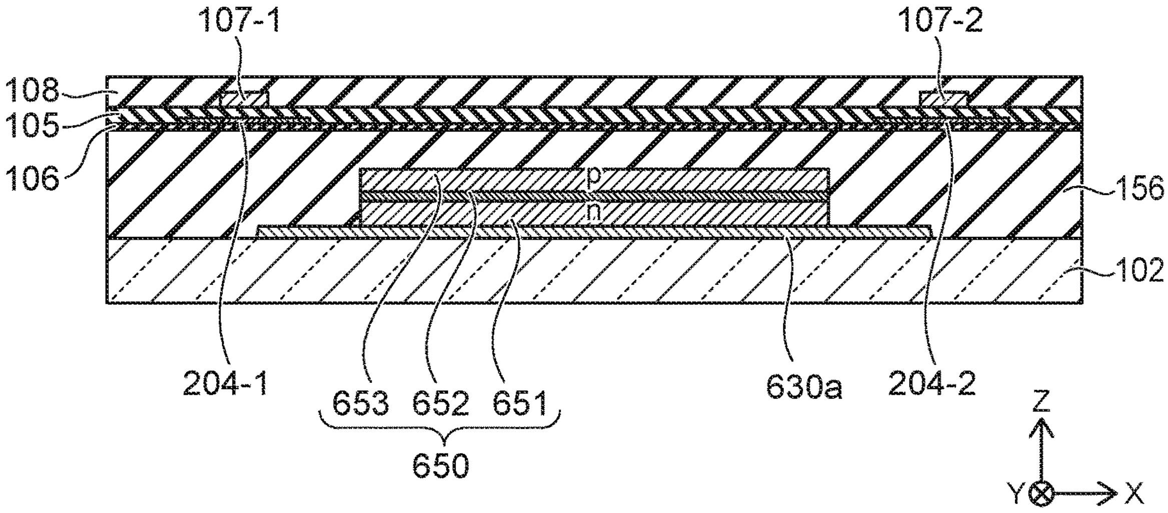
FIG. 32B is a schematic cross-sectional view illustrating the production method for the image display device of the sixth embodiment.

As shown in FIG. 32B, the TFT underlying film 106 is formed on the first inter-layer insulating film 156, and the TFT channels 204-1 and 204-2 are formed on the TFT underlying film 106. The insulating layer 105 is formed over the TFT underlying film 106 and the TFT channels 204-1 and 204-2. The gate 107-1 is formed on the TFT channel 204-1 via the insulating layer 105. The gate 107-2 is formed on the TFT channel 204-2 via the insulating layer 105. The second inter-layer insulating film 108 is formed over the insulating layer 105 and the gates 107-1 and 107-2. The formation methods, materials, and the like of the TFT channels 204-1 and 204-2, the insulating layer 105, the gates 107-1 and 107-2, etc., can be similar to those of the other embodiments described above.

Figure 33A:
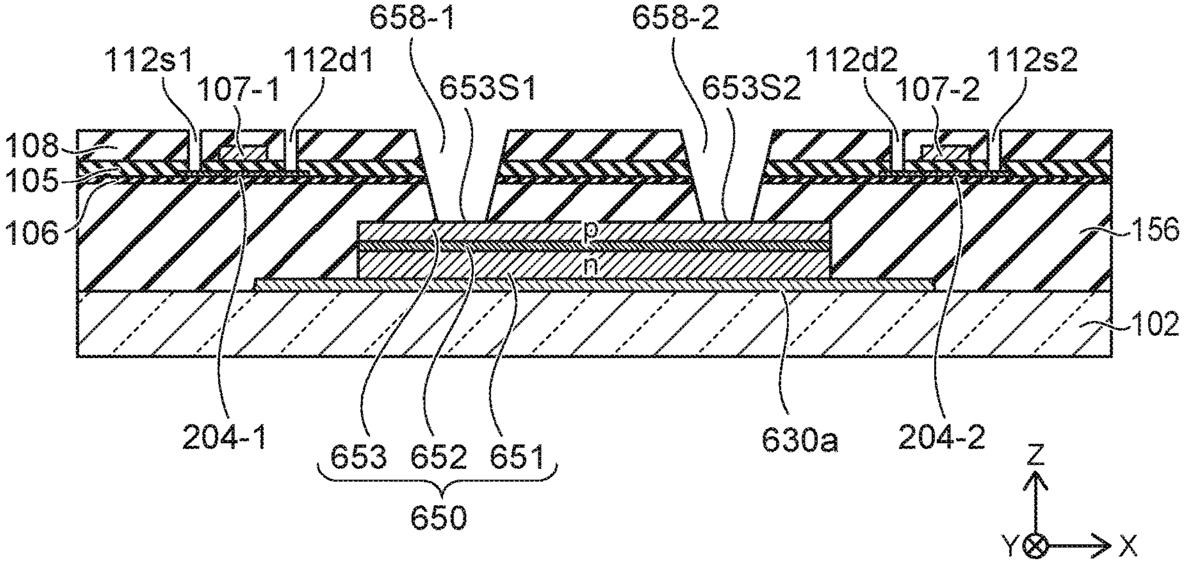
FIG. 33A is a schematic cross-sectional view illustrating the production method for the image display device of the sixth embodiment.

As shown in FIG. 33A, via holes **112*d*1 and 112*s*1 that extend through the second inter-layer insulating film 108, the insulating layer 105, and the TFT underlying film 106 and reach the TFT channel 204-1 are formed. Via holes 112*d*2 and 112*s*2 that extend through the second inter-layer insulating film 108, the insulating layer 105, and the TFT underlying film 106 and reach the TFT channel 204-2 are formed. The opening 658-1 that reaches the light-emitting surface 653S1 is formed by removing the second inter-layer insulating film 108, the insulating layer 105, the TFT underlying film 106, and the first inter-layer insulating film 156. The opening 658-2 that reaches the light-emitting surface 653S2 is formed by removing the second inter-layer insulating film 108, the insulating layer 105, the TFT underlying film 106, and the first inter-layer insulating film 156**.

Figure 33B:
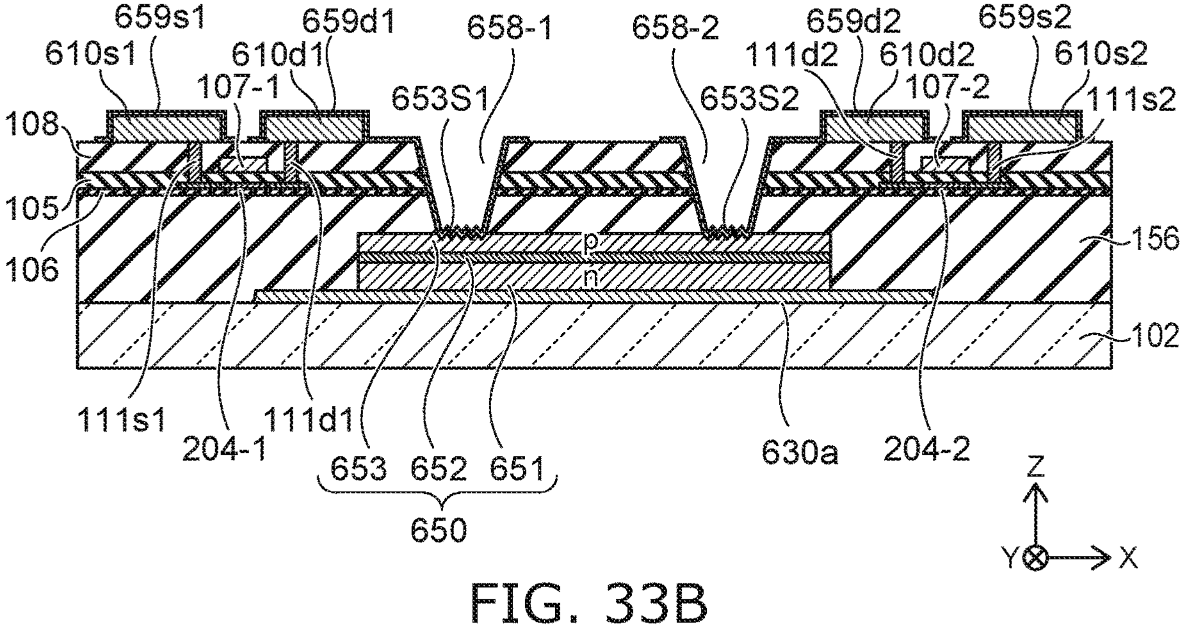
FIG. 33B is a schematic cross-sectional view illustrating the production method for the image display device of the sixth embodiment.

As shown in FIG. 33B, the vias **111*d*1, 111*s*1, 111*d*2, and 111*s*2 are formed by filling a conductive material into the via holes 112*d*1, 112*s*1, 112*d*2, and 112*s*2. The wiring layer 110 is formed, and the wiring portions 610*d*1, 610*s*1, 610*d*2, and 610*s*2** are formed.

The light-emitting surfaces 653S1 and 653S2 each are roughened. Subsequently, the light-transmitting electrodes **659*d*1, 659*s*1, 659*d*2, and 659*s*2 are formed by providing a transmissive conductive film to cover the wiring layer 110. The light-transmitting electrode 659*d*1 is formed to cover the light-emitting surface 653S1 and electrically connects the light-emitting surface 653S1 and the wiring portion 610*d*1. The light-transmitting electrode 659*d*2 is formed to cover the light-emitting surface 653S2 and electrically connects the light-emitting surface 653S2 and the wiring portion 610*d*2**.

Subsequently, the upper structures such as the color filter, etc., are formed.

Thus, the subpixel group 620 that includes the semiconductor layer 650 including the two light-emitting surfaces 653S1 and 653S2 is formed.

Although two light-emitting surfaces 653S1 and 653S2 are provided in one semiconductor layer 650 in the example, the number of light-emitting surfaces is not limited to two, three or more light-emitting surfaces can be provided in one semiconductor layer 650. As an example, one column or two columns of subpixels may be realized by a single semiconductor layer 650. As described below, the recombination current that does not contribute to the light emission per light-emitting surface can be reduced thereby, and the effect of realizing a finer light-emitting element can be increased.

(Modification)

Figure 34:
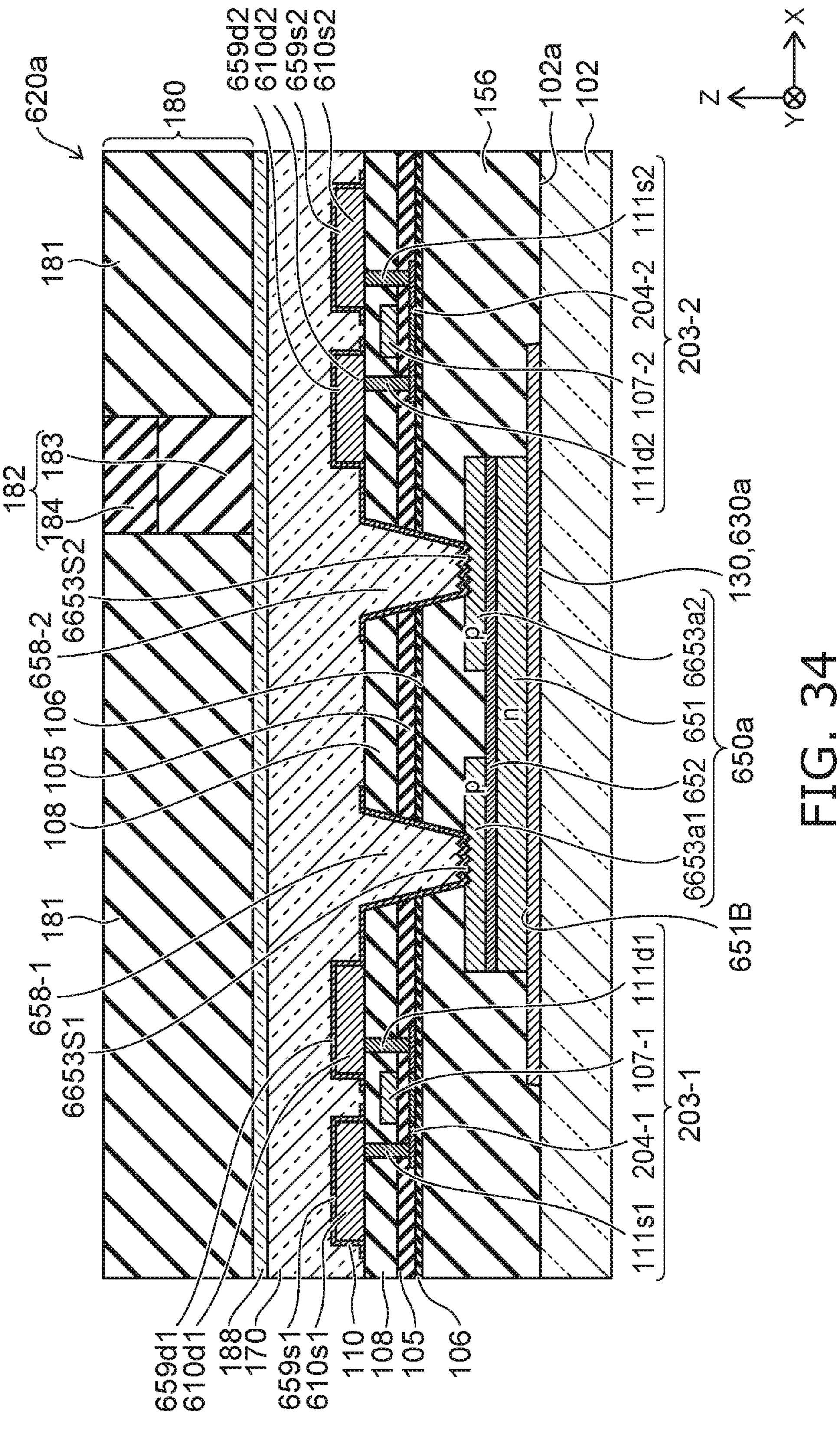
FIG. 34 is a schematic cross-sectional view illustrating a portion of an image display device according to a modification of the sixth embodiment.

FIG. 34 is a schematic cross-sectional view illustrating a portion of an image display device according to a modification of the embodiment.

The modification differs from the sixth embodiment described above in that two p-type semiconductor layers **6653*a*1 and 6653*a*2 are located on the light-emitting layer 652**. Otherwise, the modification is the same as the sixth embodiment, the same components are marked with the same reference numerals, and a detailed description is omitted as appropriate.

As shown in FIG. 34, the image display device of the modification includes a subpixel group **620*a*. The subpixel group 620*a* includes a semiconductor layer 650*a*. The semiconductor layer 650*a* includes the n-type semiconductor layer 651, the light-emitting layer 652, and the p-type semiconductor layers 6653*a*1 and 6653*a*2. The n-type semiconductor layer 651 and the light-emitting layer 652 are stacked in this order from the bottom surface 6518. The p-type semiconductor layers 6653*a*1 and 6653*a*2 each are stacked on the light-emitting layer 652**.

The p-type semiconductor layers **6653*a*1 and 6653*a*2 are formed in an island configuration on the light-emitting layer 652 and are arranged to be separated along the X-axis direction. The first inter-layer insulating film 156 is located between the n-type semiconductor layers 6653*a*1 and 6653*a*2, and the p-type semiconductor layers 6653*a*1 and 6653*a*2 are divided by the first inter-layer insulating film 156**.

The p-type semiconductor layers **6653*a*1 and 6653*a*2** have substantially the same shape when projected onto the XY plane, and the shape may be substantially a square, a rectangle, another polygon, a circle, etc.

The p-type semiconductor layer **6653*a*1 includes a light-emitting surface 6653S1. The p-type semiconductor layer 6653*a*2 includes a light-emitting surface 6653S2. The light-emitting surface 6653S1 is a surface of the p-type semiconductor layer 6653*a*1 exposed from the first inter-layer insulating film 156, the TFT underlying film 106, the insulating layer 105, and the second inter-layer insulating film 108 by the opening 658-1. The light-emitting surface 6653S2 is a surface of the p-type semiconductor layer 6653*a*2 exposed from the first inter-layer insulating film 156, the TFT underlying film 106, the insulating layer 105, and the second inter-layer insulating film 108 by the opening 658-2**.

Similarly to the shapes of the light-emitting surfaces according to the sixth embodiment, the shapes of the light-emitting surfaces 6653S1 and 6653S2 when projected onto the XY plane are substantially the same shape and are a substantially square shape, etc. The shape of the light-emitting surfaces 6653S1 and 6653S2 is not limited to a rectangle such as that of the embodiment and may be a circle, an ellipse, a polygon such as a hexagon, etc. The shape of the light-emitting surfaces 6653S1 and 6653S2 may be similar to or different from the shapes of the openings 658-1 and 658-2.

The light-transmitting electrode **659*d*1 is provided over the light-emitting surface 6653S1 and provided over the wiring portion 610*d*1. The light-transmitting electrode 659*d*1 is located between the light-emitting surface 6653S1 and the wiring portion 610*d*1 and electrically connects the light-emitting surface 6653S1 and the wiring portion 610*d*1. The light-transmitting electrode 659*d*2 is provided over the light-emitting surface 6653S2 and provided over the wiring portion 610*d*2. The light-transmitting electrode 659*d*2 is located between the light-emitting surface 6653S2 and the wiring portion 610*d*2 and electrically connects the light-emitting surface 6653S2 and the wiring portion 610*d*2**.

A production method of the modification will now be described. FIGS. 35A to 36B are schematic cross-sectional views illustrating the production method for the image display device of the modification.

According to the modification, the processes up to the process of bonding the substrates to each other can be similar to those of the sixth embodiment described above. Specifically, similar processes up to the process described with reference to FIG. 31A are applicable. The following processes are described as being applied to the process of FIG. 31A and subsequent processes.

Figure 35A:
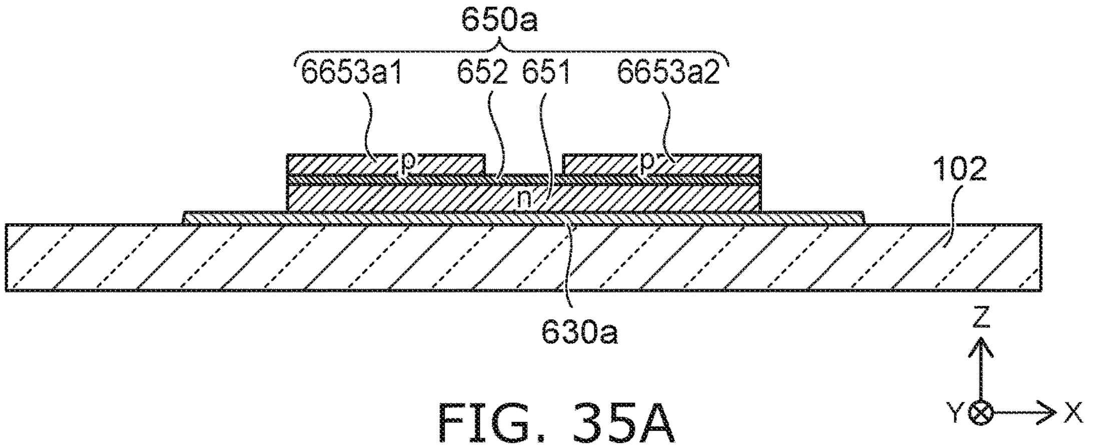
FIG. 35A is a schematic cross-sectional view illustrating a production method for the image display device of the modification of the sixth embodiment.

According to the modification as shown in FIG. 35A, the light-emitting layer 652 and the n-type semiconductor layer 651 are formed by etching the semiconductor layer 1150 shown in FIG. 31A. The two p-type semiconductor layers **6653*a*1 and 6653*a*2** are formed by further etching.

The etching may be deeper when forming the p-type semiconductor layers **6653*a*1 and 6653*a*2. For example, the etching for forming the p-type semiconductor layers 6653*a*1 and 6653*a*2 may be performed to exceed a depth that reaches the light-emitting layer 652 and the n-type semiconductor layer 651. Thus, when the p-type semiconductor layers are formed by performing deep etching, it is desirable to etch outward of the outer perimeters of the light-emitting surfaces 6653S1 and 6653S2 shown in FIG. 34 by not less than 1 μm. The recombination current can be suppressed by separating the etching position outward from the outer perimeters of the light-emitting surfaces 6653S1 and 6653S2**.

After the semiconductor layer **650*a* is formed, the connection plate 630*a* is formed by etching the metal layer 1230 shown in FIG. 31**A.

Figure 35B:
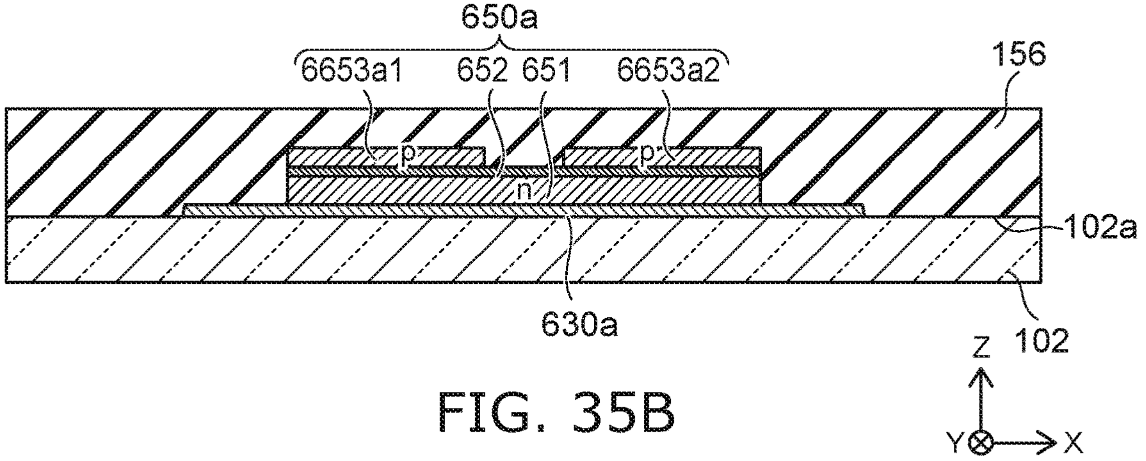
FIG. 35B is a schematic cross-sectional view illustrating the production method for the image display device of the modification of the sixth embodiment.

As shown in FIG. 35B, the first inter-layer insulating film 156 is formed to cover the first surface **102*a*, the connection plate 630*a*, and the semiconductor layer 650*a***.

Figure 35C:
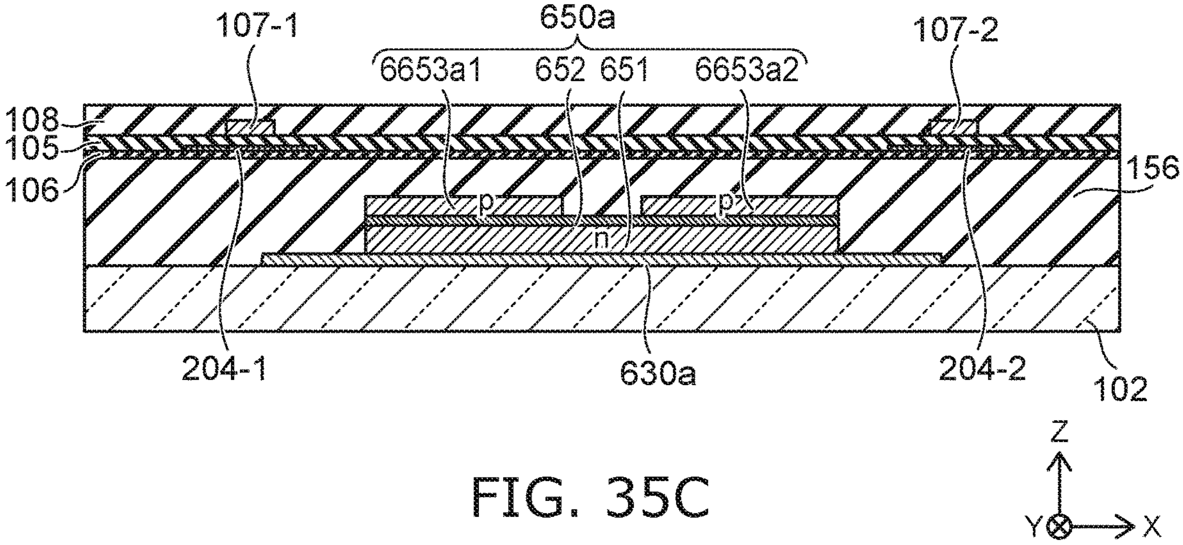
FIG. 35C is a schematic cross-sectional view illustrating the production method for the image display device of the modification of the sixth embodiment.

As shown in FIG. 35C, the TFT underlying film 106 is formed on the first inter-layer insulating film 156, and the TFT channels 204-1 and 204-2 are formed on the TFT underlying film 106. Furthermore, the insulating layer 105 is formed on the TFT channels 204-1 and 204-2, and the gates 107-1 and 107-2 are formed on the insulating layer 105. The second inter-layer insulating film 108 is formed to cover the insulating layer 105 and the gates 107-1 and 107-2.

Figure 36A:
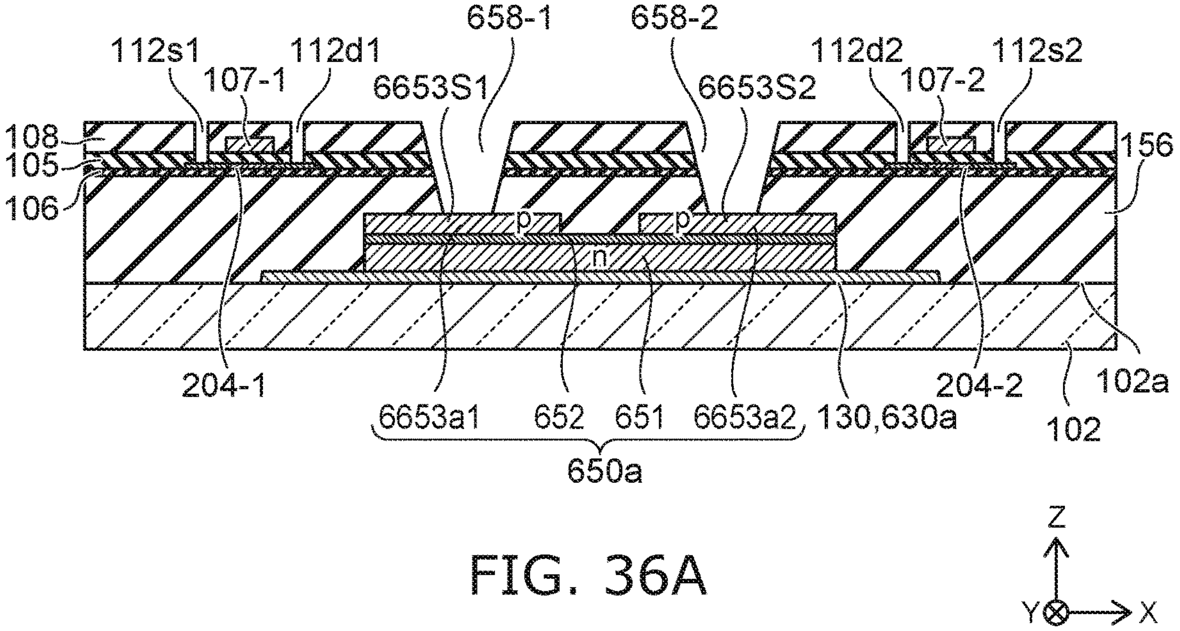
FIG. 36A is a schematic cross-sectional view illustrating the production method for the image display device of the modification of the sixth embodiment.

As shown in FIG. 36A, the via holes **112*d*1, 112*s*1, 112*d*2, and 112*s*2 are formed similarly to those of the sixth embodiment. The opening 658-1 is formed to reach the light-emitting surface 6653S1 by removing the second inter-layer insulating film 108, the insulating layer 105, the TFT underlying film 106, and the first inter-layer insulating film 156. The opening 658-2 is formed to reach the light-emitting surface 6653S2 by removing the second inter-layer insulating film 108, the insulating layer 105, the TFT underlying film 106, and the first inter-layer insulating film 156**.

Figure 36B:
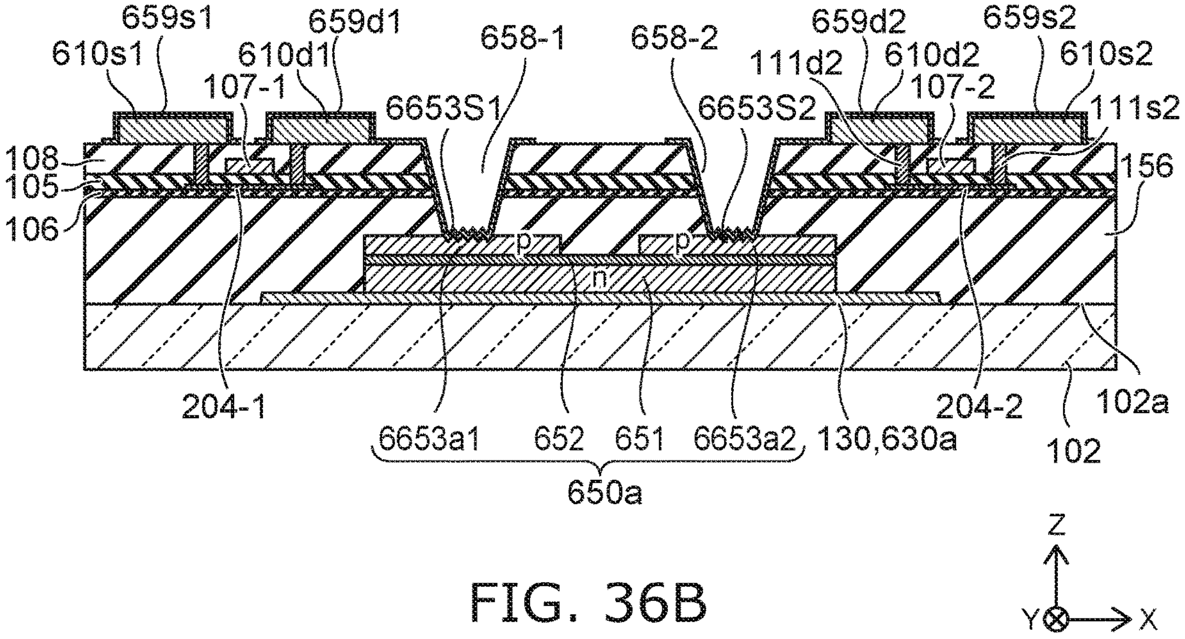
FIG. 36B is a schematic cross-sectional view illustrating the production method for the image display device of the modification of the sixth embodiment.

As shown in FIG. 36B, similarly to the sixth embodiment, the wiring layer 110 is formed, and a transmissive conductive film that covers the wiring layer 110 is formed. The transmissive conductive film is shaped into the light-transmitting electrodes **659*d*1, 659*s*1, 659*d*2, and 659*s*2**.

Similarly to the sixth embodiment, the upper structure such as the color filter, etc., is formed.

Thus, the subpixel group **620*a* that includes the two light-emitting surfaces 6653S1 and 6653S2** is formed.

According to the modification as well, similarly to the sixth embodiment, the number of light-emitting surfaces is not limited to two; three or more light-emitting surfaces may be provided in one semiconductor layer **650*a***.

Effects of the image display device of the embodiment will now be described.

Figure 37:
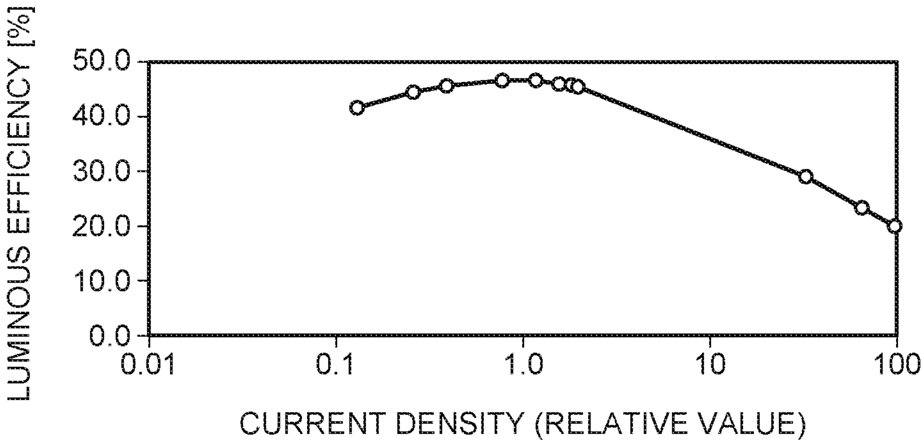
FIG. 37 is a graph illustrating a characteristic of a pixel LED element.

FIG. 37 is a graph illustrating a characteristic of a pixel LED element.

The vertical axis of FIG. 37 is the luminous efficiency (%). The horizontal axis is the current density of the current caused to flow to the pixel LED element shown as a relative value.

As shown in FIG. 37, the luminous efficiency of the pixel LED element is substantially constant or monotonously increases in the region in which the relative value of the current density is less than 1.0. The luminous efficiency monotonously decreases in the region in which the relative value of the current density is greater than 1.0. That is, an appropriate current density at which the luminous efficiency has a maximum exists in the pixel LED element.

It may be expected that a highly efficient image display device is realized by suppressing the current density so that a sufficient luminance is obtained from the light-emitting element. However, it is shown by FIG. 37 that there is a tendency for the current density to decrease and for the luminous efficiency to decrease for a low current density.

As described in the first to fifth embodiments, the light-emitting element is formed by individually dividing by etching or the like all of the layers of the semiconductor layer 1150 that includes the light-emitting layer. At this time, the junction surface between the light-emitting layer and the p-type semiconductor layer is exposed at the end portion. Similarly, the junction surface between the light-emitting layer and the n-type semiconductor layer is exposed at the end portion.

When such end portions exist, electrons and holes recombine at the end portions. On the other hand, such recombination does not contribute to the light emission. The recombination at the end portions occurs substantially regardless of the current caused to flow in the light-emitting element. It is considered that the recombination occurs according to the lengths of the junction surfaces that contribute to the light emission at the end portions.

When two light-emitting elements that have cubic shapes of the same dimensions emit light, end portions are formed at four side surfaces for each light-emitting element; therefore, the two light-emitting elements have a total of eight end portions, and recombination may occur at eight end portions.

In contrast, according to the embodiment, the semiconductor layers 650 and **650*a* include four side surfaces, and there are four end portions of the two light-emitting surfaces. However, the region between the openings 658-1 and 658-2** substantially does not contribute to the light emission because few electrons and holes are injected; therefore, the end portions that contribute to the light emission can be considered to be six. Thus, according to the embodiment, by substantially reducing the number of end portions of the semiconductor layer, the recombination that does not contribute to the light emission is reduced. By reducing the recombination that does not contribute to the light emission, the drive current per light-emitting surface is reduced.

When reducing the distance between the subpixels for higher definition or the like, when the current density is relatively high, etc., the distance between the light-emitting surface 653S1 and the light-emitting surface 653S2 becomes substantially short in the subpixel group 620 of the sixth embodiment. In such a case, when the p-type semiconductor layer is shared as in the sixth embodiment, there is a risk that a portion of the holes injected into the light-emitting surface being driven may shunt, and the light-emitting surface that is not being driven may have a micro light emission. In the subpixel group **620*a*** of the modification, the p-type semiconductor layer is divided into two, and each p-type semiconductor layer includes a light-emitting surface; therefore, the micro light emission of the light-emitting surface at the side that is not driven can be reduced.

According to the embodiment, the semiconductor layer that includes the light-emitting layer includes the n-type semiconductor layer, the light-emitting layer, and the p-type semiconductor layer stacked in this order from the connection plate **630*a* side, and is favorable from the perspective of reducing the manufacturing cost by performing crystal growth from the n-type semiconductor layer on a crystal growth substrate without using a support substrate. Similarly to the other embodiments, the p-type semiconductor layer, the light-emitting layer, and the n-type semiconductor layer may be stacked in this order from the connection plate 630*a* side as described above instead of the stacking order of the n-type semiconductor layer and the p-type semiconductor layer. Also, as in the third embodiment, when the p-type semiconductor layer 653 is the lower layer and when connecting to the connection plate 630*a*, it is favorable to provide a conductive auxiliary plate between the connection plate 630*a* and the p-type semiconductor layer 653**.

Specific examples of the subpixels and subpixel groups of the image display devices of the embodiments are described above. Each specific example is an example, and other configuration examples are possible by appropriately combining the configurations and procedures of processes of these embodiments. For example, according to the first to fifth embodiments, a connection plate may be used to connect to a power supply line or a ground line without using a via, and according to the sixth embodiment, the light-emitting element may be electrically connected using a via.

Seventh Embodiment

The image display device described above can be used as an image display module having the appropriate number of pixels in, for example, a computer display, a television, a portable terminal such as a smartphone, car navigation, etc.

Figure 38:
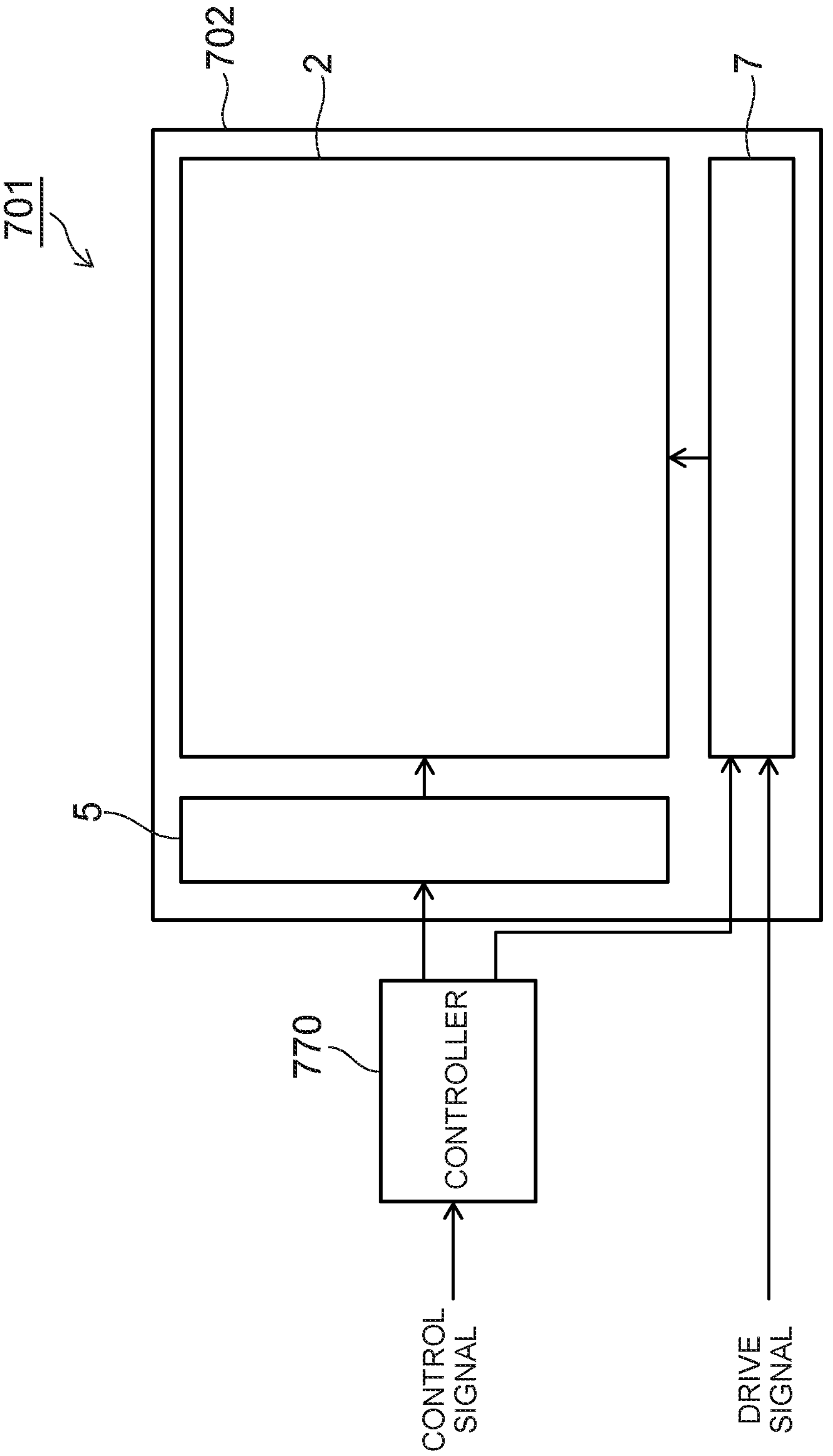
FIG. 38 is a block diagram illustrating an image display device according to a seventh embodiment.

FIG. 38 is a block diagram illustrating the image display device according to the embodiment.

FIG. 38 shows the major parts of the configuration of a computer display.

As shown in FIG. 38, the image display device 701 includes an image display module 702. The image display module 702 is, for example, an image display device that includes the configuration according to the first embodiment described above. The image display module 702 includes the display region 2 in which the multiple subpixels including the subpixels 20 are arranged, the row selection circuit 5, and the signal voltage output circuit 7.

The image display device 701 further includes a controller 770. The controller 770 receives input of control signals that are separated and generated by not-illustrated interface circuitry, and controls the driving and the drive order of the subpixels in the row selection circuit 5 and the signal voltage output circuit 7.

(Modification)

The image display device described above can be used as an image display module including the appropriate number of pixels in, for example, a computer display, a television, a portable terminal such as a smartphone, car navigation, etc.

Figure 39:
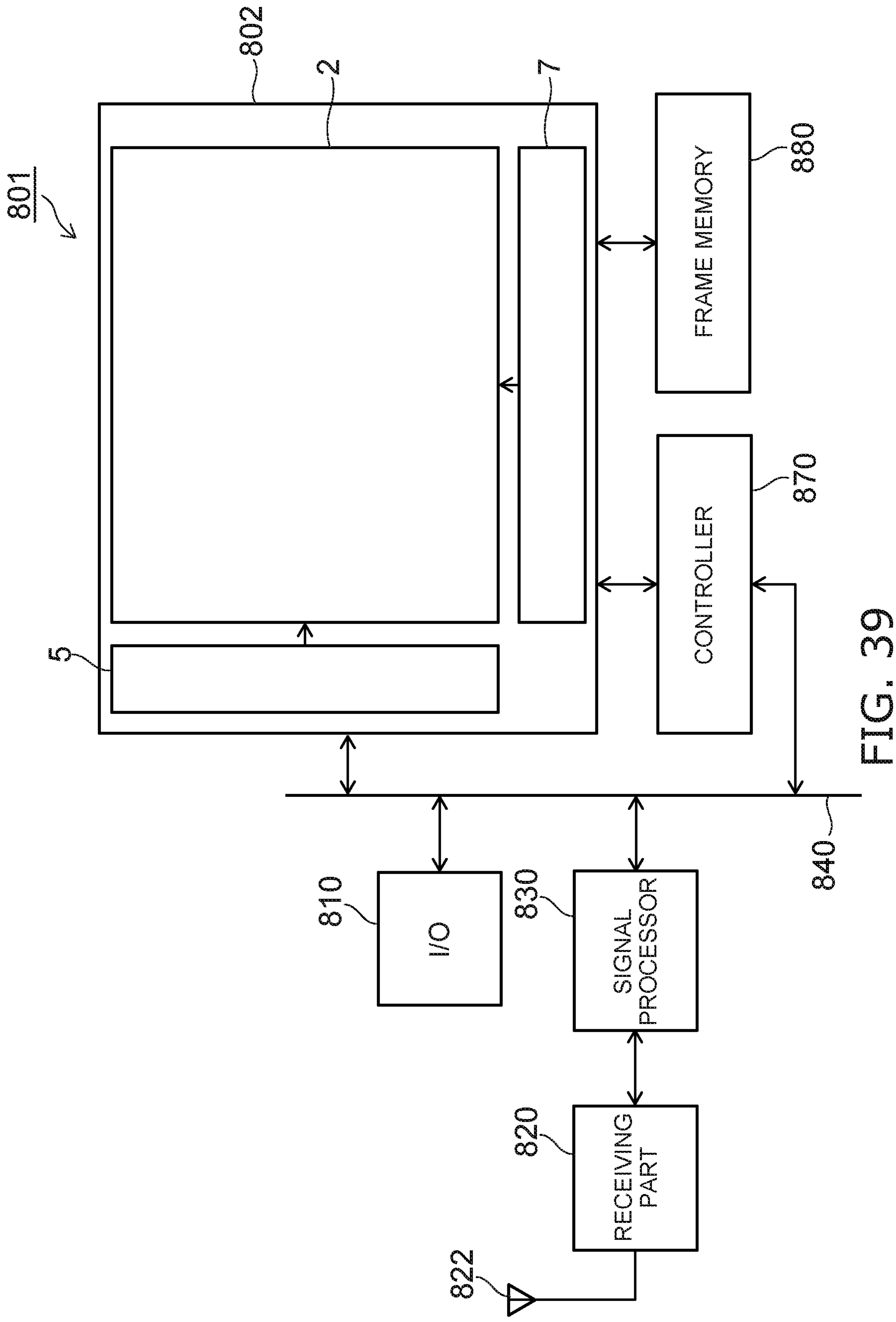
FIG. 39 is a block diagram illustrating an image display device according to a modification of the seventh embodiment.

FIG. 39 is a block diagram illustrating an image display device according to a modification of the embodiment.

FIG. 39 shows the configuration of a high-definition thin television.

As shown in FIG. 39, the image display device 801 includes an image display module 802. The image display module 802 is, for example, the image display device 1 that includes the configuration according to the first embodiment described above. The image display device 801 includes a controller 870 and a frame memory 880. Based on a control signal supplied by a bus 840, the controller 870 controls the drive order of the subpixels of the display region 2. The frame memory 880 stores one frame of display data and is used for smooth processing such as video image reproduction, etc.

The image display device 801 includes an I/O circuit 810. The I/O circuit 810 is labeled as simply "I/O" in FIG. 39. The I/O circuit 810 provides an interface circuitry for connecting with an external terminal, a device, etc. The I/O circuit 810 includes, for example, an audio interface, a USB interface that connects an external hard disk device, etc.

The image display device 801 includes a receiving part 820 and a signal processor 830. An antenna 822 is connected to the receiving part 820, and the necessary signal is separated and generated from the radio wave received by the antenna 822. The signal processor 830 includes a DSP (Digital Signal Processor), a CPU (Central Processing Unit), etc., and the signal that is separated and generated by the receiving part 820 is separated and generated into image data, voice data, etc., by the signal processor 830.

Other image display devices also can be made by using the receiving part 820 and the signal processor 830 as a high-frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module according to the embodiment is not limited to the configuration of the image display device according to the first embodiment; modifications of the first embodiment or other embodiments may be used.

According to the embodiments described above, a production method for an image display device and an image display device can be realized in which a transfer process of a light-emitting element is shortened, and the yield is increased.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are within the scope and spirit of the inventions, and are within the scope of the inventions described in the claims and their equivalents. Also, the embodiments described above can be implemented in combination with each other.

What is claimed is:

1. A production method for an image display device, the method comprising:

preparing at least one structure comprising a semiconductor layer formed on a first substrate, the semiconductor layer comprising a light-emitting layer;

forming a metal layer on a second substrate;

bonding the semiconductor layer to the metal layer;

removing the first substrate;

forming a light-emitting element by etching the semiconductor layer, the light-emitting element including a bottom surface on the first metal layer, and a light-emitting surface located opposite to the bottom surface;

after forming the light-emitting element, forming a conductive part by patterning the metal layer, the conductive part being light-reflective, wherein the light-emitting element is located on the conductive part, and wherein an outer perimeter of the conductive part includes an outer perimeter of the light-emitting element when the light-emitting element is projected in a plan view;

forming a first insulating film that covers the second substrate and the light-emitting element;

forming a transistor on the first insulating film;

forming a second insulating film that covers the transistor and the first insulating film;

exposing a surface that includes the light-emitting surface by removing a portion of the first insulating film and a portion of the second insulating film;

forming a via that extends through the first and second insulating films; and forming a wiring layer on the second insulating film, wherein the wiring layer is electrically connected to the conductive part by the via, and wherein the transistor is electrically connected to the light-emitting element at least by the wiring layer.

2. The production method for the image display device according to claim 1, further comprising:

forming a light-transmitting electrode on the exposed light-emitting surface.

3. A production method for an image display device, the method comprising:

preparing a structure comprising a semiconductor layer formed on a first substrate, the semiconductor layer comprising a p-type semiconductor layer, a light-emitting layer, and an n-type semiconductor layer;

forming a layer that has hole injectability on the semiconductor layer;

after forming the layer that has hole injectability, forming a metal layer on the structure;

bonding the semiconductor layer to a second substrate via the metal layer, wherein the p-type semiconductor layer, the light-emitting layer, and the n-type semiconductor layer are located in this order from a second substrate side;

removing the first substrate;

forming a light-emitting element by etching the semiconductor layer, the light-emitting element including a bottom surface on the metal layer, and a light-emitting surface located opposite to the bottom surface;

after the forming of the light-emitting element, forming a conductive part by patterning the metal layer, the conductive part being light-reflective, wherein the light-emitting element is located on the conductive part, and wherein an outer perimeter of the conductive part includes an outer perimeter of the light-emitting element when the light-emitting element is projected in a plan view;

forming a first insulating film that covers the second substrate and the light-emitting element;

forming a transistor on the first insulating film;

forming a second insulating film that covers the transistor and the first insulating film;

exposing a surface that includes the light-emitting surface by removing a portion of the first insulating film and a portion of the second insulating film;

forming a via that extends through the first and second insulating films;

forming a wiring layer on the second insulating film, wherein the wiring layer is electrically connected to the conductive part by the via, and wherein the transistor is electrically connected to the light-emitting element at least by the wiring layer; and forming a light-transmitting electrode on the exposed light-emitting surface.

4. The production method for the image display device according to claim 3, wherein:

in the step of preparing the structure, a plurality of structures are prepared, each comprising a semiconductor layer formed on a first substrate, each semiconductor layer comprising a light-emitting layer;

in the step of forming the metal layer, a metal layer is formed on each respective structure; and in the step of bonding the semiconductor layer to the second substrate, the semiconductor layer of each of the plurality of structures is bonded to the second substrate.

5. The production method for the image display device according to claim 3, wherein:

the second substrate comprises a light-transmitting substrate.

6. The production method for the image display device according to claim 5, wherein:

the second substrate further comprises a third substrate located on the light-transmitting substrate, the third substrate is flexible, in the step of bonding the semiconductor layer to the second substrate, the semiconductor layer is bonded to the third substrate, and the method further comprises, after the step of bonding the semiconductor layer to the third substrate, removing the light-transmitting substrate.

7. The production method for the image display device according to claim 3, wherein:

the semiconductor layer comprises a gallium nitride compound semiconductor.

8. The production method for the image display device according to claim 3, further comprising:

forming a wavelength conversion member on the light-emitting element.

* * * * *